(12) United States Patent
Kim et al.

(10) Patent No.: US 10,379,662 B2
(45) Date of Patent: Aug. 13, 2019

(54) TOUCH SCREEN PANEL, ELECTRONIC NOTEBOOK, AND MOBILE TERMINAL

(71) Applicant: SAMSUNG ELECTRONICS CO., LTD., Suwon-si, Gyeonggi-do (KR)

(72) Inventors: Joo Ho Kim, Suwon-si (KR); Hee Yuel Roh, Suwon-si (KR); Tatsuhiro Otsuka, Suwon-si (KR); Seok Min Oh, Seongnam-si (KR); Kang Min Lee, Hwaseong-si (KR); Jun Sung Chung, Seongnam-si (KR); Ji Su Jung, Yongin-si (KR); Hyun Geun Jo, Seoul (KR); Chul Ho Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/509,064

(22) PCT Filed: Aug. 28, 2015

(86) PCT No.: PCT/KR2015/009082
§ 371 (c)(1),
(2) Date: Mar. 6, 2017

(87) PCT Pub. No.: WO2016/036071
PCT Pub. Date: Mar. 10, 2016

(65) Prior Publication Data
US 2017/0285849 A1    Oct. 5, 2017

(30) Foreign Application Priority Data

Sep. 5, 2014  (KR) .................. 10-2014-0118983

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ........... G02F 1/13338; G02F 1/134309; G02F 1/13473; G02F 1/13718;
(Continued)

(56) References Cited

U.S. PATENT DOCUMENTS 5,109,354 A * 4/1992 Yamashita .......... G06F 15/0283
                                                361/679.26
5,534,888 A * 7/1996 Lebby ................... G06F 1/1616
                                                345/672
(Continued)

FOREIGN PATENT DOCUMENTS

KR   10-2012-0003423     1/2012
WO   WO 2012/128578 A2   9/2012
(Continued)

OTHER PUBLICATIONS

International Search Report dated Dec. 14, 2015 in corresponding International Patent Application No. PCT/KR2015/009082.
(Continued)

*Primary Examiner* — Michael J Eurice
(74) *Attorney, Agent, or Firm* — Staas & Halsey LLP

(57) ABSTRACT

A touch screen panel may include a liquid crystal, a first transparent electrode and a second transparent electrode provided at both sides of the liquid crystal, and a controller configured to transfer image data to the first transparent electrode and the second transparent electrode in a first mode and sense a touch of a user on at least one of the first transparent electrode and the second transparent electrode in a second mode.

26 Claims, 32 Drawing Sheets

(51) Int. Cl.

| | |
|---|---|
| *G06F 3/0488* | (2013.01) |
| *G02F 1/1347* | (2006.01) |
| *G02F 1/137* | (2006.01) |
| *G02F 1/1343* | (2006.01) |
| *G02F 1/1333* | (2006.01) |
| *G06F 1/16* | (2006.01) |
| *G09G 3/3208* | (2016.01) |
| *H01L 27/32* | (2006.01) |
| *H01L 51/52* | (2006.01) |
| *H04M 1/02* | (2006.01) |

(52) U.S. Cl.
CPC ........ G06F 3/0488 (2013.01); *G02F 1/13338* (2013.01); *G02F 1/13473* (2013.01); *G02F 1/13718* (2013.01); *G02F 1/134309* (2013.01); *G02F 2001/13478* (2013.01); *G02F 2001/134318* (2013.01); *G02F 2201/343* (2013.01); *G02F 2202/28* (2013.01); *G06F 1/1675* (2013.01); *G06F 1/1692* (2013.01); *G09G 3/3208* (2013.01); *G09G 2300/023* (2013.01); *G09G 2360/144* (2013.01); *H01L 27/323* (2013.01); *H01L 51/5234* (2013.01); *H01L 2251/5323* (2013.01); *H04M 1/0235* (2013.01); *H04M 1/0266* (2013.01); *H04M 2250/16* (2013.01); *H04M 2250/22* (2013.01)

(58) Field of Classification Search
CPC .......... G02F 2001/134318; G02F 2001/13478; G02F 2201/343; G02F 2202/28; G06F 1/1675; G06F 1/1692; G06F 3/0412; G06F 3/0416; G06F 3/044; G06F 3/0488; G09G 3/3208; G09G 2300/023; G09G 2360/144; H01L 27/323; H01L 51/5234; H01L 2251/5323; H04M 1/0235; H04M 1/0266; H04M 2250/16; H04M 2250/22
See application file for complete search history.

(56) References Cited

U.S. PATENT DOCUMENTS

| | | | | |
|---|---|---|---|---|
| 5,565,658 A * | 10/1996 | Gerpheide | ............. | G06F 3/041 178/18.02 |
| 6,229,502 B1 * | 5/2001 | Schwab | ............. | G06F 15/0283 345/1.1 |
| 6,317,108 B1 * | 11/2001 | Kalt | ............. | G02B 26/02 340/905 |
| 6,876,355 B1 * | 4/2005 | Ahn | ............. | G02F 1/13394 345/173 |
| 7,268,770 B1 * | 9/2007 | Takahata | ............. | G02F 1/13338 345/173 |
| 8,508,679 B2 | 8/2013 | Ishikawa et al. | | |
| 2001/0026330 A1 * | 10/2001 | Oh | ............. | G02F 1/13338 349/12 |
| 2002/0015019 A1 * | 2/2002 | Kinjo | ............. | G06F 3/1423 345/156 |
| 2002/0024511 A1 * | 2/2002 | Ozawa | ............. | G09G 3/2011 345/204 |
| 2002/0105600 A1 * | 8/2002 | Shimoda | ............. | G02F 1/167 348/739 |
| 2003/0052867 A1 * | 3/2003 | Shigetaka | ............. | G06F 3/044 345/173 |
| 2004/0075779 A1 * | 4/2004 | Paukshto | ............. | G02F 1/13338 349/12 |
| 2004/0141096 A1 * | 7/2004 | Mai | ............. | G02F 1/13338 349/12 |
| 2004/0205646 A1 * | 10/2004 | Sachs | ............. | G09B 5/02 715/255 |
| 2006/0274036 A1 * | 12/2006 | Hioki | ............. | G06F 3/0412 345/156 |
| 2007/0058107 A1 * | 3/2007 | Im | ............. | G02F 1/133617 349/71 |
| 2007/0247422 A1 * | 10/2007 | Vertegaal | ............. | G06F 3/017 345/156 |
| 2008/0062140 A1 * | 3/2008 | Hotelling | ............. | G09G 3/3648 345/173 |
| 2008/0266278 A1 | 10/2008 | Lee et al. | | |
| 2008/0303782 A1 * | 12/2008 | Grant | ............. | G06F 1/1615 345/156 |
| 2008/0309635 A1 * | 12/2008 | Matsuo | ............. | G06F 3/044 345/173 |
| 2010/0020265 A1 * | 1/2010 | Senoue | ............. | G02F 1/13362 349/62 |
| 2010/0033443 A1 * | 2/2010 | Hashimoto | ............. | G06F 3/0418 345/173 |
| 2010/0045705 A1 * | 2/2010 | Vertegaal | ............. | A47G 19/2227 345/661 |
| 2010/0117975 A1 * | 5/2010 | Cho | ............. | G06F 1/1626 345/173 |
| 2010/0182252 A1 * | 7/2010 | Jeong | ............. | G02F 1/13338 345/173 |
| 2010/0265214 A1 * | 10/2010 | Green | ............. | G06F 3/038 345/174 |
| 2010/0302194 A1 * | 12/2010 | Park | ............. | G06F 1/1675 345/173 |
| 2011/0124376 A1 * | 5/2011 | Kim | ............. | G06F 1/1626 455/566 |
| 2011/0216039 A1 * | 9/2011 | Chen | ............. | G06F 3/0412 345/174 |
| 2011/0234513 A1 * | 9/2011 | Pan | ............. | G02F 1/167 345/173 |
| 2011/0248949 A1 * | 10/2011 | Chang | ............. | G06F 3/0412 345/174 |
| 2011/0304571 A1 * | 12/2011 | Kim | ............. | G02F 1/13338 345/173 |
| 2011/0310459 A1 * | 12/2011 | Gates | ............. | G06F 3/0412 359/296 |
| 2012/0054822 A1 * | 3/2012 | Dvorak | ............. | G06F 1/1647 726/1 |
| 2012/0105370 A1 * | 5/2012 | Moore | ............. | G06F 3/0412 345/174 |
| 2012/0139874 A1 * | 6/2012 | Ozeki | ............. | G06F 3/0412 345/174 |
| 2012/0327005 A1 * | 12/2012 | Hamada | ............. | H04N 13/315 345/173 |
| 2013/0050130 A1 * | 2/2013 | Brown | ............. | G06F 3/044 345/174 |
| 2013/0127752 A1 * | 5/2013 | Takeuchi | ............. | G02F 1/13338 345/173 |
| 2013/0154949 A1 * | 6/2013 | Jamshidi Roudbari | | G02F 1/1339 345/173 |
| 2013/0222317 A1 * | 8/2013 | Abiru | ............. | G02F 1/13338 345/173 |
| 2013/0327560 A1 * | 12/2013 | Ichiki | ............. | G06F 3/044 174/133 R |
| 2014/0002413 A1 * | 1/2014 | Kim | ............. | G06F 3/0416 345/173 |
| 2014/0028616 A1 * | 1/2014 | Furutani | ............. | G06F 3/044 345/174 |
| 2014/0048854 A1 * | 2/2014 | Wang | ............. | G06F 3/0412 257/254 |
| 2014/0063374 A1 * | 3/2014 | Kuriki | ............. | G06F 3/044 349/12 |
| 2014/0078421 A1 * | 3/2014 | Zhou | ............. | G06F 3/0412 349/12 |
| 2014/0125626 A1 * | 5/2014 | Yang | ............. | G02F 1/134336 345/174 |
| 2014/0132560 A1 * | 5/2014 | Huang | ............. | G06F 3/044 345/174 |
| 2014/0354590 A1 * | 12/2014 | Wang | ............. | G06F 3/044 345/174 |
| 2014/0368467 A1 * | 12/2014 | Park | ............. | G06F 3/044 345/174 |
| 2015/0068674 A1 * | 3/2015 | Tsuchida | ............. | G02F 1/1333 156/275.5 |

(56) References Cited

U.S. PATENT DOCUMENTS

| | | | | |
|---|---|---|---|---|
| 2015/0130747 A1* | 5/2015 | Tsai | ............ | G06F 3/0412 345/174 |
| 2015/0220174 A1* | 8/2015 | Mu | ............ | G06F 3/044 345/174 |
| 2015/0277657 A1* | 10/2015 | Azumi | ............ | G06F 3/0416 345/174 |
| 2016/0011705 A1* | 1/2016 | Huang | ............ | G06F 3/044 345/174 |
| 2016/0077624 A1* | 3/2016 | Zhao | ............ | H04L 45/245 345/174 |
| 2016/0147350 A1* | 5/2016 | Kida | ............ | G06F 3/044 345/174 |
| 2016/0154515 A1* | 6/2016 | Mu | ............ | G06F 3/0412 345/174 |
| 2016/0155761 A1* | 6/2016 | Yamazaki | ............ | H01L 27/1225 345/204 |
| 2016/0179252 A1* | 6/2016 | Chang | ............ | G06F 3/0412 345/174 |
| 2016/0216811 A1* | 7/2016 | Yang | ............ | G06F 3/0412 |
| 2016/0224147 A1* | 8/2016 | Ding | ............ | G06F 3/0412 |
| 2016/0364082 A1* | 12/2016 | Kimura | ............ | G06F 3/044 |

FOREIGN PATENT DOCUMENTS

| | | |
|---|---|---|
| WO | WO 2012/148135 A2 | 11/2012 |
| WO | WO 2014/003518 A1 | 1/2014 |

OTHER PUBLICATIONS

Written Opinion PCT/ISA/237 dated Dec. 14, 2015 in corresponding International Patent Application No. PCT/KR2015/009082.

Extended European search Report dated Apr. 3, 2017, in corresponding European Patent Application No. 15837266.4.

* cited by examiner

[Fig. 1]
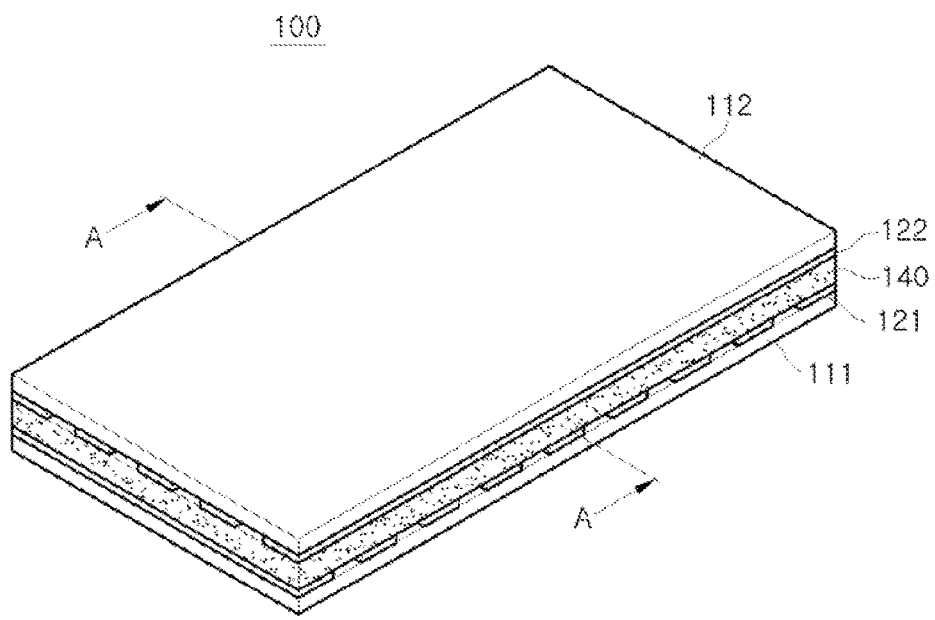

[Fig. 2]
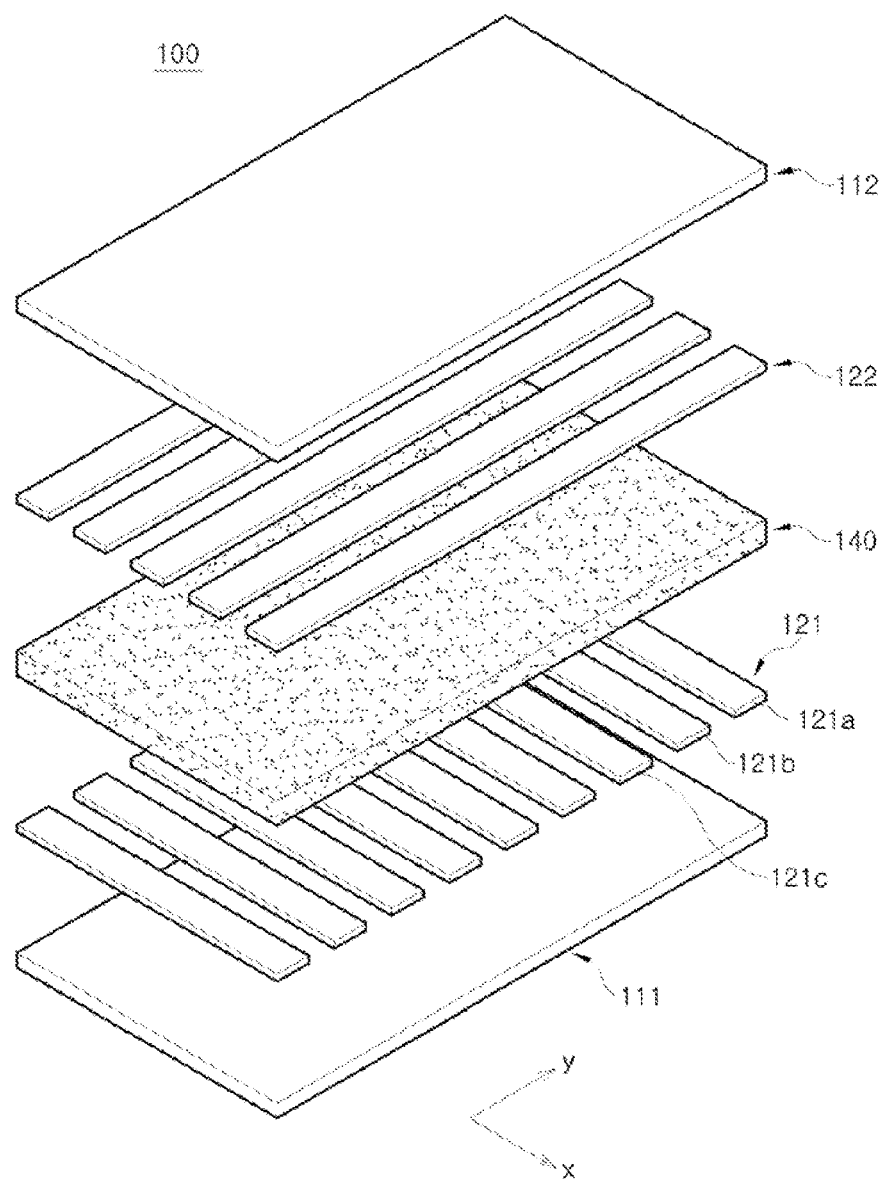
[Fig. 3]
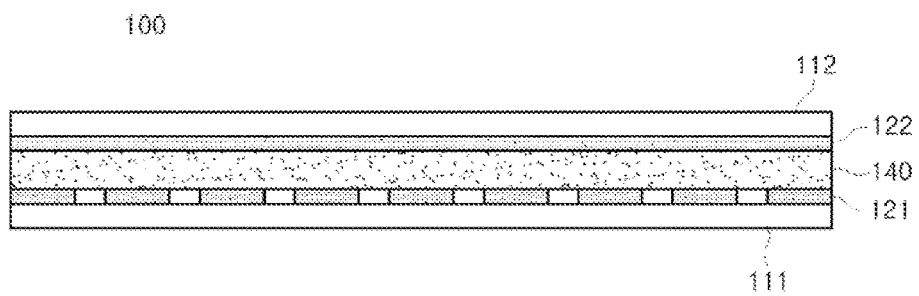

[Fig. 4]
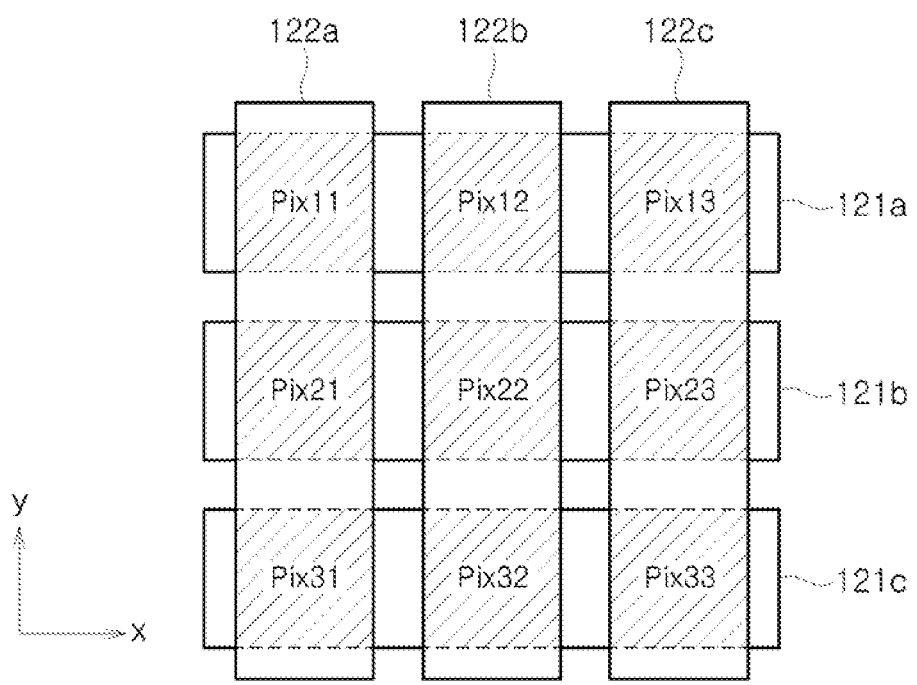

[Fig. 7]
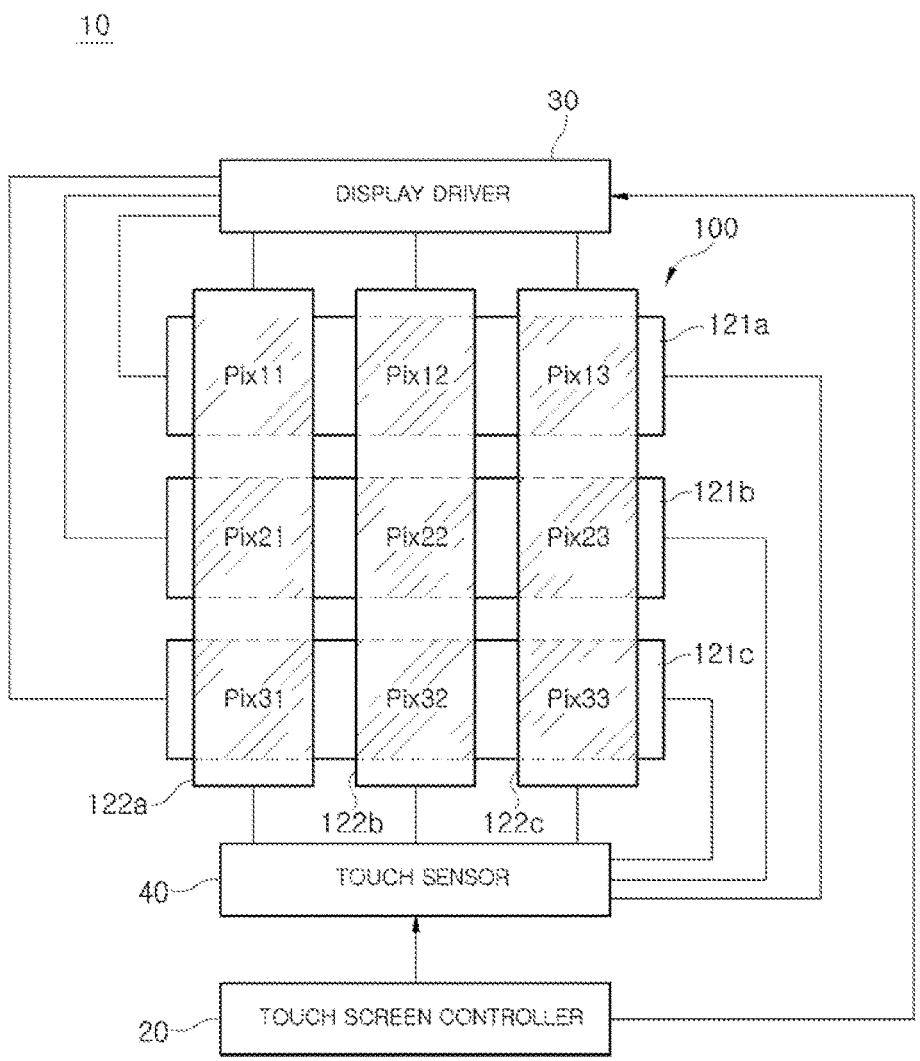

[Fig. 8]
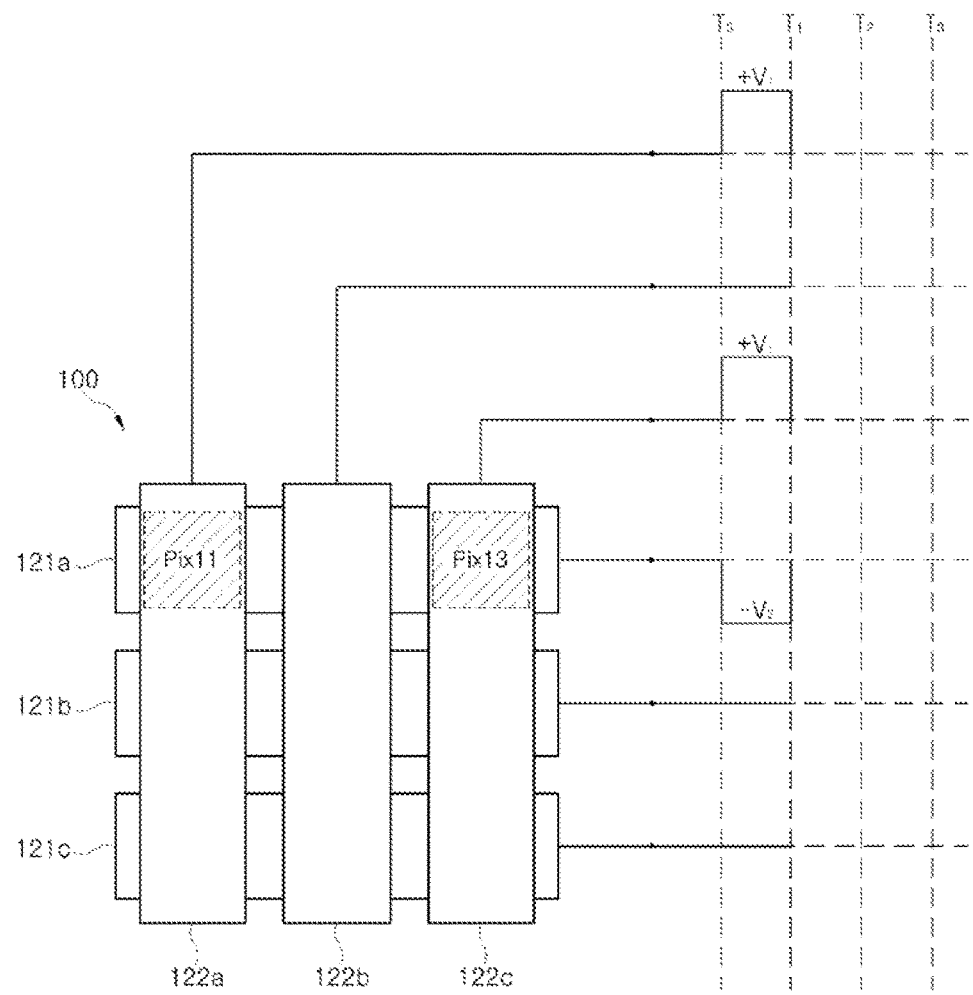

[Fig. 9]
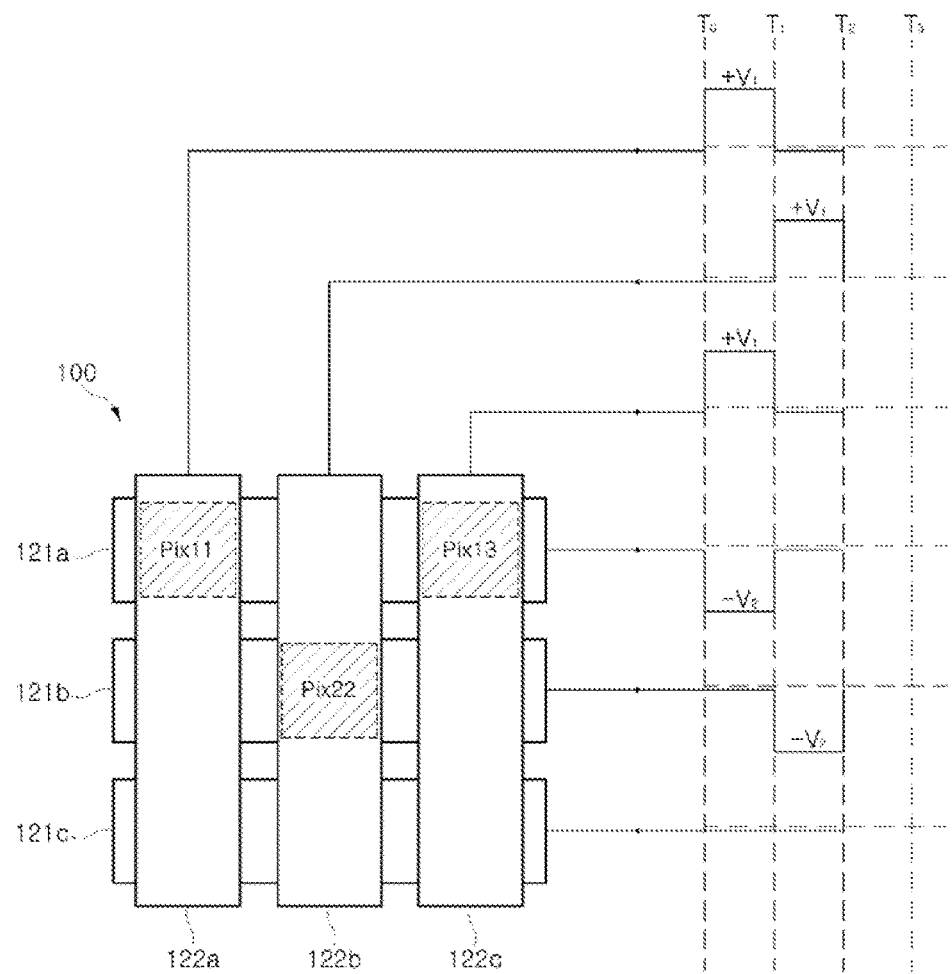

[Fig. 10]
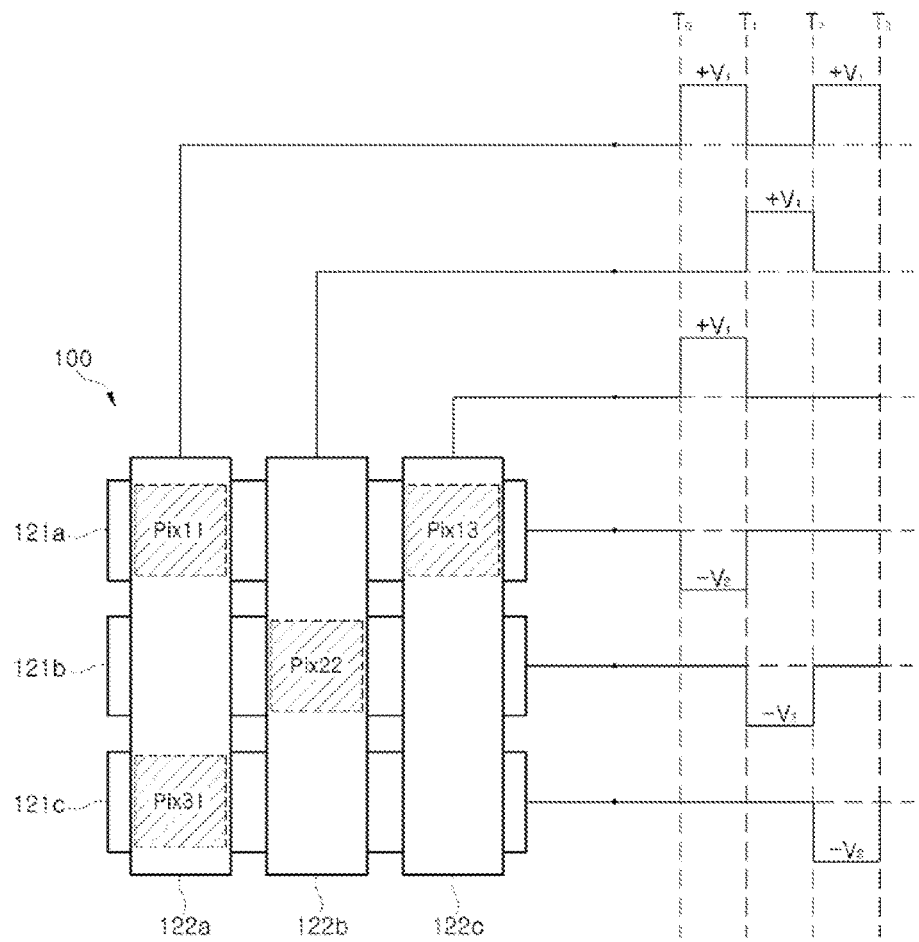
[Fig. 11]
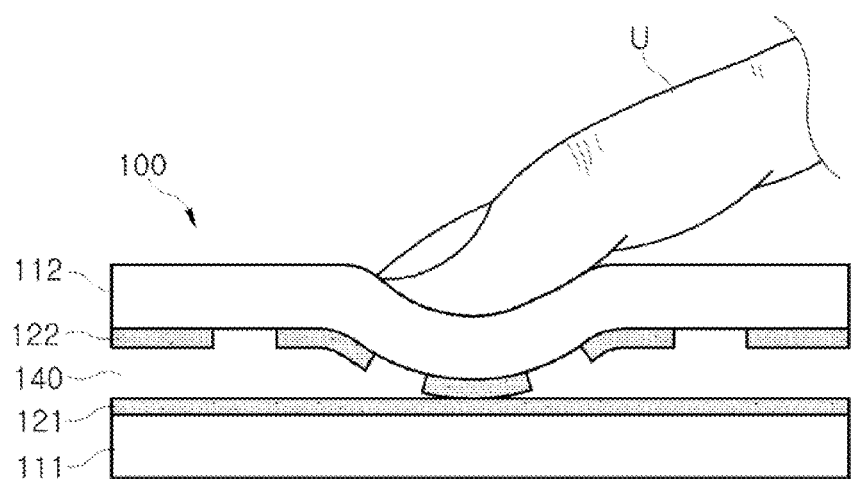

[Fig. 12]
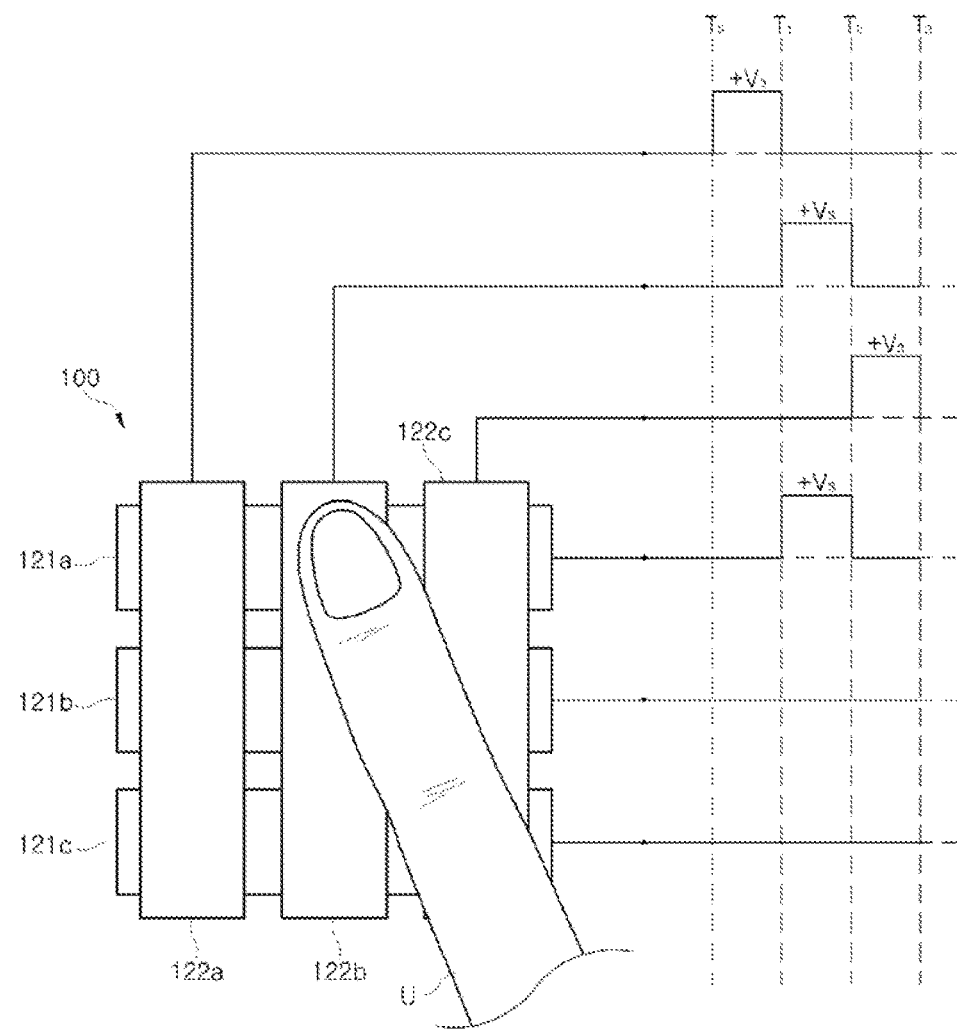

[Fig. 13]
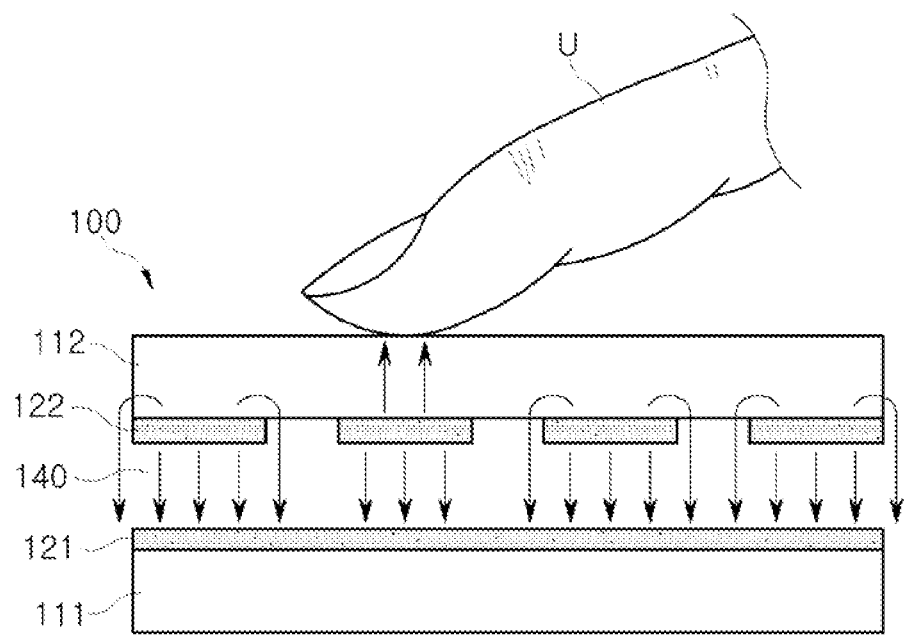

[Fig. 14]
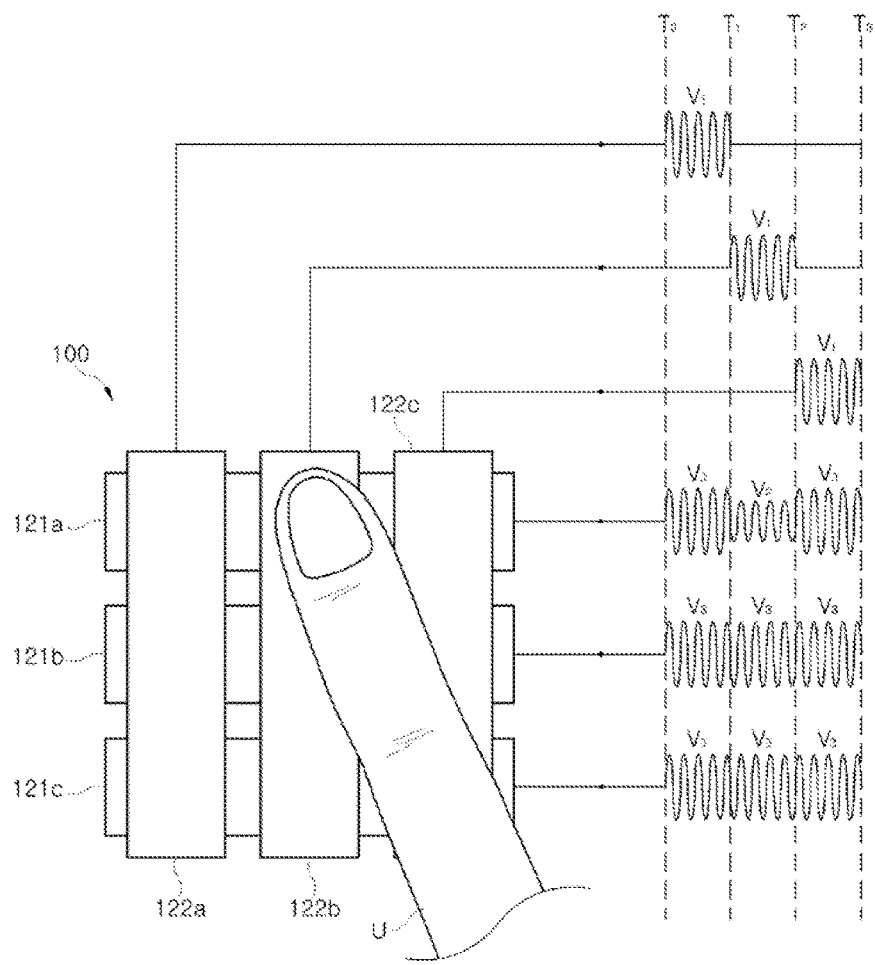

[Fig. 15]
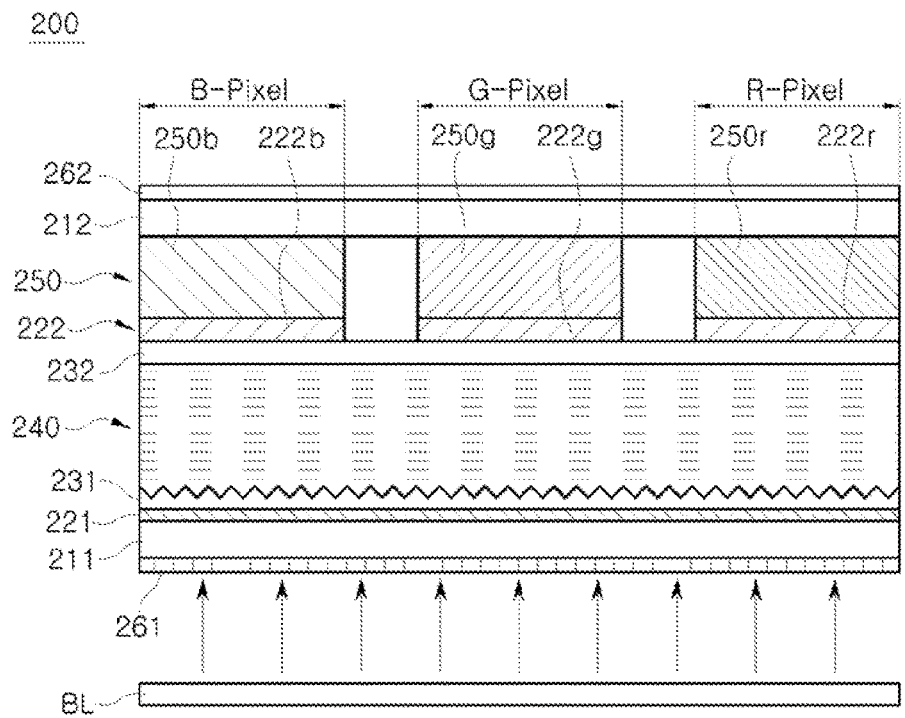
[Fig. 16]
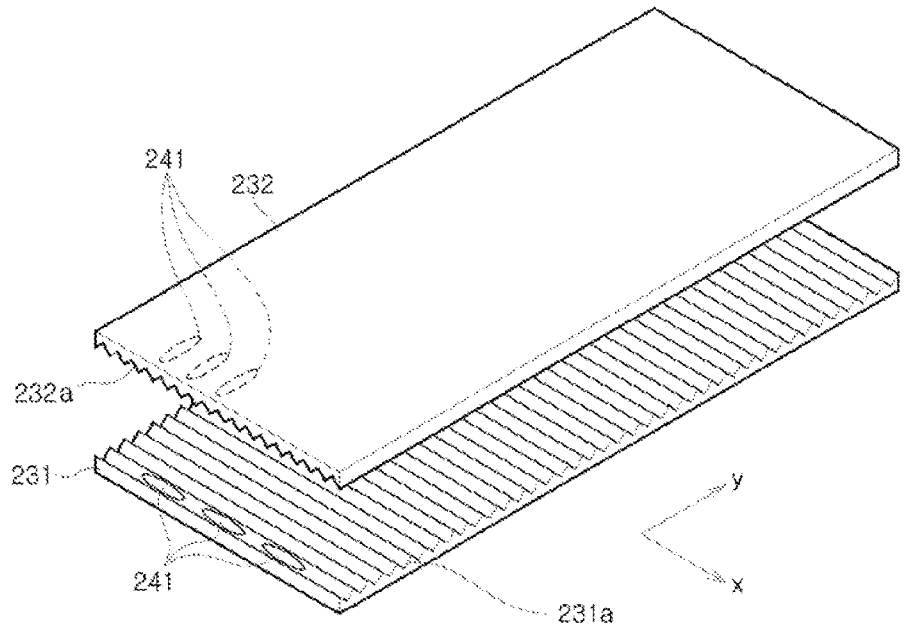

FIG. 17A
FIG. 17B
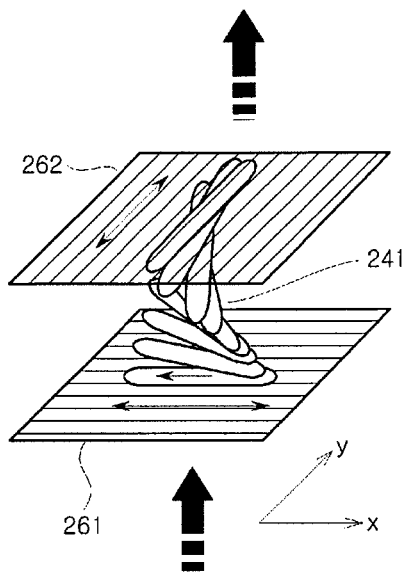
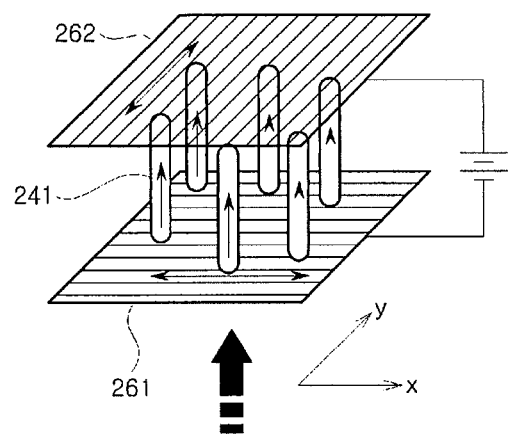

[Fig. 18]
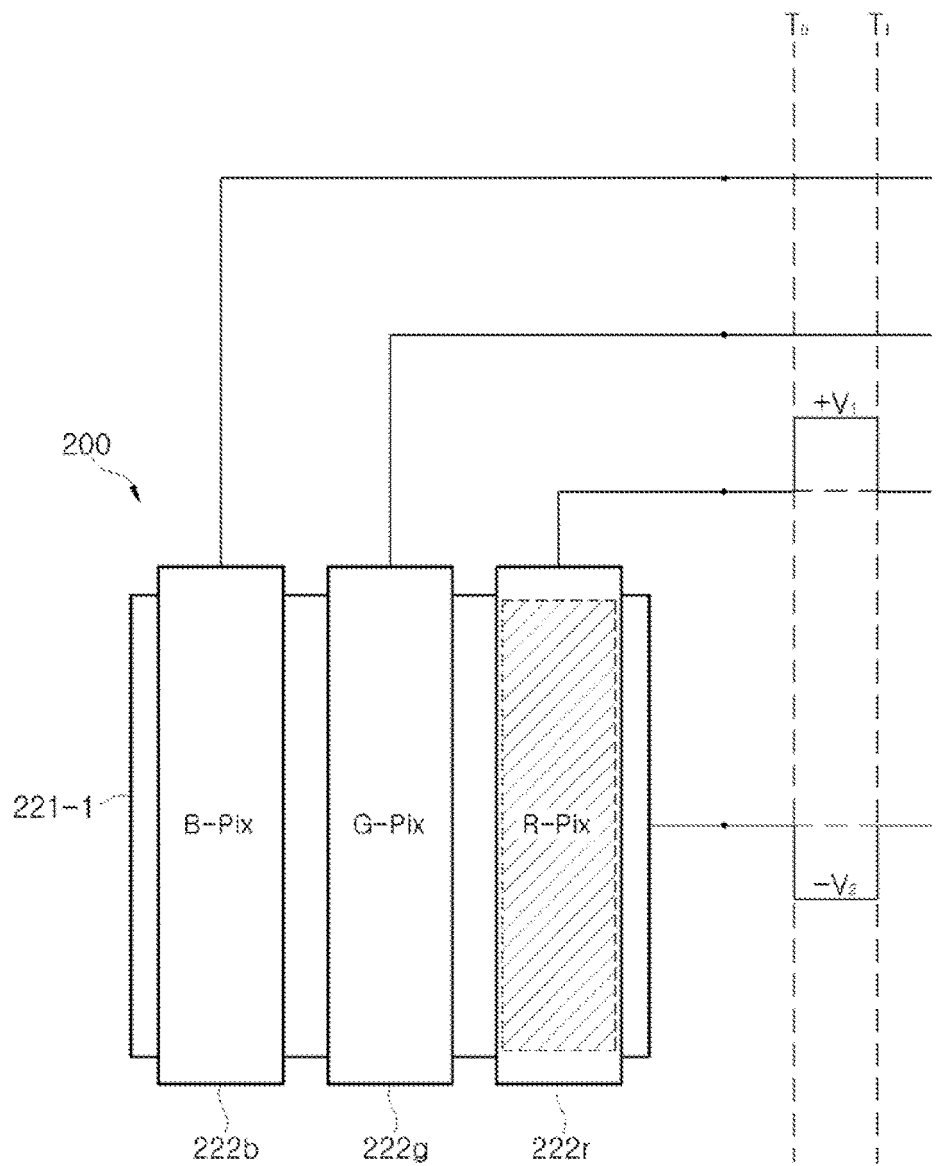

[Fig. 19]
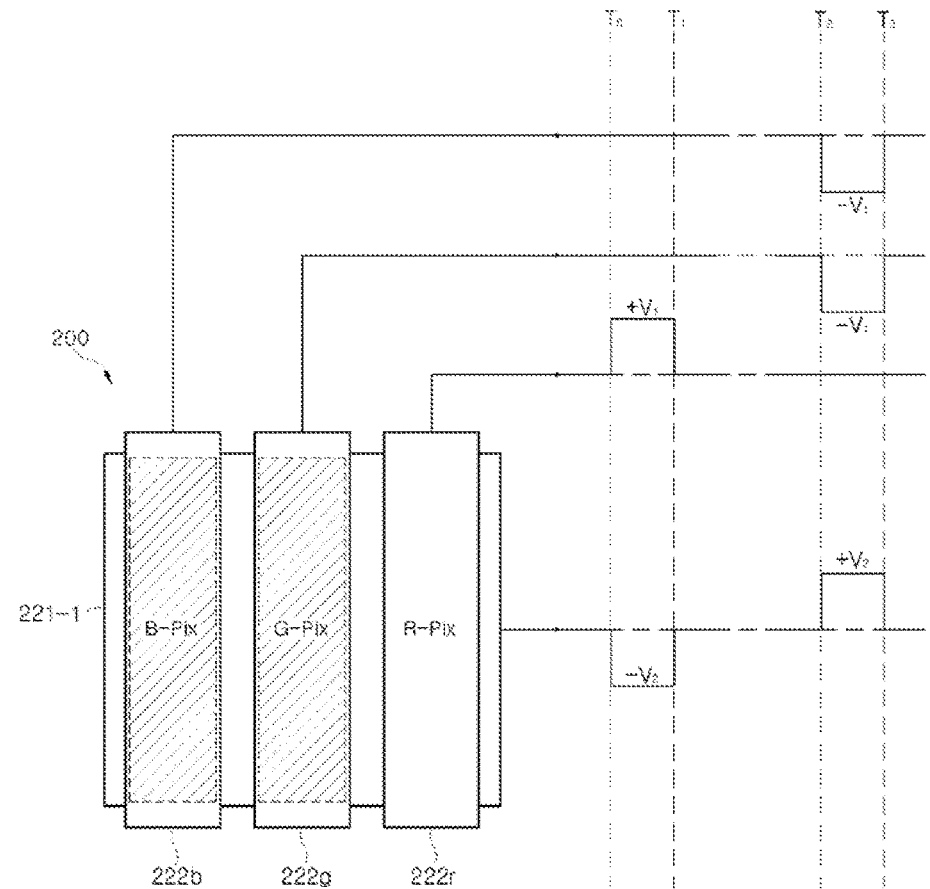
[Fig. 20]
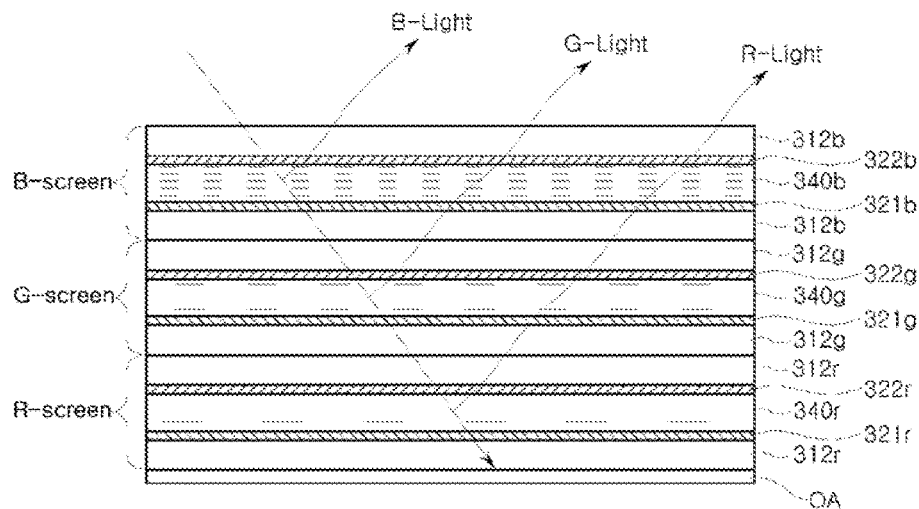

[Fig. 21]
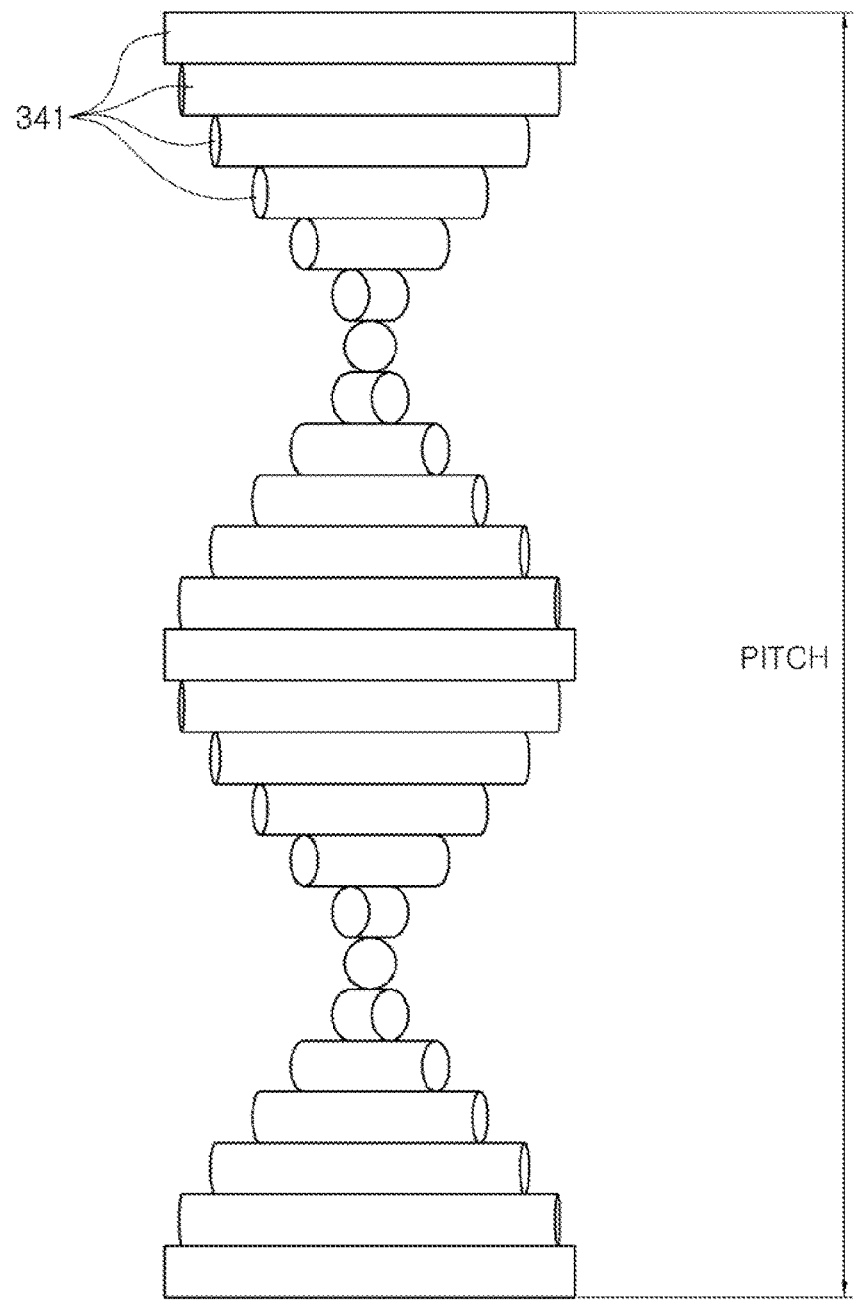

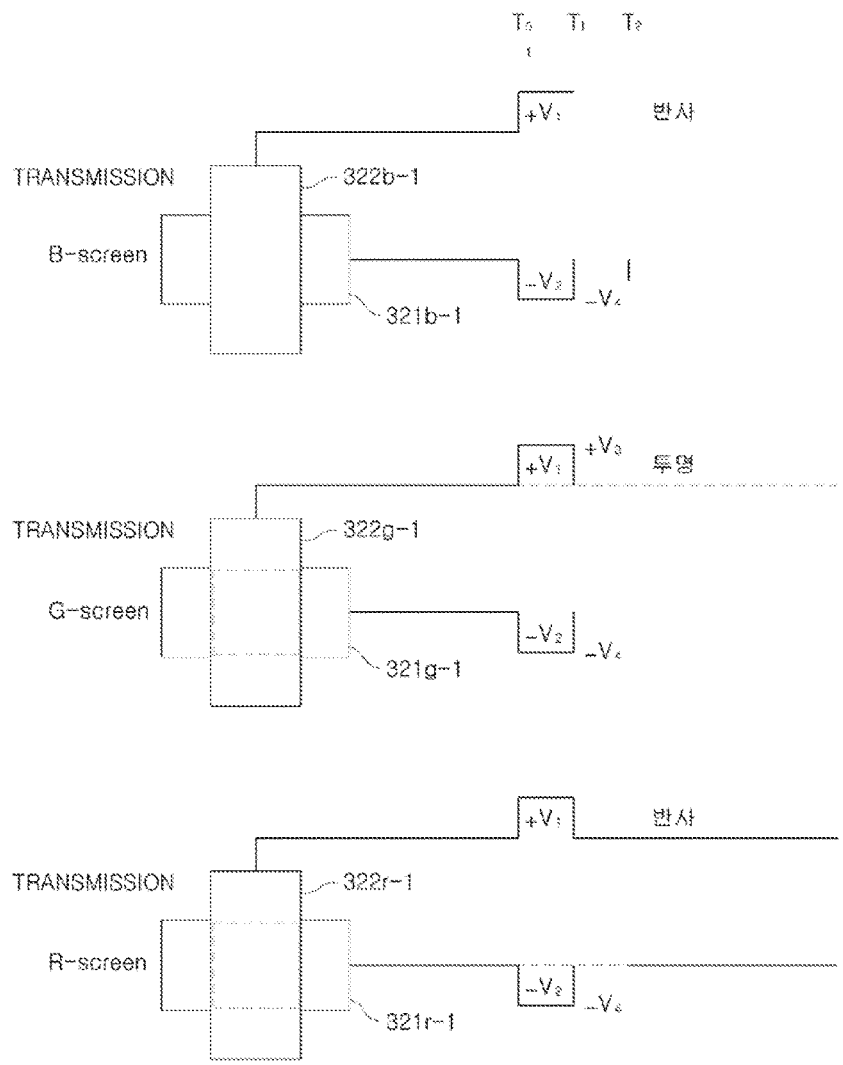
[Fig. 23]

[Fig. 24]
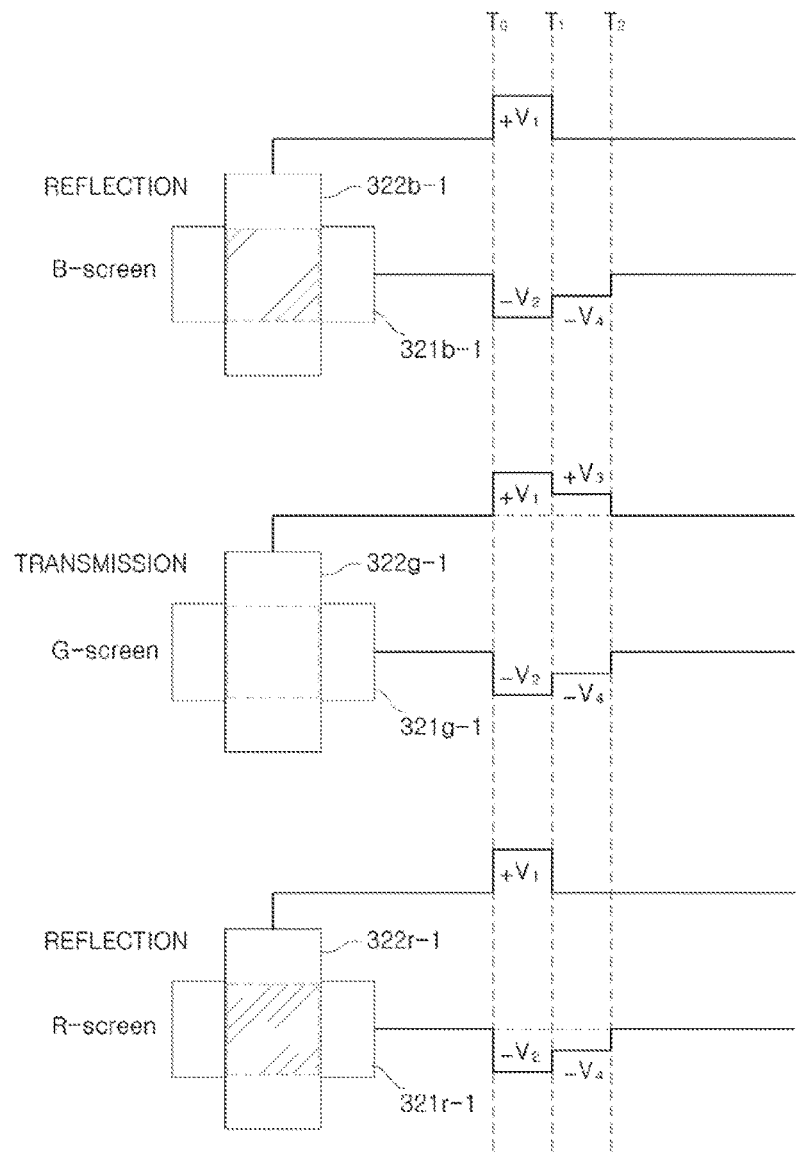

[Fig. 25]
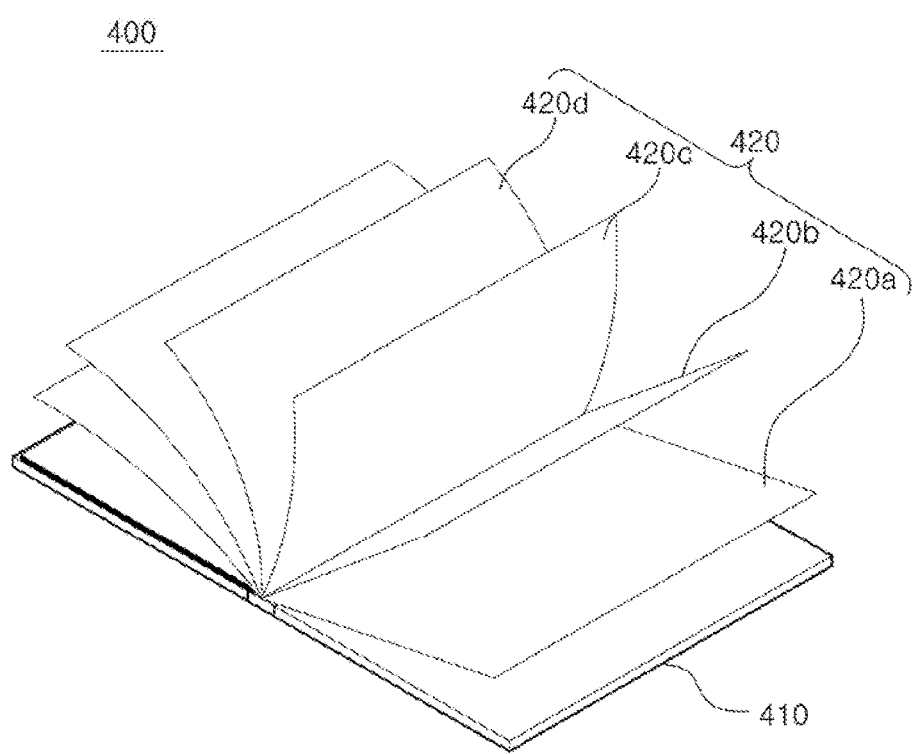

[Fig. 26]
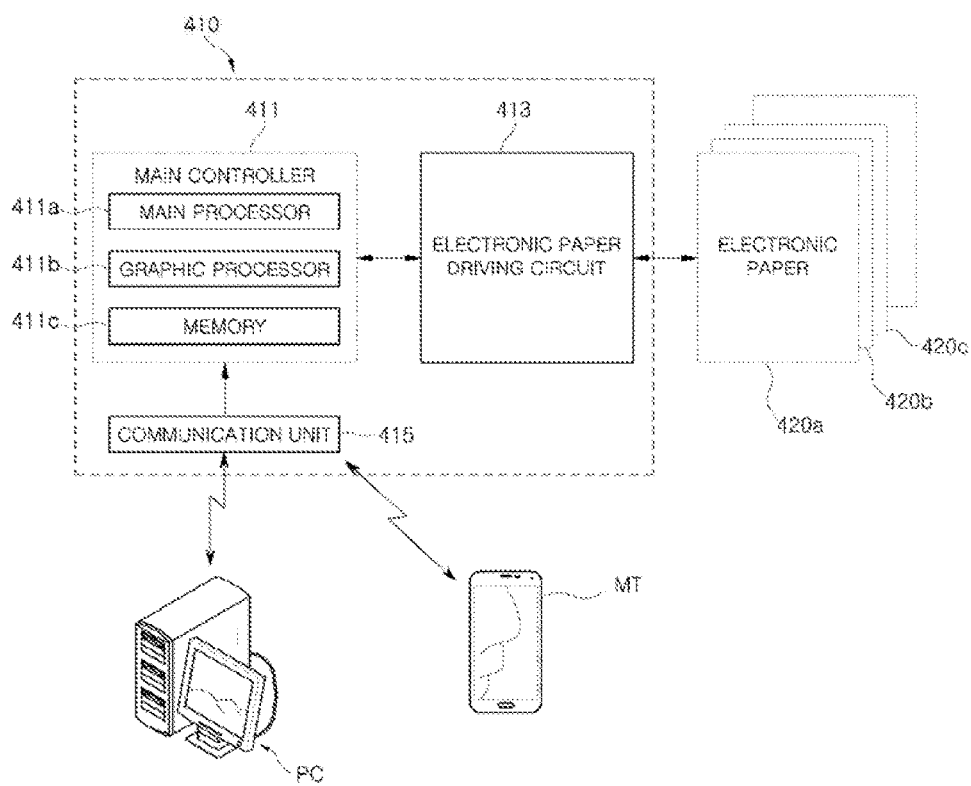

[Fig. 29]
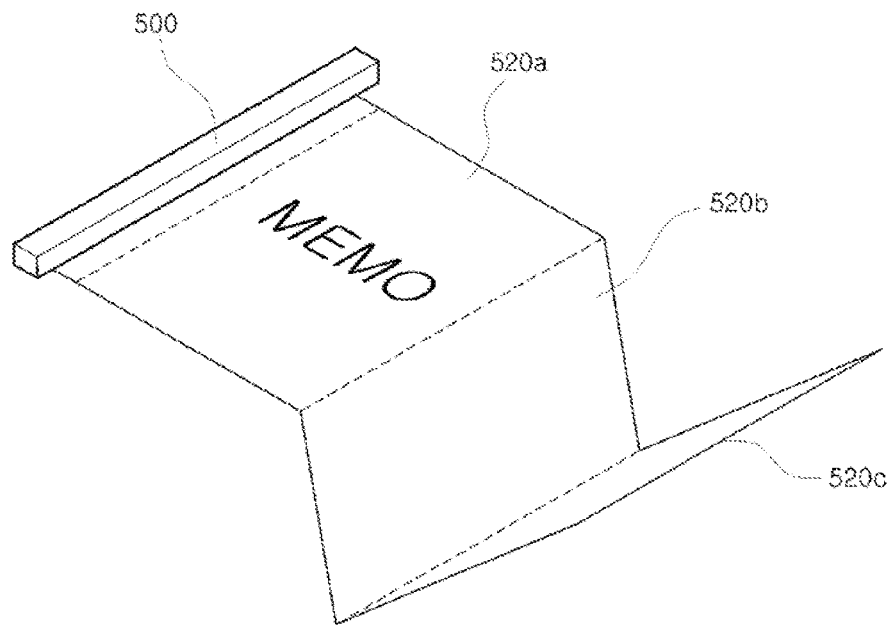
[Fig. 30]
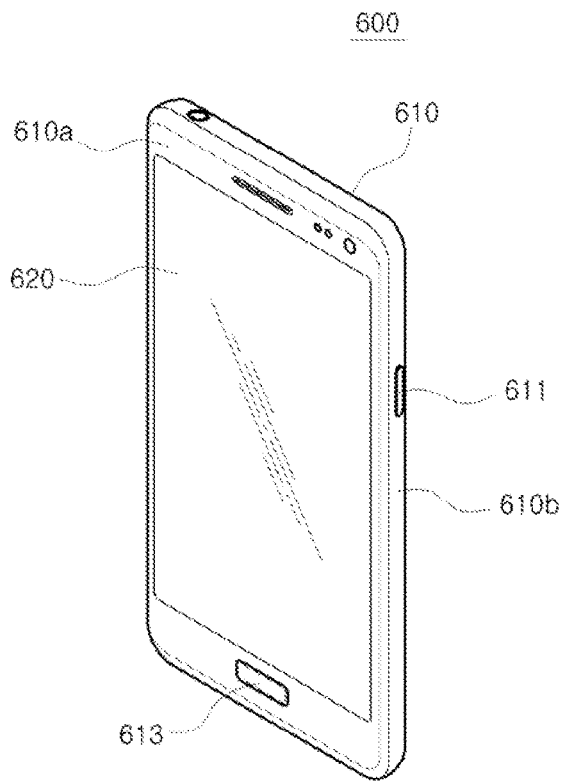

[Fig. 31]
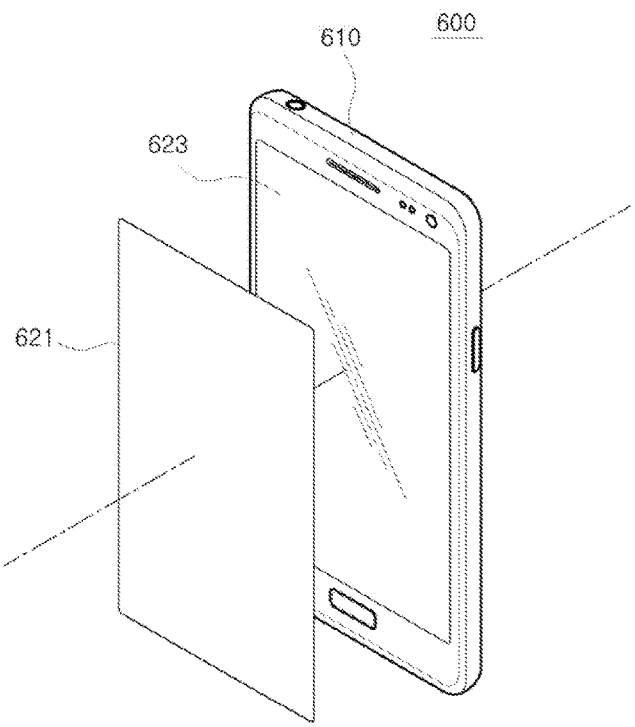
[Fig. 32]
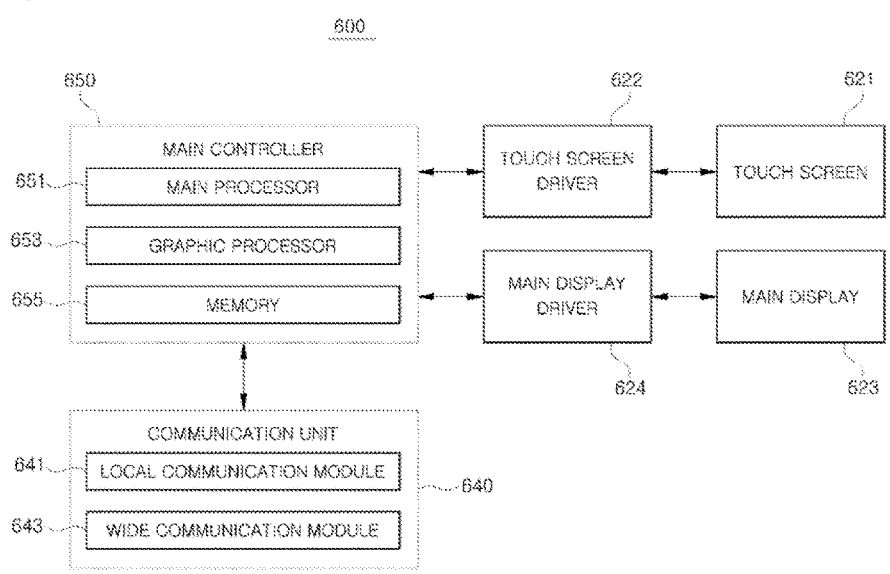

[Fig. 33]
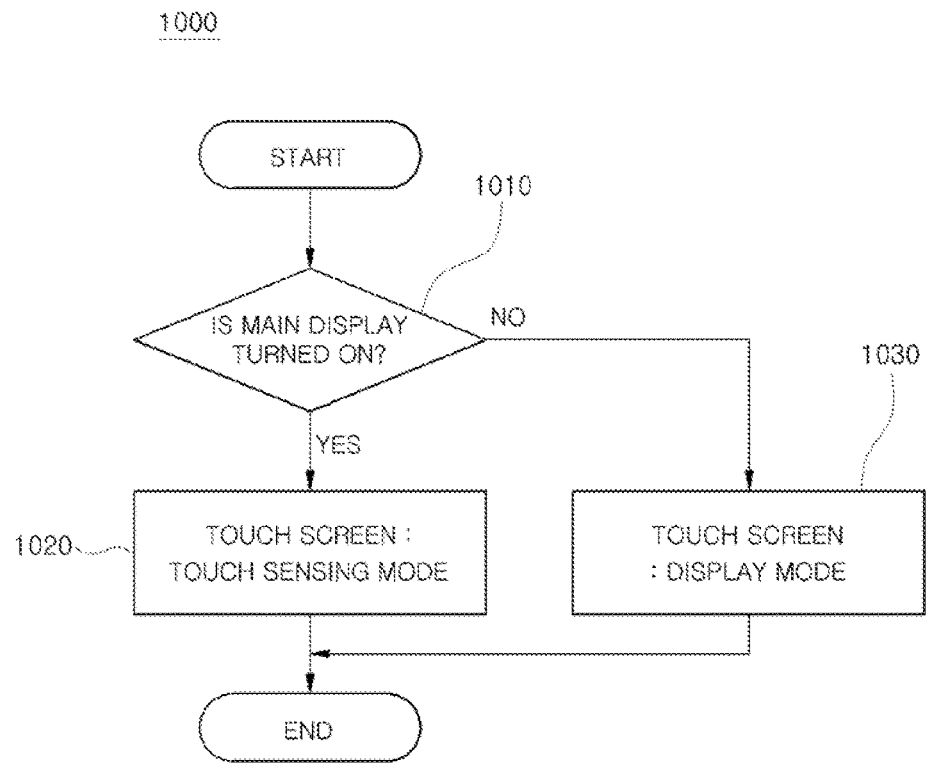
[Fig. 34]
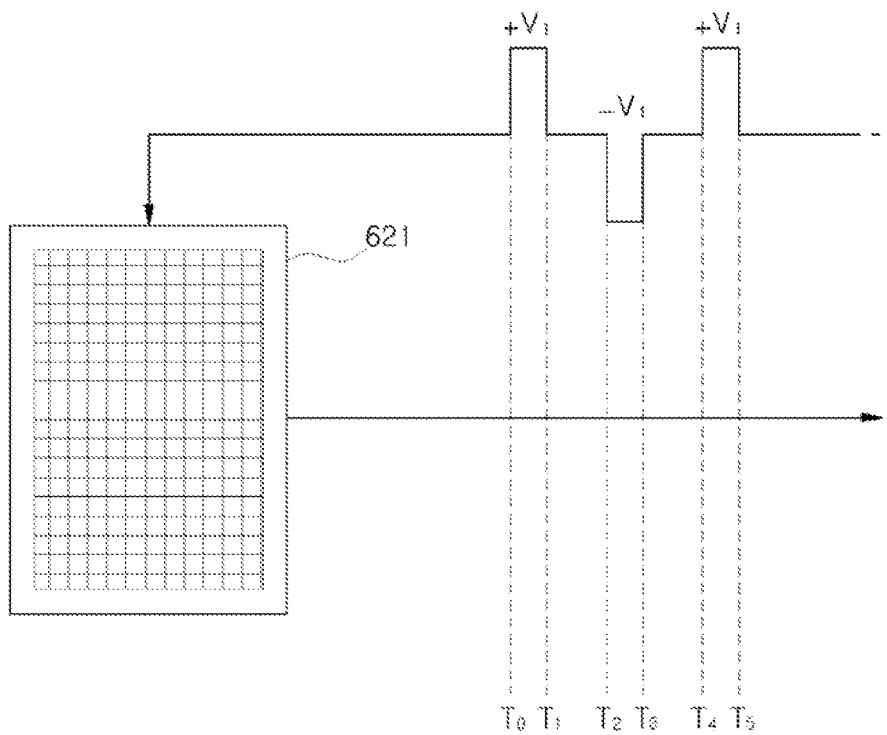

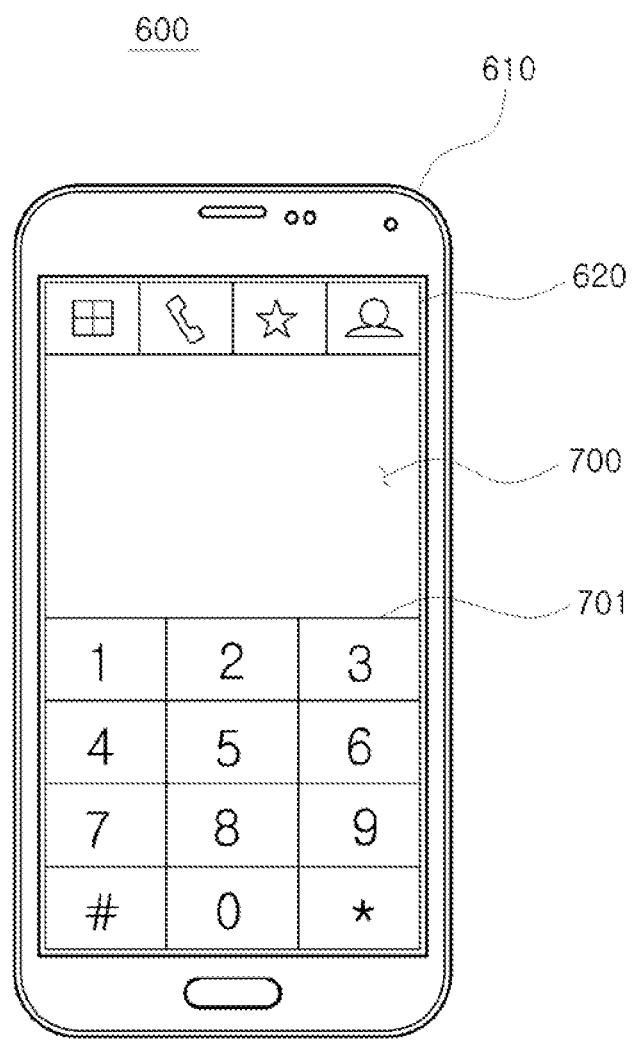
[Fig. 35]

[Fig. 36]
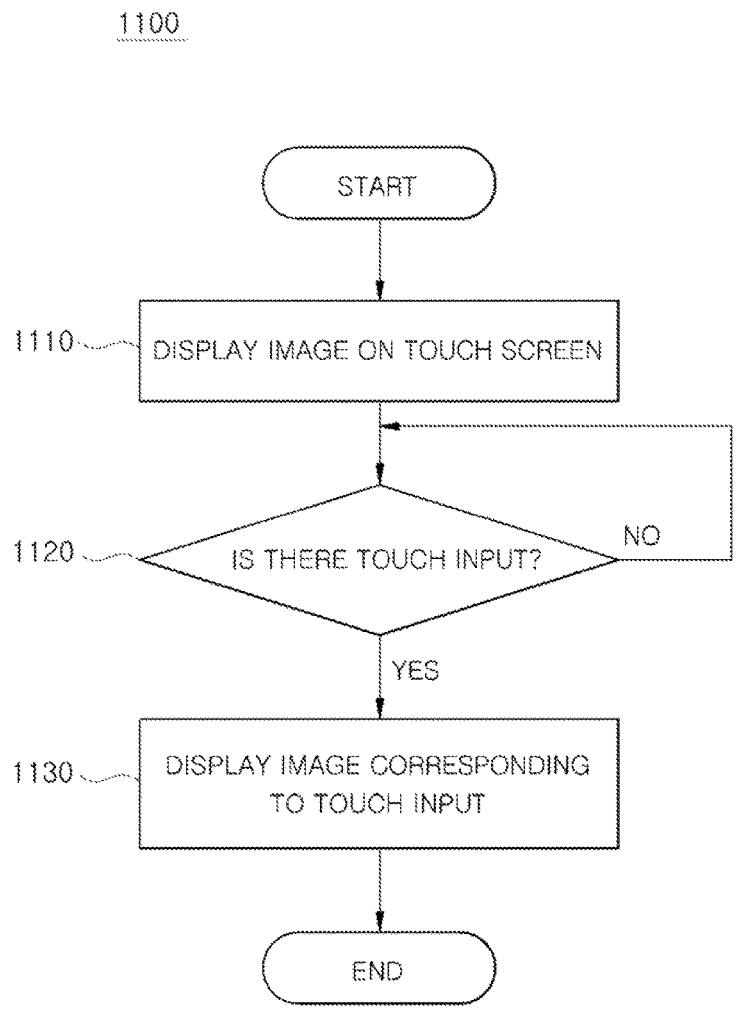

[Fig. 37]
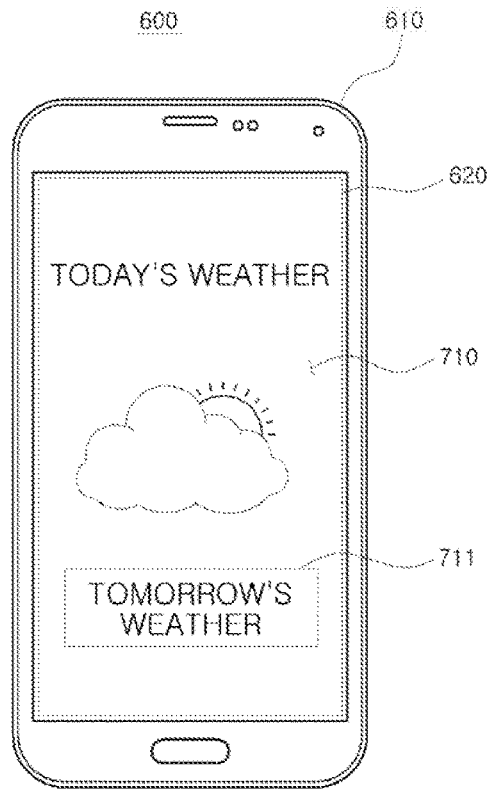
[Fig. 38]
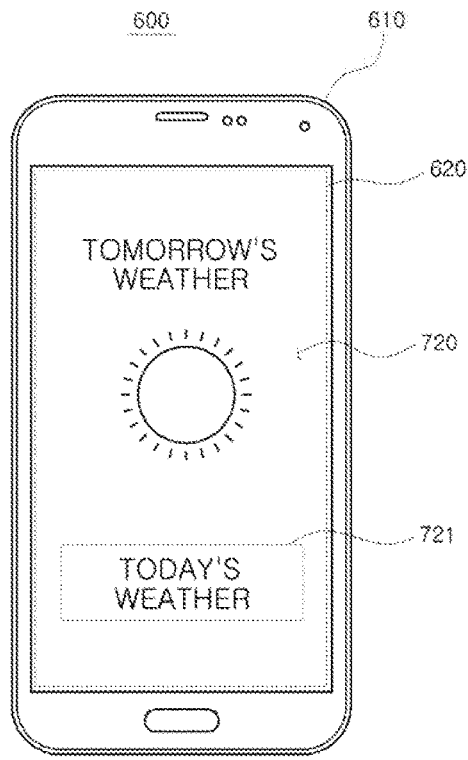

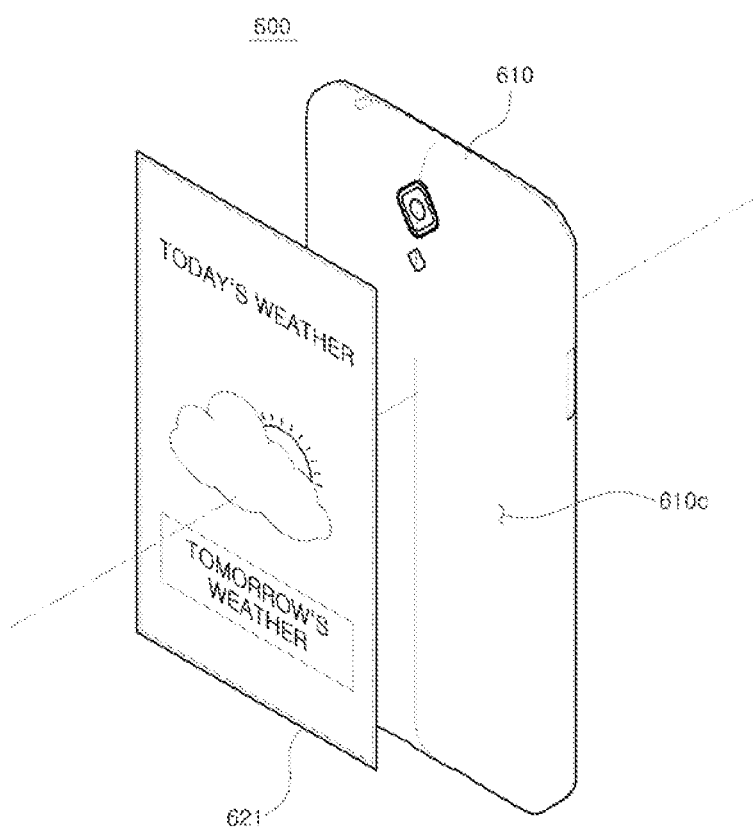
[Fig. 39]

[Fig. 40]
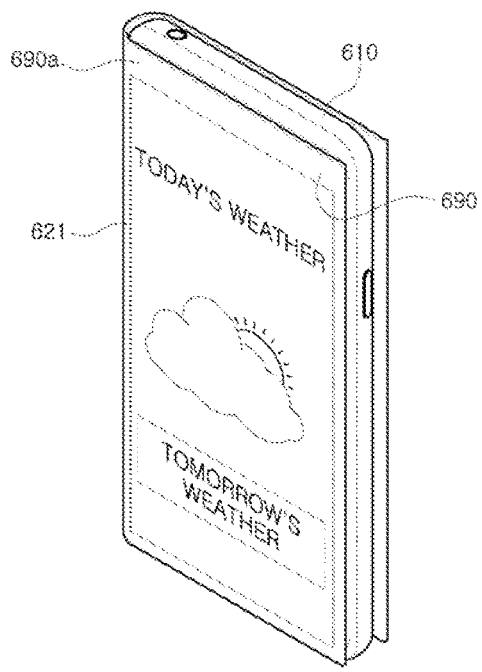
[Fig. 41]
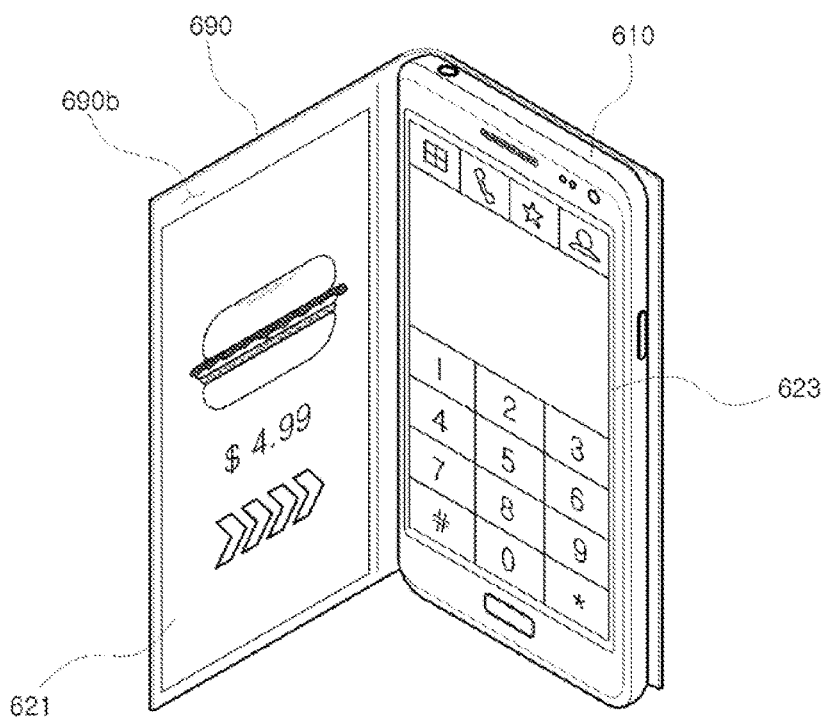

TOUCH SCREEN PANEL, ELECTRONIC NOTEBOOK, AND MOBILE TERMINAL

CROSS-REFERENCE TO RELATED APPLICATIONS

This application is a U.S. national stage application, which claims the benefit under 35 USC § 371 of PCT International Patent Application No. PCT/KR2015/009082, filed Aug. 28, 2015 which claims foreign priority benefit under 35 USC § 119 of Korean Patent Application No. 10-2014-0118983, filed on Sep. 5, 2014, the entire contents of which are incorporated herein by reference.

TECHNICAL FIELD

The disclosure relates to a touch screen panel, an electronic notebook, and a mobile terminal.

BACKGROUND ART

Generally, a touch screen panel refers to a screen that may directly receive a user's command by determining a position of a character displayed on the screen or a specific position at which a part of the user's body reaches (touches) without using a keyboard. Such a touch screen panel may reduce a size of a product by integrally providing a display device and an input device, and is thus widely used in portable electronic devices.

Touch screen panels may be divided into a resistive type, a capacitance type, an infrared type, and an ultrasonic type according to a method of receiving a user's command.

In a resistive-type touch screen panel, a dielectric (an insulator) is provided between two electrically separated electrodes. When the panel is touched by a part of a user's body, pressure is generated, and resistive films may come in contact with each other due to this pressure. The resistive-type touch screen panel senses the user's touch by sensing a change of an electrical resistance between the two electrodes due to the contact of these resistive films.

In a capacitance type touch screen panel, a dielectric (an insulator) is provided between two electrically separated electrodes. Also, the capacitance type touch screen panel senses a user's touch by sensing a change of a capacitance between the two electrodes caused by a part of the user's body touching the panel.

However, in a conventional touch screen panel, a touch pad for sensing a user's touch and a display panel for displaying an image use different electrodes, and thus a thickness of the touch screen panel and production costs are increased.

DISCLOSURE

Technical Problem

The disclosure is directed to providing a touch screen panel including a touch screen having a simple structure and a thin thickness, an electronic notebook, and a mobile terminal.

Technical Solution

In accordance with one aspect of the present disclosure, a touch screen panel may include a liquid crystal, a first transparent electrode and a second transparent electrode provided at both sides of the liquid crystal, and a controller configured to transfer image data to the first transparent electrode and the second transparent electrode in a first mode and sense a touch of a user on at least one of the first transparent electrode and the second transparent electrode in a second mode.

The touch screen panel may further include a display driver configured to supply a driving voltage corresponding to the image data to the first transparent electrode and the second transparent electrode in the first mode and a touch sensor configured to transfer a sensing signal to the first transparent electrode and receive a response signal of the second transparent electrode in the second mode.

The first transparent electrode may include a plurality of first conductive lines that are parallel to each other. The second transparent electrode may include a plurality of second conductive lines that are perpendicular to the plurality of first conductive lines.

The display driver may provide a scan signal to the plurality of second conductive lines in a predetermined order and provide the image data to the plurality of first conductive lines.

The touch sensor may provide the sensing signal to the plurality of first conductive lines in a predetermined order and receive the response signal from the plurality of second conductive lines.

The touch sensor may sense the touch of the user based on a change of an electrical resistance between the plurality of first conductive lines and the plurality of second conductive lines.

The touch sensor may sense the touch of the user based on a change of a capacitance between the plurality of first conductive lines and the plurality of second conductive lines.

The liquid crystal may be in a first state in which light is transmitted when a voltage equal to or higher than a first reference voltage is applied between the first transparent electrode and the second transparent electrode. The liquid crystal may be in a second state in which light is reflected when a voltage less than the first reference voltage is applied between the first transparent electrode and the second transparent electrode.

After the liquid crystal transitions to the first state or the second state, the liquid crystal may maintain the transitioned state.

The touch screen panel may further include an optical absorption layer configured to absorb light transmitted through the liquid crystal.

The liquid crystal may be a cholesteric liquid crystal.

The liquid crystal may block light when a voltage less than a first reference voltage is applied between the first transparent electrode and the second transparent electrode. The liquid crystal may transmit the light when a voltage equal to or higher than the first reference voltage is applied between the first transparent electrode and the second transparent electrode.

The touch screen panel may further include a back light configured to emit the light.

The liquid crystal may be a nematic liquid crystal.

The touch screen panel may further include a first transparent substrate to which the first transparent electrode is attached and a second transparent substrate to which the second transparent electrode is attached.

In accordance with one aspect of the present disclosure, an electronic notebook may include an electronic paper configured to sense a touch input of a user and display an image corresponding to the touch input, and a main body coupled to the electronic paper. The electronic paper may include a liquid crystal, and a first transparent electrode and a second transparent electrode which are provided at both sides of the liquid crystal. The main body may include an electronic paper driver configured to transfer image data to the first transparent electrode and the second transparent electrode in a first mode, and sense a touch of the user on at least one of the first transparent electrode and the second transparent electrode in a second mode.

The electronic paper may be separated from the main body.

The displayed image may not disappear even when the electronic paper is separated from the main body.

The liquid crystal may be in a first state in which light is transmitted when a voltage equal to or higher than a first reference voltage is applied between the first transparent electrode and the second transparent electrode. The liquid crystal may be in a second state in which light is reflected when a voltage less than the first reference voltage is applied between the first transparent electrode and the second transparent electrode.

After the liquid crystal transitions to the first state or the second state, the liquid crystal may maintain the transitioned state.

The liquid crystal may be a cholesteric liquid crystal.

The electronic paper may include a first page and a second page, and the first page and the second page may sense the touch input of the user and display the image corresponding to the touch input.

In accordance with one aspect of the present disclosure, a mobile terminal may include a touch screen configured to sense a touch input of a user and display an image corresponding to the touch input, a main display configured to display the image, and a controller configured to control the touch screen and the main display. The touch screen may include a liquid crystal, and a first transparent electrode and a second transparent electrode which are provided at both sides of the liquid crystal. The controller may transfer image data to the first transparent electrode and the second transparent electrode in a first mode, and sense a touch of the user on at least one of the first transparent electrode and the second transparent electrode in a second mode.

The touch screen may include a reflective display.

The displayed image may not disappear even when power supplied to the touch screen is interrupted.

The image displayed on the main display may be output through the touch screen.

When the image is displayed on the main display, the controller may control the touch screen to transmit light.

When the image is not displayed on the main display, the controller may control the touch screen to display the image.

The liquid crystal may be in a first state in which light is transmitted when a voltage equal to or higher than a first reference voltage is applied between the first transparent electrode and the second transparent electrode. The liquid crystal may be in a second state in which light is reflected when a voltage less than the first reference voltage is applied between the first transparent electrode and the second transparent electrode.

After the liquid crystal transitions to the first state or the second state, the liquid crystal may maintain the transitioned state.

The liquid crystal may be a cholesteric liquid crystal.

Advantageous Effects

According to embodiments of the disclosure, a touch screen panel including a touch screen having a simple structure and a thin thickness, an electronic notebook, and a mobile terminal may be provided by displaying an image and sensing a touch using only a pair of electrodes.

DESCRIPTION OF DRAWINGS

FIG. 1 illustrates an exterior of an example of a touch screen included in a touch screen panel according to one embodiment.

FIG. 2 is an exploded view of a configuration of the touch screen illustrated in FIG. 1.

FIG. 3 is a cross-sectional view taken along line A-A' of FIG. 1.

FIG. 4 schematically illustrates transparent electrodes included in the touch screen illustrated in FIG. 1.

FIG. 7 illustrates a configuration of a touch screen panel according to one embodiment.

FIGS. 8 to 10 illustrate an example of a display operation of a touch screen panel according to one embodiment.

FIGS. 11 and 12 illustrate an example of a touch sensing operation of a touch screen panel according to one embodiment.

FIGS. 13 and 14 illustrate another example of the touch sensing operation of the touch screen panel according to one embodiment.

FIG. 15 is a cross section of an example of a transmissive touch screen included in a touch screen panel according to one embodiment.

FIG. 16 illustrates an orientation film included in the transmissive touch screen illustrated in FIG. 15.

FIGS. 17A and 17B illustrate an example of a display operation of the transmissive touch screen illustrated in FIG. 15.

FIGS. 18 and 19 illustrate an example of a display operation of the touch screen panel including the transmissive touch screen illustrated in FIG. 15.

FIG. 20 is a cross-sectional view of an example of a reflective touch screen included in a touch screen panel according to one embodiment.

FIG. 21 illustrates liquid crystal molecules included in the reflective touch screen illustrated in FIG. 20.

FIGS. 23 and 24 illustrate an example of a display operation of the touch screen panel including the reflective touch screen illustrated in FIG. 20.

FIG. 25 illustrates an exterior of an electronic notebook according to one embodiment.

FIG. 26 illustrates a configuration of the electronic notebook according to one embodiment.

FIG. 29 illustrates an exterior of an electronic printer according to one embodiment.

FIGS. 30 and 31 illustrate an exterior of a mobile terminal according to one embodiment.

FIG. 32 illustrates a configuration of the mobile terminal according to one embodiment.

FIGS. 33 to 35 illustrate an operation of the user interface of the mobile terminal according to one embodiment.

FIGS. 36 to 38 illustrate an operation of the touch screen in the display mode.

FIGS. 39 to 41 illustrate a mobile terminal according to another embodiment.

MODES OF THE INVENTION

Figure 5A:
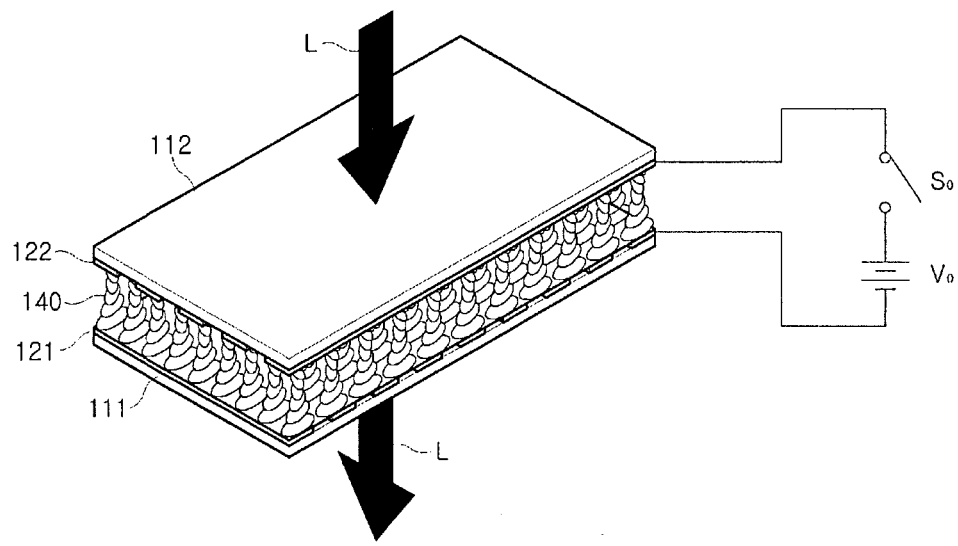
FIGS. 5A and 5B illustrate an example of an operation of the touch screen illustrated in FIG. 1.

Embodiments described in this specification and configurations illustrated in drawings are only exemplary examples of the disclosure. It should be understood that the invention covers various modifications that can substitute for the embodiments herein and drawings at a time of filing of this application.

Also, like reference numbers or numerals in the drawings of this specification denote like parts or components that perform substantially the same function.

Also, terms used in this specification are merely used to describe exemplary embodiments, and are not intended to limit the embodiments. An expression used in the singular encompasses the expression of the plural unless it has a clearly different meaning in the context. In this specification, it should be understood that terms such as "including," "having," and "comprising" are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

Also, it should be understood that, although the terms "first," "second," etc. may be used herein to describe various elements, these elements are not limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

Also, a "touch" may be caused by one of fingers including a thumb or by a touch input unit (e.g., a stylus, etc.). The "touch" may include hovering by one of the fingers including the thumb or by the touch input unit. Also, the "touch" may include a multi-touch as well as a single touch.

Hereinafter, one embodiment of the disclosure will be described in detail with reference to the accompanying drawings.

FIG. 1 illustrates an exterior of an example of a touch screen included in a touch screen panel according to one embodiment, and FIG. 2 is an exploded view of a configuration of the touch screen illustrated in FIG. 1. Also, FIG. 3 is a cross-sectional view taken along line A-A' of FIG. 1, and FIG. 4 schematically illustrates transparent electrodes included in the touch screen illustrated in FIG. 1.

A touch screen panel, which is a device which displays an image and senses a user's touch, may include a touch screen, a display driving circuit, a touch sensing circuit, a control circuit, and the like.

Before describing the touch screen panel in detail, an example of a touch screen 100 will be described with reference to FIGS. 1 to 4.

The touch screen 100 may include transparent substrates 111 and 112, transparent electrodes 121 and 122, and a liquid crystal layer 140.

The transparent substrates 111 and 112 form an exterior of the touch screen 100 and include a first transparent substrate 111 and a second transparent substrate 112.

The first transparent substrate 111 and the second transparent substrate 112, which are portions on which a user's direct touch is performed, are exposed to the outside to form an external shape of the touch screen 100 and protect internal components of the touch screen 100.

Any one of the first transparent substrate 111 and the second transparent substrate 112 may be provided on an uppermost layer of the touch screen 100 and the other one may be provided on a lowermost layer of the touch screen 100. In FIG. 1, the second transparent substrate 112 and the first transparent substrate 111 are illustrated as being respectively provided on the uppermost layer and the lowermost layer of the touch screen, but the disclosure is not limited thereto.

The first transparent substrate 111 and the second transparent substrate 112 may be formed with tempered glass or a transparent film.

The tempered glass is molded plate glass which is heated to a temperature ranging from 500° C. to 600° C., which is close to a softening temperature of glass, and rapidly cooled by compressed cooling air, and thus a surface thereof may be compressed and deformed and an interior thereof may be strengthened by tensile deformation. Such tempered glass has 3 to 5 times a bending strength, 3 to 8 times an impact resistance, and more excellent heat resistance in comparison to general glass.

The transparent film may be made with a transparent synthetic resin and is transparent and flexible. Therefore, when the first transparent substrate 111 and the second transparent substrate 112 are formed with a transparent film, the touch screen 100 may be bent.

Such a transparent film may use a transparent and strong poly methyl methacrylate (PMMA) film, a transparent polycarbonate (PC) film, or the like.

The transparent electrodes 121 and 122 are provided between the first transparent substrate 111 and the second transparent substrate 112.

The transparent electrodes 121 and 122 are formed of a metal material through which electricity is conducted, and generate an electric field for changing an arrangement of liquid crystal molecules constituting the liquid crystal layer 140 to be described below.

Also, the transparent electrodes 121 and 122 may be formed of a transparent material, and may transmit light incident from the outside.

The transparent electrodes 121 and 122 include a first transparent electrode 121 attached to the first transparent substrate 111 and a second transparent electrode 122 attached to the second transparent substrate 112. The first transparent electrode 121 may be formed on the first transparent substrate 111 in a specific pattern, and the second transparent electrode 122 may be formed on the second transparent substrate 112 in a specific pattern.

Specifically, the first transparent electrode 121 and the second transparent electrode 122 may include a plurality of lines 121a, 121b, 121c, 122a, 122b, and 122c.

Horizontal lines 121a, 121b, and 121c constituting the first transparent electrode 121 are disposed so that long sides thereof face an x-axis direction as illustrated in FIG. 2, and the plurality of horizontal lines 121a, 121b, and 121c are disposed in a y-axis direction.

Also, vertical lines 122a, 122b, and 122c constituting the second transparent electrode 122 are disposed so that long sides thereof face the y-axis direction as illustrated in FIG. 2, and the plurality of vertical lines 122a, 122b, and 122c are disposed in the x-axis direction.

As a result, the plurality of horizontal lines 121a, 121b, and 121c constituting the first transparent electrode 121 and the plurality of vertical lines 122a, 122b, and 122c constituting the second transparent electrode 122 perpendicularly intersect each other as illustrated in FIG. 2.

Also, as illustrated in FIG. 4, pixels (pix11 to pix33) are formed at portions at which the plurality of horizontal lines 121a, 121b, and 121c constituting the first transparent electrode 121 intersect the plurality of vertical lines 122a, 122b, and 122c constituting the second transparent electrode 122.

For example, a 1-1 pixel (pix11) may be formed at a position at which a first horizontal line 121a of the first transparent electrode 121 intersects a first vertical line 122a of the second transparent electrode 122, a 1-2 pixel (pix12) may be formed at a position at which the first horizontal line 121a of the first transparent electrode 121 intersect a second vertical line 122b of the second transparent electrode 122, and a 1-3 pixel (pix13) may be formed at a position at which the first horizontal line 121a of the first transparent electrode 121 intersects a third vertical line 122c of the second transparent electrode 122.

Also, a 2-1 pixel (pix21) may be formed at a position at which a second horizontal line 121b of the first transparent electrode 121 intersects the first vertical line 122a of the second transparent electrode 122, a 2-2 pixel (pix22) may be formed at a position at which the second horizontal line 121b of the first transparent electrode 121 intersects the second vertical line 122b of the second transparent electrode 122, and a 2-3 pixel (pix23) may be formed at a position at which the second horizontal line 121b of the first transparent electrode 121 intersects the third vertical line 122c of the second transparent electrode 122.

As described above, the pixels (pix11 to pix33) may be two-dimensionally disposed at positions at which the first transparent electrode 121 and the second transparent electrode 122 intersect each other.

The first transparent electrode 121 and the second transparent electrode 122 may be formed of indium tin oxide (ITO), indium zinc oxide (IZO), or the like, which has high electrical conductivity and good light transmittance in a visible light region.

Also, the first transparent electrode 121 and the second transparent electrode 122 may be formed of an Ag nanowire, a carbon nanotube (CNT), or the like, which has higher electrical conductivity and better light transmittance in the visible light region than ITO or IZO.

In addition, the first transparent electrode 121 and the second transparent electrode 122 may be formed of graphene, 3,4-ethylenedioxythiophene (PEDOT), or the like, which is transparent enough to transmit 98% or more of light and whose electric conductivity is 100 times or more that of copper (Cu).

Also, the first transparent electrode 121 and the second transparent electrode 122 may be respectively formed on the first transparent substrate 111 and the second transparent substrate 112 through a deposition process, a photolithography process, an etching process, and the like.

The liquid crystal layer 140 may be provided between the first transparent electrode 121 and the second transparent electrode 122.

A liquid crystal refers to a material in a state which has properties between those of a crystal and those of a liquid.

When a general material in a solid state is heated, a state of the material is changed from a solid state to a transparent liquid state at a melting temperature thereof. On the other hand, when a liquid crystal material in a solid state is heated, the liquid crystal material is changed into a transparent liquid after being changed into an opaque and turbid liquid at a melting temperature thereof.

The term "liquid crystal" is used having two meanings: a case indicating a liquid crystal state which is an intermediate state between a solid state and a liquid state, and a case indicating a material that has such a liquid crystal state.

Most of such liquid crystal materials are organic compounds and their molecules have a thin and long rod shape or a flat shape. The molecules are irregularly arranged in any one direction, but have a regular crystal form in the other directions. As a result, the liquid crystal has both fluidity of liquid and optical anisotropy of crystal.

Also, the liquid crystal exhibits optical properties according to a change of voltage and a change of temperature. For example, an arrangement direction of the molecules constituting the liquid crystal changes according to a change of voltage or a color of the liquid crystal changes according to a change of temperature.

The liquid crystal may be divided into a nematic liquid crystal, a smectic liquid crystal, and a cholesteric liquid crystal according to directionality thereof.

The smectic liquid crystal has a structure in which rod-shaped molecules are layered. Molecules of the smectic liquid crystal are arranged to be parallel to each other and are arranged in a direction perpendicular to each layer. Also, a bonding between liquid crystal molecule layers is relatively weak, and thus the liquid crystal molecule layers are liable to slide with each other. Because of this, the smectic liquid crystal exhibits properties of a two-dimensional fluid and has a very large viscosity compared to ordinary liquid.

In the nematic liquid crystal, rod-shaped liquid crystal molecules are arranged to be parallel to each other, but each of the liquid crystal molecules may move relatively freely in a long axis direction of the molecules. Also, the nematic liquid crystal does not have a layered structure. Because of this, the nematic liquid crystal has excellent fluidity and low viscosity.

The nematic liquid crystal is aligned in a direction of a fine groove formed in a surface in contact with the liquid crystal when there is no electric field, and is aligned in a direction of an electric field when the electric field is generated.

The cholesteric liquid crystal has a layered structure like the smectic liquid crystal, but liquid crystal molecules thereof are arranged to be parallel in each layer. Also, the liquid crystal molecules in a long axis direction are arranged to be slightly separated between adjacent layers, and the liquid crystal has an overall spiral structure. Due to such a spiral structure, the cholesteric liquid crystal has optical properties such as optical rotation, selective light scattering, circular polarization, dichroism, and the like.

The cholesteric liquid crystal has a spiral structure as described above when there is no electric field, but the molecules of the cholesteric liquid crystal are re-arranged in a direction of an electric field when the electric field is applied to the cholesteric liquid crystal.

As described above, the arrangement of the liquid crystal molecules vary according to the presence or absence of an electric field, and the touch screen 100 generates an image using the change of the arrangement of the liquid crystal molecules according to the electric field.

The configuration of the touch screen 100 according to one embodiment has been described above.

Hereinafter, an operation of the touch screen 100 according to one embodiment will be described.

The touch screen 100 has a surface composed of a plurality of pixels. The pixel is a unit in which the touch screen 100 displays an image, and is also a unit in which the touch screen 100 senses a user's touch.

When the touch screen 100 displays an image, the touch screen 100 displays the image through a plurality of pixels which output light or do not output light. This is similar to a mosaic of black and white.

For example, a pixel which outputs light corresponds to white and a pixel which does not output light corresponds to black. Also, whether or not each pixel outputs light is determined by image data input to the touch screen 100.

Also, when the touch screen 100 senses a user's touch, the touch screen 100 may detect a position of the user's touch based on a position of a pixel at which the user's touch is sensed. This is similar to recognizing a number input by the user based on a position of a key pressed by the user on a number key pad.

As described above, a large number of pixels, which are the basis of the display and the touch sensing, are provided according to a resolution of the touch screen 100.

However, hereinafter, it is assumed that the touch screen 100 includes 3×3 pixels. This is only for facilitating an understanding of the disclosure, and the disclosure is not limited thereto.

Figure 5B:
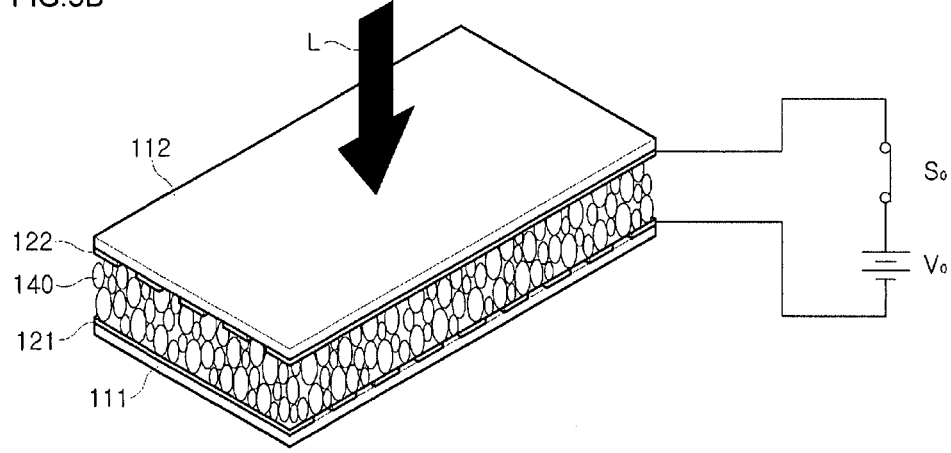
Figure 6A:
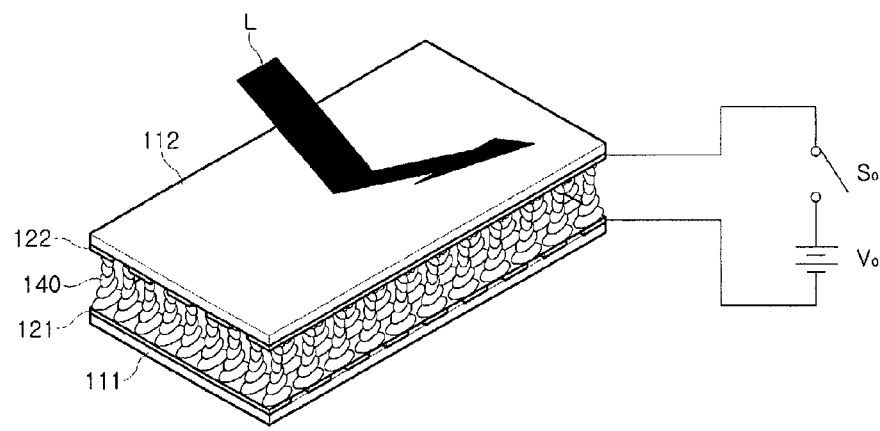
FIGS. 6A and 6B illustrate another example of the operation of the touch screen illustrated in FIG. 1.
Figure 6B:
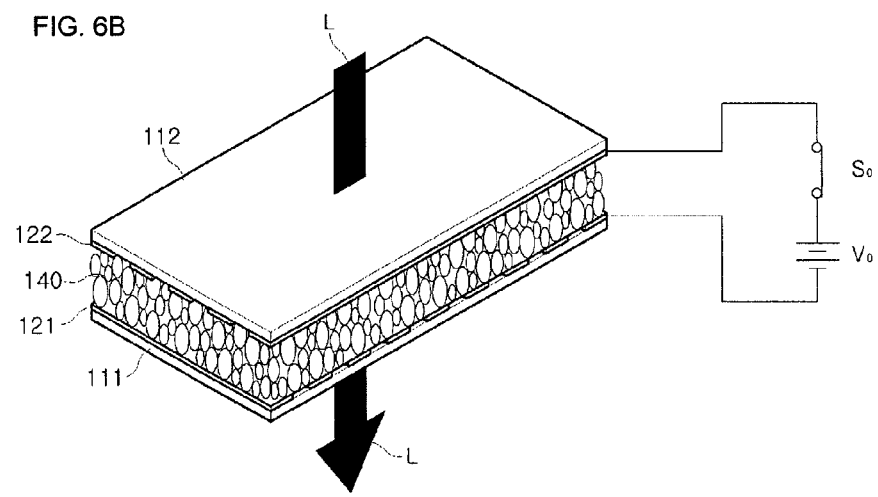

FIGS. 5A and 5B illustrate an example of an operation of the touch screen illustrated in FIG. 1, and FIGS. 6A and 6B illustrate another example of the operation of the touch screen illustrated in FIG. 1.

The touch screen 100 may operate in various ways according to a type of a liquid crystal which constitutes the liquid crystal layer 140. Specifically, the touch screen 100 may operate as a transmissive display which transmits light or as a reflective display which reflects light according to the type of the liquid crystal which constitutes the liquid crystal layer 140.

For example, the touch screen 100 may operate as a transmissive display as illustrated in FIGS. 5A and 5B.

Specifically, when a voltage from a power source $V_0$ is not applied between the first transparent electrode 121 and the second transparent electrode 122 of the touch screen 100, the touch screen 100 may transmit incident light L as illustrated in FIG. 5A. In other words, when a voltage less than a reference voltage is applied between the first transparent electrode 121 and the second transparent electrode 122 of the touch screen 100, the touch screen 100 may transmit the incident light L.

Also, when the voltage from the power source $V_0$ is applied between the first transparent electrode 121 and the second transparent electrode 122 of the touch screen 100, the touch screen 100 may block the incident light L as illustrated in FIG. 5B. In other words, when a voltage equal to or higher than the reference voltage is applied between the first transparent electrode 121 and the second transparent electrode 122 of the touch screen 100, the touch screen 100 may block the incident light L.

When a potential difference is generated between the first transparent electrode 121 and the second transparent electrode 122 of the touch screen 100 by the external power source $V_0$, an electric field is formed between the first transparent electrode 121 and the second transparent electrode 122. An arrangement of liquid crystal molecules constituting the liquid crystal layer 140 is changed by the electric field, and optical properties of the liquid crystal layer 140 are changed due to the change of the arrangement of the liquid crystal molecules.

In other words, when an electric field is generated in the liquid crystal layer 140, the incident light L may pass through the liquid crystal layer 140 as it is, and when an electric field is not generated in the liquid crystal layer 140, a polarization direction of the incident light L may be changed by the liquid crystal layer 140.

As described above, each of the pixels (pix11 to pix33) transmits or blocks the light L according to image data, and thus the touch screen 100 serving as a transmissive display may display an image corresponding to the image data.

In FIGS. 5A and 5B, the touch screen 100 is illustrated as transmitting the light L when the voltage is not applied between the first transparent electrode 121 and the second transparent electrode 122 by the power source $V_0$ and as blocking the light L when the voltage is applied between the first transparent electrode 121 and the second transparent electrode 122, but the disclosure is not limited thereto.

For example, when the voltage is not applied between the first transparent electrode 121 and the second transparent electrode 122 by the power source $V_0$, the touch screen 100 may block the light L, and when the voltage is applied between the first transparent electrode 121 and the second transparent electrode 122, the touch screen 100 may transmit the light L.

In another example, the touch screen 100 may operate as a reflective display as illustrated in FIGS. 6A and 6B.

Specifically, when a voltage from a power source $V_0$ is not applied between the first transparent electrode 121 and the second transparent electrode 122 of the touch screen 100, the touch screen 100 may reflect the incident light L as illustrated in FIG. 6A. In other words, when a voltage less than a reference voltage is applied between the first transparent electrode 121 and the second transparent electrode 122 of the touch screen 100, the touch screen 100 may reflect the incident light L.

Also, when a voltage from the power source $V_0$ is applied between the first transparent electrode 121 and the second transparent electrode 122 of the touch screen 100, the touch screen 100 may transmit the incident light L as illustrated in FIG. 6B. In other words, when a voltage equal to or higher than the reference voltage is applied between the first transparent electrode 121 and the second transparent electrode 122 of the touch screen 100, the touch screen 100 may transmit the incident light L.

When a potential difference is generated between the first transparent electrode 121 and the second transparent electrode 122 of the touch screen 100 by the external power source $V_0$, an electric field is formed between the first transparent electrode 121 and the second transparent electrode 122 and an arrangement of liquid crystal molecules constituting the liquid crystal layer 140 is changed by the electric field. Also, optical properties of the liquid crystal layer 140 are changed due to the change of the arrangement of the liquid crystal molecules, and thus the touch screen 100 may reflect or transmit the light L.

As described above, each of the pixels (pix11 to pix33) reflects or transmits the light L according to image data, and thus the touch screen 100 serving as a reflective display may display an image corresponding to the image data.

Hereinafter, a touch screen panel 10 including the above-described touch screen 100 will be described.

FIG. 7 illustrates a configuration of a touch screen panel according to one embodiment.

Referring to FIG. 7, the touch screen panel 10 includes the above-described touch screen 100, a display driver 30 for driving the touch screen 100, a touch sensor 40, and a touch screen controller 20.

The display driver 30 drives the touch screen 100 so that the touch screen 100 displays an image according to image data received from the touch screen controller 20 to be described below.

The display driver 30 may provide a scan signal to some pixels of the plurality of pixels (pix11 to pix33) included in the touch screen 100, and transfer image data to the pixels to which the scan signal is provided.

Specifically, the display driver 30 may provide the scan signal to any one of the plurality of horizontal lines 121a, 121b, and 121c constituting the first transparent electrode 121, and provide the image data to the plurality of vertical lines 122a, 122b, and 122c constituting the second transparent electrode 122.

For example, the display driver 30 may provide the scan signal to the first horizontal line 121a of the first transparent electrode 121 and transfer the image data to the plurality of vertical lines 122a, 122b, and 122c included in the second transparent electrode 122.

When the image data is transferred to the selected pixels (pix11, pix12, and pix13), each of the selected pixels (pix11, pix12, and pix13) may transmit or block light according to the transferred image data. Alternatively, each of the selected pixels (pix11, pix12, and pix13) may reflect or transmit the light according to the transferred image data.

A display of the touch screen panel 10 according to one embodiment will be described below in detail.

The touch sensor 40 provides a sensing signal to the touch screen 100 and receives a response signal from the touch screen 100 in response to a user's touch. Also, the touch sensor 40 may analyze the received response signal and calculate coordinates of a position of the touch screen 180 that is touched by the user.

Specifically, the touch sensor 40 may sequentially transfer the sensing signal to the plurality of vertical lines 122a, 122b, and 122c included in the second transparent electrode 122 and receive response signals from the plurality of horizontal lines 121a, 121b, and 121c included in the first transparent electrode 121.

For example, the touch sensor 40 may provide the sensing signal to the first vertical line 122a of the second transparent electrode 122 and receive response signals from the plurality of horizontal lines 121a, 121b, and 121c included in the first transparent electrode 121.

When the user touches the touch screen 100, the touch sensor 40 may receive a response signal from a horizontal line corresponding to a position of a horizontal line touched by the user among the plurality of horizontal lines 121a, 121b, and 121c included in the first transparent electrode 121.

Also, the touch sensor 40 may calculate coordinates of the position that is touched by the user based on the received response signal and transfer a touch sensing signal corresponding to the coordinates of the position that is touched by the user to the touch screen controller 20.

The touch screen controller 20 may transmit the image data to the display driver 30 and receive the touch sensing signal from the touch sensor 40.

As described above, not only is the image displayed but the user's touch is sensed through the transparent electrodes 121 and 122. In other words, the transparent electrodes 121 and 122 of the touch screen 100 may be used for functions of displaying and touch sensing.

The touch screen controller 20 may operate in a display mode or a touch sensing mode in order to perform touch sensing as well as displaying using the transparent electrodes 121 and 122.

In the display mode, the touch screen controller 20 may transmit image data to the display driver 30 and control the display driver 30 to display an image on the touch screen 100.

Also, in the touch sensing mode, the touch screen controller 20 may control the touch sensor 40 to sense a user's touch on the touch screen 100, and receive the touch sensing signal from the touch sensor 40.

The display mode and the touch sensing mode may be switched therebetween by various conditions.

For example, the touch screen controller 20 may switch between the display mode and the touch sensing mode according to a display time during which the display mode is performed and a touch sensing time during which the touch sensing mode is performed.

Specifically, the touch screen controller 20 may control the display driver 30 to display an image on the touch screen 100 for a predetermined display time, and the touch screen controller 20 may control the touch sensor 40 to sense a user's touch for a predetermined touch sensing time after the display time has elapsed. Also, the touch screen controller 20 may control the display driver 30 to display the image on the touch screen 100 again after the touch sensing time has elapsed.

As a result, the touch screen 100 may repeat displaying and touch sensing at intervals of the display time and the touch sensing time.

In another example, the touch screen controller 20 may normally operate in the touch sensing mode, and may be switched to the display mode when image data is received from the outside.

Specifically, the touch screen controller 20 may control the touch sensor 40 to sense a user's touch when image data is not received from the outside. Also, the touch screen controller 20 may control the display driver 30 to display an image corresponding to the received image data on the touch screen 100 when image data is received from the outside. The touch screen controller 20 may control the touch sensor 40 to sense a user's touch again when the reception of the image data from the outside is interrupted.

As a result, the touch screen 100 may basically sense a touch input of a user, and the touch screen 100 may change the displayed image when the image displayed on the touch screen 100 needs to be changed.

As described above, it can be seen that the touch screen controller 20 controls overall operations of the touch screen panel 10 and the operation of the touch screen panel 10 is performed by a control operation of the touch screen controller 20.

Hereinafter, an operation of the touch screen panel 10 in the display mode will be described.

FIGS. 8 to 10 illustrate an example of a display operation of a touch screen panel according to one embodiment.

As described above, the touch screen panel 10 may provide the scan signal to some pixels of the plurality of pixels (pix11 to pix33) included in the touch screen 100 through the display driver 30, and transfer image data to the pixels to which the scan signal is provided.

Specifically, the touch screen panel 10 may transfer the image data to each pixel positioned on the same horizontal line. In other words, the touch screen panel 10 may transfer the image data to pixels positioned on the same horizontal line among the plurality of pixels (pix11 to pix33) included in the touch screen 100, and then transfer the image data to pixels positioned on another horizontal line.

For example, the touch screen panel 10 may transfer the image data to the pixels (pix11, pix12, and pix13) positioned on the first horizontal line among the plurality of pixels (pix11 to pix33). In this case, the touch screen panel 10 may transfer the scan signal to the first horizontal line 121a of the first transparent electrode 121 for a predetermined time.

Specifically as illustrated in FIG. 8, the display driver 30 of the touch screen panel 10 may apply a negative second voltage $-V_2$ to the first horizontal line 121a during a first scan time $T_0$-$T_1$.

Also, the touch screen panel 10 may provide the image data to the plurality of vertical lines 122a, 122b, and 122c included in the second transparent electrode 122 during the first scan time $T_0$-$T_1$.

Specifically, as illustrated in FIG. 8, the display driver 30 of the touch screen panel 10 may apply a positive first voltage $+V_1$ to the first vertical line 122a, a zero voltage 0V to the second vertical line 122b, and the positive first voltage $+V_1$ to the third vertical line 122c during the first scan time $T_0$-$T_1$.

As a result, a voltage obtained by adding the first voltage $V_1$ and the second voltage $V_2$ is applied to the 1-1 pixel (pix11) and the 1-3 pixel (pix13), and the second voltage $V_2$ is applied to the 1-2 pixel (pix12).

Also, the 1-1 pixel (pix11) and the 1-3 pixel (pix13) show different optical properties from those of the 1-2 pixel (pix12). For example, the 1-1 pixel (pix11) and the 1-3 pixel (pix13) may transmit light, and the 1-2 pixel (pix12) may reflect the light.

Next, the touch screen panel 10 may transfer the image data to the pixels (pix21, pix22, and pix23) positioned on the second horizontal line among the plurality of pixels (pix11 to pix33). In this case, the touch screen panel 10 may transfer the scan signal to the second horizontal line 121b of the first transparent electrode 121 for a predetermined time.

Specifically, as illustrated in FIG. 9, the display driver 30 of the touch screen panel 10 may apply the negative second voltage $-V_2$ to the second horizontal line 121b during a second scan time $T_1$-$T_2$.

Also, the touch screen panel 10 may provide the image data to the plurality of vertical lines 122a, 122b, and 122c included in the second transparent electrode 122 during the second scan time $T_1$-$T_2$.

Specifically, as illustrated in FIG. 9, the display driver 30 of the touch screen panel 10 may apply the zero voltage 0V to the first vertical line 122a, the positive first voltage $+V_1$ to the second vertical line 122b, and the zero voltage 0V to the third vertical line 122c during the second scan time $T_1$-$T_2$.

As a result, the second voltage $V_2$ is applied to the 2-1 pixel (pix21) and the 2-3 pixel (pix23), and the voltage obtained by adding the first voltage $V_1$ and the second voltage $V_2$ is applied to the 2-2 pixel (pix22).

Also, the 2-1 pixel (pix21) and the 2-3 pixel (pix23) show different optical properties from those of the 1-2 pixel (pix12). For example, the 2-1 pixel (pix21) and the 2-3 pixel (pix23) may reflect light, and the 2-2 pixel (pix22) may transmit the light.

Next, the touch screen panel 10 may transfer the image data to the pixels (pix31, pix32, and pix33) positioned on the third horizontal line among the plurality of pixels (pix11 to pix33). In this case, the touch screen panel 10 may transfer the scan signal to the third horizontal line 121c of the first transparent electrode 121 for a predetermined time.

Specifically, as illustrated in FIG. 10, the display driver 30 of the touch screen panel 10 may apply the negative second voltage $-V_2$ to the third horizontal line 121c during a third scan time $T_2$-$T_3$.

Also, the touch screen panel 10 may provide the image data to the plurality of vertical lines 122a, 122b, and 122c included in the second transparent electrode 122 during the third scan time $T_2$-$T_3$.

Specifically, as illustrated in FIG. 10, the display driver 30 of the touch screen panel 10 may apply the positive first voltage $+V_1$ to the first vertical line 122a and the zero voltage 0V to the second vertical line 122b and the third vertical line 122c during the third scan time $T_2$-$T_3$.

As a result, the voltage obtained by adding the first voltage $V_1$ and the second voltage $V_2$ is applied to the 3-1 pixel (pix31), and the second voltage $V_2$ is applied to the 3-2 pixel (pix32) and the 3-3 pixel (pix33).

Also, the 3-1 pixel (pix31) exhibits different optical properties from those of the 3-2 pixel (pix32) and the 3-3 pixel (pix33). For example, the 3-1 pixel (pix31) may transmit light, and the 2-2 pixel (pix22) and the 2-3 pixel (pix23) may reflect the light.

The touch screen 100 may finally display an image as illustrated in FIG. 10 by the above-described operation of the touch screen panel 10.

As described above, in the display mode, the touch screen panel 10 displays the image by adjusting the voltages applied to the plurality of pixels (pix11 to pix33) included in the touch screen 100.

Hereinafter, an operation of the touch screen panel 10 in the touch sensing mode will be described.

In the touch sensing mode, the touch screen panel 10 may sense a user's touch by sensing a pressure generated when the user touches the touch screen 100 or a change of a capacitance generated when the user touches the touch screen 100.

First, a method by which the touch screen panel 10 senses a user's touch by sensing a pressure generated when the user touches the touch screen 100 will be described.

FIGS. 11 and 12 illustrate an example of a touch sensing operation of a touch screen panel according to one embodiment.

As described above, the transparent substrates 111 and 112 may be formed with tempered glass or a transparent film.

When a transparent film is applied to the transparent substrates 111 and 112 of the touch screen 100, the touch screen 100 has flexibility due to the transparent film. In other words, the touch screen 100 may be bent or deformed by an external force.

Specifically, when a part of a body of a user U touches the touch screen 100, the second transparent substrate 112 is bent and the second transparent electrode 122 and the first transparent electrode 121 come into contact with each other as illustrated in FIG. 11 by a pressure which is applied to the touch screen 100 by the user U.

The touch screen panel 10 may sense the touch of the user U on the touch screen 100 through such a phenomenon.

The touch screen panel 10 may provide a sensing signal to the touch screen 100 and receive a response signal from the touch screen 100 in response to the user's touch. The touch screen panel 10 may calculate coordinates of a position of the touch screen 180 that is touched by the user by analyzing the received response signal.

Specifically, the touch screen panel 10 may sequentially transfer the sensing signal to the plurality of vertical lines 122a, 122b, and 122c included in the second transparent electrode 122 and receive response signals from the plurality of horizontal lines 121a, 121b, and 121c included in the first transparent electrode 121.

For example, as illustrated in FIG. 12, the touch screen panel 10 may transfer the sensing signal to the first vertical line 122a during a first sensing time $T_0$-$T_1$. Specifically, the touch screen panel 10 may apply a third voltage $V_3$ to the first vertical line 122a during the first sensing time $T_0$-$T_1$.

Also, the touch screen panel 10 detects voltages of the plurality of horizontal lines 121a, 121b, and 121c included in the first transparent electrode 121 during the first sensing time $T_0$-$T_1$.

As illustrated in FIG. 12, since a position corresponding to the first vertical line 122a is not touched by the user U, the plurality of horizontal lines 121a, 121b, and 121c included in the first transparent electrode 121 do not output the response signals during the first sensing time $T_0$-$T_1$. In other words, the plurality of horizontal lines 121a, 121b, and 121c included in the first transparent electrode 121 output the zero voltage 0V.

As described above, when no response signal is detected, the touch screen panel 10 may determine that the user has not touched the position corresponding to the first vertical line 122a.

Next, as illustrated in FIG. 12, the touch screen panel 10 may transfer the sensing signal to the second vertical line 122b during a second sensing time $T_1$-$T_2$. Specifically, the touch screen panel 10 may apply the third voltage $V_3$ to the second vertical line 122b during the second sensing time $T_1$-$T_2$.

Also, the touch screen panel 10 detects the voltages of the plurality of horizontal lines 121a, 121b, and 121c included in the first transparent electrode 121 during the second sensing time $T_1$-$T_2$.

As illustrated in FIG. 12, since the position corresponding to the first vertical line 122a is touched by the user U, the first horizontal line 121a outputs the response signal, and the second horizontal line 121b and the third horizontal line 121c do not output the response signals during the second sensing time $T_1$-$T_2$. In other words, the second vertical line 122b and the first horizontal line 121a come into contact with each other, and thus the first horizontal line 121a outputs the third voltage $V_3$ and the second horizontal line 121b and the third horizontal line 121c output the zero voltage 0V.

As described above, when the response signal is detected, the touch screen panel 10 may determine that the user U touches a position at which the second vertical line 122b intersects the first horizontal line 121a.

Next, as illustrated in FIG. 12, the touch screen panel 10 may transfer the sensing signal to the third vertical line 122c during a third sensing time $T_2$-$T_3$. Specifically, the touch screen panel 10 may apply the third voltage $V_3$ to the third vertical line 122c during the third sensing time $T_2$-$T_3$.

Also, the touch screen panel 10 detects the voltages of the plurality of horizontal lines 121a, 121b, and 121c included in the first transparent electrode 121 during the third sensing time $T_2$-$T_3$.

As illustrated in FIG. 12, since a position corresponding to the third vertical line 122c is not touched by the user U, the plurality of horizontal lines 121a, 121b, and 121c included in the first transparent electrode 121 do not output the response signals during the third sensing time $T_2$-$T_3$. In other words, the plurality of horizontal lines 121a, 121b, and 121c included in the first transparent electrode 121 output the zero voltage 0V.

As described above, when no response signal is detected, the touch screen panel 10 may determine that the user does not touch the position corresponding to the third vertical line 122c.

As described above, the touch screen panel 10 may detect a position of a user's touch using pressure which is applied to the touch screen 100 by the user's touch.

Next, a method by which the touch screen panel 10 senses a user's touch by sensing a change of capacitance generated when the user touches the touch screen 100 will be described.

FIGS. 13 and 14 illustrate another example of the touch sensing operation of the touch screen panel according to one embodiment.

When a potential difference is generated between the first transparent electrode 111 and the second transparent electrode 112, an electric field is generated from a transparent electrode having a high electric potential to a transparent electrode having a low electric potential. For example, when an electric potential of the second transparent electrode 112 is higher than an electric potential of the first transparent electrode 111, an electric field from the second transparent electrode 112 toward the first transparent electrode 111 is generated as illustrated in FIG. 13.

That is, a capacitance exists between the first transparent electrode 111 and the second transparent electrode 112. The first transparent electrode 111 is affected by a signal passing through the second transparent electrode 112 due to the capacitance between the first transparent electrode 111 and the second transparent electrode 112.

Also, a human body may have a large electrical resistance but flow a small current. Also, in the human body, electric charges may be induced by an external electric field.

Therefore, when the user U touches the touch screen 100 through a part of his or her body or when the part of the body of the user U is positioned in the vicinity of the touch screen 100, the electric field between the first transparent electrode 111 and the second transparent electrode 112 is changed as illustrated in FIG. 13.

As described above, when the electric potential of the second transparent electrode 112 is higher than the electric potential of the first transparent electrode 111, the electric field from the second transparent electrode 112 toward the first transparent electrode 111 is generated. However, when the user U touches the touch screen 100 through the part of his or her body or when the part of the body of the user U is positioned in the vicinity of the touch screen 100, a part of the electric field is directed from the second transparent electrode 112 to the part of the body of the user U.

In other words, the capacitance between the first transparent electrode 111 and the second transparent electrode 112 is changed.

The touch screen panel 10 may sense the touch of the user U on the touch screen 100 through the change of the capacitance.

The touch screen panel 10 may provide a sensing signal to the touch screen 100 and receive a response signal from the touch screen 100 in response to the user's touch. The touch screen panel 10 may calculate coordinates of a position of the touch screen 180 that is touched by the user by analyzing the received response signal.

Specifically, the touch screen panel 10 may sequentially transfer the sensing signal to the plurality of vertical lines 122a, 122b, and 122c included in the second transparent electrode 122 and receive response signals from the plurality of horizontal lines 121a, 121b, and 121c included in the first transparent electrode 121.

For example, as illustrated in FIG. 14, the touch screen panel 10 may transfer the sensing signal to the first vertical line 122a during a first sensing time $T_0$-$T_1$. Specifically, the touch screen panel 10 may apply a fourth alternating current (AC) signal $V_4$ having a predetermined frequency and a predetermined amplitude to the first vertical line 122a during the first sensing time $T_0$-$T_1$.

Also, the touch screen panel 10 detects the response signals of the plurality of horizontal lines 121a, 121b, and 121c included in the first transparent electrode 121 during the first sensing time $T_0$-$T_1$.

The fourth AC signal $V_4$ applied to the first vertical line 122a is transferred to the first horizontal line 121a, the second horizontal line 121b, and the third horizontal line 121c due to the capacitance between the first vertical line 122a and the first transparent electrode 121.

Also, as illustrated in FIG. 14, since the user does not touch a position corresponding to the first vertical line 122a, the first horizontal line 121a, the second horizontal line 121b, and the third horizontal line 121c output a fifth AC signal $V_5$. In this case, the fifth AC signal $V_5$ may become a reference response signal which is output when the user does not touch.

As described above, when the reference response signal is detected from the plurality of horizontal lines 121a, 121b, and 121c included in the first transparent electrode 121 during the first sensing time $T_0$-$T_1$, the touch screen panel 10 may determine that the user does not touch a position corresponding to the first vertical line 122a.

Next, as illustrated in FIG. 14, the touch screen panel 10 may transfer the sensing signal to the second vertical line 122b during a second sensing time $T_1$-$T_2$. Specifically, the touch screen panel 10 may apply the fourth AC signal $V_4$ to the second vertical line 122b during the second sensing time $T_1$-$T_2$.

Also, the touch screen panel 10 detects signals of the plurality of horizontal lines 121a, 121b, and 121c included in the first transparent electrode 121 during the second sensing time $T_1$-$T_2$.

The fourth AC signal $V_4$ applied to the second vertical line 122b is transferred to the first horizontal line 121a, the second horizontal line 121b, and the third horizontal line 121c due to the capacitance between the second vertical line 122b and the first transparent electrode 121.

In this case, as illustrated in FIG. 14, since the user U touches a position at which the second vertical line 122b intersects the first horizontal line 121a, the capacitance between the second vertical line 122b and the first horizontal line 121a is changed.

As a result, while the second horizontal line 121b and the third horizontal line 121c output the fifth AC signal $V_5$, the first horizontal line 121a outputs a sixth AC signal $V_6$ having a different phase and amplitude from those of the fifth AC signal $V_5$.

As described above, when a signal (the sixth AC signal) different from the reference response signal (the fifth AC signal) is detected from the first horizontal line 121a during the second sensing time $T_1$-$T_2$, the touch screen panel 10 may determine that the user touches the position at which the second vertical line 122b intersects the first horizontal line 121a.

Next, as illustrated in FIG. 14, the touch screen panel 10 may transfer the sensing signal to the third vertical line 122c during a third sensing time $T_2$-$T_3$. Specifically, the touch screen panel 10 may apply the fourth AC signal $V_4$ to the third vertical line 122c during the third sensing time $T_2$-$T_3$.

Also, the touch screen panel 10 detects the response signals of the plurality of horizontal lines 121a, 121b, and 121c included in the first transparent electrode 121 during the third sensing time $T_2$-$T_3$.

The fourth AC signal $V_4$ applied to the third vertical line 122c is transferred to the first horizontal line 121a, the second horizontal line 121b, and the third horizontal line 121c due to the capacitance between the third vertical line 122c and the first transparent electrode 121.

Also, as illustrated in FIG. 14, since the user does not touch the position corresponding to the third vertical line 122c, the first horizontal line 121a, the second horizontal line 121b, and the third horizontal line 121c output the fifth AC signal $V_5$.

As described above, when the reference response signal is detected from the plurality of horizontal lines 121a, 121b, and 121c included in the first transparent electrode 121 during the third sensing time $T_2$-$T_3$, the touch screen panel 10 may determine that the user does not touch the position corresponding to the third vertical line 122c.

As described above, the touch screen panel 10 may detect a position of a user's touch through the change of capacitance between the first transparent electrode 121 and the second transparent electrode 122 due to the user's touch.

The configuration and operation of the touch screen panel 10 according to one embodiment have been described above.

In the touch screen 100 included in the touch screen panel 10 according to one embodiment, a display layer for displaying an image and a touch sensing layer for sensing a user's touch are integrated. That is, the touch screen 100 may perform both a display of an image and touch sensing through one layer.

Hereinafter, other examples of the touch screen that may be included in the touch screen panel 10 according to one embodiment, that is, a transmissive touch screen and a reflective touch screen, will be described.

First, a transmissive touch screen and a touch screen panel including the transmissive touch screen will be described.

FIG. 15 is a cross section of an example of a transmissive touch screen included in a touch screen panel according to one embodiment, and FIG. 16 illustrates an orientation film included in the transmissive touch screen illustrated in FIG. 15.

Referring to FIGS. 15 and 16, a transmissive touch screen 200 may include polarizing filters 261 and 262, transparent substrates 211 and 212, color filters 250, transparent electrodes 221 and 222, orientation films 231 and 232, a liquid crystal layer 240, and a back light BL.

The transparent substrates 211 and 212 form an exterior of the transmissive touch screen 200, and include a first transparent substrate 211 and a second transparent substrate 212.

The first transparent substrate 211 and the second transparent substrate 212, which are portions on which a user's direct touch is performed, are exposed to the outside, form an external shape of the transmissive touch screen 200, and protect internal components of the transmissive touch screen 200.

The first transparent substrate 211 and the second transparent substrate 212 may be formed with tempered glass or a transparent film.

The polarizing filters 261 and 262 are respectively provided outside the transparent substrates 211 and 212.

Light is formed of a pair of an electric field and a magnetic field which vibrate in a direction perpendicular to a traveling direction thereof. In this case, the electric field and the magnetic field may vibrate in an arbitrary direction perpendicular to the traveling direction of the light. In other words, the electric field and the magnetic field may vibrate in any direction perpendicular to the traveling direction of the light. Also, the pair of the electric field and the magnetic field vibrate in directions that are perpendicular to each other.

As described above, a filter that transmits only an electric field and a magnetic field which vibrate in a predetermined polarization direction among electric fields and magnetic fields which vibrate in arbitrary directions perpendicular to the traveling direction of the light and blocks an electric field and a magnetic field which vibrate in another polarization direction is referred to as a polarization filter.

In other words, light which pass through the polarizing filters 261 and 262 includes only the electric field and the magnetic field which vibrate in the predetermined polarization direction.

Also, the polarizing filters 261 and 262 may include a first polarizing filter 261 attached to the first transparent substrate 211 and a second polarizing filter 262 attached to the second transparent substrate 212. Here, a polarization direction of the first polarizing filter 261 and a polarization direction of the second transparent substrate 212 may be perpendicular to each other.

As a result, all light transmitted through the first polarizing filter 261 may be blocked by the second polarizing filter 262.

The color filters 250 are provided on inner sides of the transparent substrates 211 and 212.

The color filters 250 may include a blue filter 250b which transmits blue light, a green filter 250g which transmits green light, and a red filter 250r which transmits red light.

Also, the blue filter 250b, the green filter 250g and the red filter 250r may be positioned on the same plane as illustrated in FIG. 15.

Also, regions corresponding to the blue filter 250b, the green filter 250g, and the red filter 250r respectively form a blue pixel B-pixel, a green pixel G-pixel, and a red pixel R-pixel, and a region including each of the blue pixel B-pixel, the green pixel G-pixel, and the red pixel R-pixel forms a single pixel which outputs light of various colors.

The transparent electrodes 221 and 222 are respectively provided on the inner sides of the transparent substrates 211 and 212. Also, the transparent electrodes 221 and 222 may be provided on an inner side of the color filters 250.

The transparent electrodes 221 and 222 are formed of a conductive metal material and generate an electric field for changing an arrangement of liquid crystal molecules constituting the liquid crystal layer 240 to be described below.

Also, the transparent electrodes 221 and 222 may be formed of a transparent material, and may transmit light incident from the outside.

The transparent electrodes 221 and 222 include a first transparent electrode 221 attached to the first transparent substrate 211 and a second transparent electrode 222 attached to the color filters 250.

Also, the first transparent electrode 221 may be formed on the first transparent substrate 211 in a specific pattern, and the second transparent electrode 222 may be formed in on the color filters 250 in a specific pattern. For example, the first transparent electrode 221 and second transparent electrode 222 may be in the form of a plurality of lines perpendicularly intersecting each other.

Also, the second transparent electrode 222 may include a first vertical line 222b, a second vertical line 222g, and a third vertical line 222r, which respectively correspond to the blue filter 250b, the green filter 250g, and the red filter 250r, as illustrated in FIG. 15.

The first transparent electrode 121 and the second transparent electrode 122 may be formed of ITO, IZO, an Ag nanowire, a CNT, graphene, PEDOT, or the like.

The orientation films 231 and 232 and the liquid crystal layer 240 may be provided at inner sides of the transparent electrodes 221 and 222. A liquid crystal, which is a material in an intermediate state between a crystal and a liquid, exhibits optical properties according to a change of voltage or a change of temperature. For example, a direction of arrangement of molecules constituting the liquid crystal is changed according to a change of voltage.

Also, the liquid crystal may be divided into a nematic liquid crystal, a smectic liquid crystal, and a cholesteric liquid crystal according to directionality thereof, and the nematic liquid crystal is widely used for the transmissive touch screen 200. However, the liquid crystal included in the liquid crystal layer 240 of the transmissive touch screen 200 is not limited to the nematic liquid crystal.

Also, as described above, when there is no electric field, the nematic liquid crystal is aligned in a direction of a fine groove formed in a surface in contact with the liquid crystal, and when an electric field is generated, the nematic liquid crystal is aligned in a direction of the electric field.

The orientation films 231 and 232 are provided outside the liquid crystal layer 240 in order to align liquid crystal molecules 241 included in the liquid crystal layer 240 in a predetermined direction.

The orientation films 231 and 232 include a first orientation film 231 attached to the first transparent electrode 221 and a second orientation film 232 attached to the second transparent electrode 222. Also, fine grooves 231a and 232a for aligning the liquid crystal molecules 241 in the predetermined direction are respectively formed on inner surfaces of the first orientation film 231 and the second orientation film 232.

For example, the fine groove 231a of the first orientation film 231 and the fine groove 232a of the second orientation film 232 may be formed in directions perpendicular to each other. Specifically, the fine groove 231a of the first orientation film 231 may be formed in an x-axis direction and the fine groove 232a of the second orientation film 232 may be formed in a y-axis direction as illustrated in FIG. 16.

The liquid crystal molecules 241 close to the first orientation film 231 are aligned in the x-axis direction by the fine groove 231a of the first orientation film 231, and the liquid crystal molecules 241 close to the second orientation film 232 are aligned in the y-axis direction by the fine groove 232a of the second orientation film 232.

Also, an alignment direction the liquid crystal molecules 241 in the liquid crystal layer 240 is changed from the x-axis direction of the first orientation film 231 to the y-axis direction of the second orientation film 232. As a result, the liquid crystal molecules 241 in the liquid crystal layer 240 are disposed in a spiral shape.

The back light BL emits light for generating an image. In other words, the back light BL becomes a light source of an image displayed by the transmissive touch screen 200.

According to image data provided to the transparent electrodes 221 and 222, light output from the back light BL may be transmitted through the polarizing filters 261 and 262, the transparent substrates 211 and 212, the color filters 250, the transparent electrodes 221 and 222, the orientation films 231 and 232, and the liquid crystal layer 240, or may be blocked by the polarizing filters 261 and 262.

As described above, the touch screen panel 10 according to one embodiment may include the transmissive touch screen 200.

Hereinafter, an operation of the transmissive touch screen 200 will be described.

FIGS. 17A and 17B illustrate an example of a display operation of the transmissive touch screen illustrated in FIG. 15.

As described above, the transmissive touch screen 200 may display an image through an operation of each pixel included in the transmissive touch screen 100. In other words, the transmissive touch screen 200 displays a single image by collecting pixels which output light of various colors.

A display operation of any one pixel included in the transmissive touch screen 200 will be described with reference to FIGS. 17A and 17B.

The polarizing films 261 and 262 may be positioned at both sides of the liquid crystal layer 240, and a polarization direction of the first polarizing film 261 and a polarization direction of the second polarizing film 262 may be perpendicular to each other.

For example, as illustrated in FIG. 17A, the first polarizing film 261 positioned at a lower side of the liquid crystal layer 240 may polarize light in an x-axis direction, and the second polarizing film 262 positioned at an upper side of the liquid crystal layer 240 may polarize light in a y-axis direction.

When a voltage is not applied between the first transparent electrode 221 and the second transparent electrode 222, the liquid crystal molecules 241 are aligned in a direction of the fine grooves formed in the orientation films 231 and 232.

For example, as illustrated in FIG. 17A, the liquid crystal molecules 241 positioned at the lower side of the liquid crystal layer 240 may be aligned in the x-axis direction, and the liquid crystal molecules 241 positioned at the upper side of the liquid crystal layer 240 may be aligned in the y-axis direction.

In this case, light emitted from the back light BL is polarized by the first polarizing film 261 in the x-axis direction.

When the voltage is not applied between the first transparent electrode 221 and the second transparent electrode 222, a polarization direction of the light polarized in the x-axis direction is changed to the y-axis direction by the liquid crystal molecules 241 which are aligned in a spiral shape. As a result, the light passing through the liquid crystal layer 240 is polarized in the y-axis direction.

The light polarized in the y-axis direction may be transmitted through the second polarizing film 262 whose polarization direction is the y-axis direction.

As described above, when the voltage is not applied between the first transparent electrode 221 and the second transparent electrode 222 that form one pixel, the corresponding pixel outputs light.

When the voltage is applied between the first transparent electrode 221 and the second transparent electrode 222, the liquid crystal molecules 241 of the liquid crystal layer 240 are aligned in a direction perpendicular to the first and second polarizing films 261 and 262 according to an electric field caused by the voltage as illustrated in FIG. 17B.

In this case, the light emitted from the back light BL is polarized by the first polarizing film 261 in the x-axis direction.

When the voltage is applied between the first transparent electrode 221 and the second transparent electrode 222, the light polarized by the first polarizing film 261 in the x-axis direction propagates toward the second polarizing film 262 without changing polarization direction.

The light polarized in the x-axis direction may not be transmitted through the second polarizing film 262 whose polarization direction is the y-axis direction.

As described above, when the voltage is applied between the first transparent electrode 221 and the second transparent electrode 222 which form one pixel, the corresponding pixel does not output light.

The configuration and operation of the transmissive touch screen 200 have been described above.

Hereinafter, the touch screen panel 10 including the transmissive touch screen 200 will be described.

The touch screen panel 10 may include the transmissive touch screen 200, the display driver 30, the touch sensor 40, and the touch screen controller 20 as illustrated in FIG. 7.

Since the operations of the display driver 30, the touch sensor 40, and the touch screen controller 20 are the same as those described above, descriptions thereof will be omitted.

FIGS. 18 and 19 illustrate an example of a display operation of the touch screen panel including the transmissive touch screen illustrated in FIG. 15.

As described above, the blue pixel (B-pix), the green pixel (G-pix), and the red pixel (R-pix) may be disposed in parallel so that one pixel included in the transmissive touch screen 200 outputs various colors.

An operation of the touch screen panel 10 including the transmissive touch screen 200 will be described with reference to FIGS. 18 and 19 which illustrate one pixel which outputs light of various colors.

As described above, the touch screen panel 10 may select pixels positioned on the same horizontal line among the plurality of pixels included in the transmissive touch screen 200 and transfer image data to the selected pixels. Then, the touch screen panel 10 may select pixels positioned on another horizontal line and transfer the image data to the selected pixels.

The image data includes color data to be output by each pixel. Specifically, the image data may include blue data, green data, and red data.

For example, when a first horizontal line 221-1 of the first transparent electrode 221 is selected, the touch screen panel 10 transfers a scan signal to the first horizontal line 221-1. Specifically, as illustrated in FIG. 18, the touch screen panel 10 may apply the negative second voltage $-V_2$ to the first horizontal line 221-1 during a first scan time $T_0$-$T_1$.

Also, the touch screen panel 10 may provide the image data to the plurality of vertical lines 222b, 222g, and 222r included in the second transparent electrode 222 during the first scan time $T_0$-$T_1$. Specifically, as illustrated in FIG. 18, the display driver 30 of the touch screen panel 10 may apply the zero voltage 0V to the first vertical line 222b and the second vertical line 222g and the positive first voltage $+V_1$ to the third vertical line 222r during the first scan time $T_0$-$T_1$.

As a result, the second voltage $V_2$ is applied to the blue pixel (B-pix) and the green pixel (G-pix), and a voltage obtained by adding the first voltage $V_1$ and the second voltage $V_2$ is applied to the red pixel (R-pix.

Also, the blue pixel (B-pix) and the green pixel (G-pix) exhibit different optical properties from those of the red pixel (R-pix). Specifically, the blue pixel (B-pix) and the green pixel (G-pix) transmit the light of the back light BL, and the red pixel (R-pix) blocks the light of the back light BL.

By such an operation, the pixels of the touch screen panel 10 illustrated in FIG. 18 may output cyan, which is a mixture of green and blue.

Then, when a frame is switched and the first horizontal line 221-1 of the first transparent electrode 221 is selected again, the touch screen panel 10 transfers the scan signal to the first horizontal line 221-1 again. Specifically, as illustrated in FIG. 19, the touch screen panel 10 may apply a positive second voltage $+V_2$ to the first horizontal line 221-1 again during a second scan time $T_2$-$T_3$.

Also, the touch screen panel 10 may provide the image data to the plurality of vertical lines 222b, 222g, and 222r included in the second transparent electrode 222 during the second scan time $T_2$-$T_3$.

Specifically, as illustrated in FIG. 19, the display driver 30 of the touch screen panel 10 may apply a negative first voltage $-V_1$ to the first vertical line 222b and the second vertical line 222g and the zero voltage 0V to the third vertical line 222r during the second scan time $T_2$-$T_3$.

As a result, the voltage obtained by adding the first voltage $V_1$ and the second voltage $V_2$ is applied to the blue pixel (B-pix) and the green pixel (G-pix) and the second voltage $V_2$ is applied to the red pixel (R-pix).

Also, the blue pixel (B-pix) and the green pixel (G-pix) exhibit different optical properties from those of the red pixel (R-pix). Specifically, the blue pixel (B-pix) and the green pixel (G-pix) block the light of the back light BL, and the red pixel (R-pix) transmits the light of the back light BL.

By such an operation, the pixels of the touch screen panel 10 illustrated in FIG. 19 may output red.

As described above, the plurality of pixels which output various colors may be combined, and thus the touch screen panel 10 may output an image.

The display operation of the touch screen panel 10 including the transmissive touch screen 200 has been described above.

Since a touch sensing operation of the touch screen panel 10 including the transmissive touch screen 200 is the same as the above-described operation of the touch screen panel 10 including the touch screen 100, a description thereof will be omitted.

Next, a reflective touch screen and a touch screen panel including the reflective touch screen will be described.

FIG. 20 is a cross-sectional view of an example of a reflective touch screen included in a touch screen panel according to one embodiment, and FIG. 21 illustrates liquid crystal molecules included in the reflective touch screen illustrated in FIG. 20. Also, FIG. 22 illustrates optical properties of a liquid crystal included in the reflective touch screen illustrated in FIG. 20.

Referring to FIGS. 20 to 22A, 22B, 22C, a reflective touch screen 300 includes a blue screen (B-screen) capable of reflecting blue light, a green screen (G-screen) capable of reflecting green light, a red screen (R-screen) capable of reflecting red light, and an optical absorption (OA) layer which absorbs light.

Also, the blue screen (B-screen) may include blue-screen transparent substrates 311b and 312b, blue-screen transparent electrodes 321b and 322b, and a blue-screen liquid crystal layer 340b, the green screen (G-screen) may include green-screen transparent substrates 3118 and 312g, green-screen transparent electrodes 321g and 322g, and a green-screen liquid crystal layer 340g, and the red screen (R-screen) may include red-screen transparent substrates 311r and 312r, red-screen transparent electrodes 321r and 322r, and a red-screen liquid crystal layer 340r.

Since each of the transparent substrates 311b, 312b, 311g, 312g, 311r, and 312r is the same as each of the transparent substrates 111 and 112 described above, a description thereof will be omitted.

Also, since each of the transparent electrodes 321b, 322b, 321g, 322g, 321r, and 322r are also the same as each of the transparent electrodes 121 and 122 described above, a description thereof will be omitted.

The blue-screen liquid crystal layer 340b, the green-screen liquid crystal layer 340g, and the red-screen liquid crystal layer 340r may reflect or transmit light according to voltages respectively applied to the blue-screen transparent electrodes 321b and 322b, the green-screen transparent electrodes 321g and 322g, and the red-screen transparent electrodes 321r and 322r.

For example, the reflective touch screen 300 outputs white light when all of the blue-screen liquid crystal layer 340b, the green-screen liquid crystal layer 340g, and the red-screen liquid crystal layer 340r reflect light, and the reflective touch screen 300 does not output light when all of the blue-screen liquid crystal layer 340b, the green-screen liquid crystal layer 340g, and the red-screen liquid crystal layer 340r transmit light.

Also, the reflective touch screen 300 outputs blue light when the blue-screen liquid crystal layer 340b reflects light and the green-screen liquid crystal layer 340g and red-screen liquid crystal layer 340r transmit light.

Also, the reflective touch screen 300 outputs green light when the green-screen liquid crystal layer 340g reflects light and the blue-screen liquid crystal layer 340b and red-screen liquid crystal layer 340r transmit light.

Also, the reflective touch screen 300 outputs red light when the red-screen liquid crystal layer 340r reflects light and the blue-screen liquid crystal layer 340b and green-screen liquid crystal layer 340g transmit light.

The reflective touch screen 300 may output light of various colors through reflecting and transmitting light of the liquid crystal layers 340b, 340g, and 340r.

Here, liquid crystals that constitute each of the liquid crystal layers 340b, 340g, and 340r, which are materials having an intermediate state between a crystal and a liquid, exhibit optical properties according to a change of voltage or a change of temperature. For example, a direction of arrangement of molecules constituting the liquid crystal is changed according to the change of voltage.

Also, the liquid crystals may be divided into a nematic liquid crystal, a smectic liquid crystal, and a cholesteric liquid crystal according to directionality thereof, and the cholesteric liquid crystal may be used for the reflective touch screen 300. However, the liquid crystal included in each of the liquid crystal layers 340b, 340g, and 340r of the reflective touch screen 300 is not limited to the cholesteric liquid crystal.

As described above, when there is no electric field, the cholesteric liquid crystals have a spiral structure as illustrated in FIG. 21, but when an electric field is applied to the cholesteric liquid crystals, the cholesteric liquid crystals are re-arranged in a direction of the electric field.

Specifically, when the cholesteric liquid crystal has a spiral structure as illustrated in FIG. 21, the cholesteric liquid crystal may reflect light having a specific wavelength.

Also, a wavelength of light reflected by the cholesteric liquid crystal is determined by a pitch of the cholesteric liquid crystal. Here, pitch refers to a distance in which liquid crystal molecules 341 are rotated in a direction from a specific direction toward a longitudinal direction and then returned to their original direction when the cholesteric liquid crystal has the spiral structure as illustrated in FIG. 21.

The blue-screen liquid crystal layer 340b, the green-screen liquid crystal layer 340g, and the red-screen liquid crystal layer 340r include cholesteric liquid crystals having different pitches, and thus may reflect light having different wavelengths.

Specifically, the blue-screen liquid crystal layer 340b includes a cholesteric liquid crystal capable of reflecting blue light, and the green-screen liquid crystal layer 340g includes a cholesteric liquid crystal capable of reflecting green light. Also, the red-screen liquid crystal layer 340r includes a cholesteric liquid crystal capable of reflecting red light.

Also, the cholesteric liquid crystals included in the blue-screen liquid crystal layer 340b, the green-screen liquid crystal layer 340g, and the red-screen liquid crystal layer 340r have a plurality of states according to a voltage applied thereto.

Figure 22A:
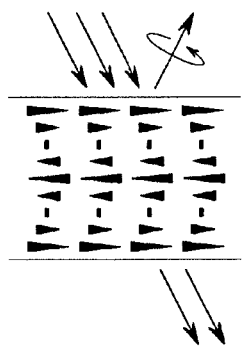
FIGS. 22A, 22B and 22C illustrate optical properties of a liquid crystal included in the reflective touch screen illustrated in FIG. 20.
Figure 22B:
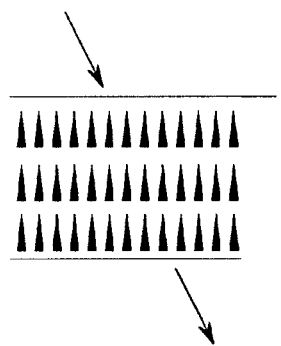
Figure 22C:
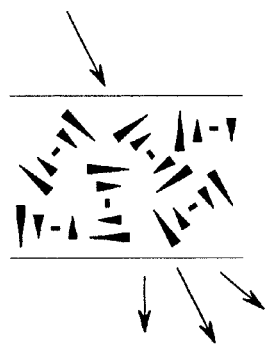

The states of the cholesteric liquid crystals include a planar state in which the cholesteric liquid crystals having a spiral structure are regularly arranged inside the liquid crystal layers 340b, 340g, and 340r as illustrated in FIG. 22A, a homeotropic state in which the cholesteric liquid crystals are linearly arranged inside the liquid crystal layers 340b, 340g, and 340r as illustrated in FIG. 22B, and a focal conic state in which cholesteric liquid crystals having a spiral structure are irregularly positioned inside the liquid crystal layers 340b, 340g, and 340r as illustrated in FIG. 22C.

The homeotropic state is an unstable state, and cholesteric liquid crystals in the homeotropic state transition to the planar state or the focal conic state when an external electric field is removed.

In such a homeotropic state, the cholesteric liquid crystals substantially transmit all incident light as illustrated in FIG. 22B. Specifically, a light transmittance of the cholesteric liquid crystal in the homeotropic state is about 90% or more.

When a voltage ranging from about 30V to about 40V is applied to both ends of each of the liquid crystal layers 340b, 340g, and 340r, the cholesteric liquid crystal transitions from the planar state or the focal conic state to the homeotropic state.

The planar state and focal conic state are stable, and the cholesteric liquid crystals in the planar state and the focal conic state maintain the planar state and focal conic state even when the external electric field is removed.

The cholesteric liquid crystal in the planar state reflects light having a specific wavelength as illustrated in FIG. 22A. Specifically, the cholesteric liquid crystal of the blue-screen liquid crystal layer 340b may reflect blue light, and the cholesteric liquid crystal of the green-screen liquid crystal layer 340g may reflect green light. Also, the cholesteric liquid crystal of the red-screen liquid crystal layer 340r may reflect red light.

Such a planar state may be transitioned to from the homeotropic state. Specifically, the cholesteric liquid crystal transitions from the homeotropic state to the planar state when a voltage ranging from about 30V to about 40V applied to both of the ends of each of the liquid crystal layers 340b, 340g, and 340r is removed.

A cholesteric liquid crystal in the focal conic state transmits most incident light as illustrated in FIG. 22C. Specifically, a light transmittance of the cholesteric liquid crystal in the focal conic state is about 70% or more.

Such a focal conic state may be transitioned to from the homeotropic state. Specifically, the cholesteric liquid crystal transitions from the homeotropic state to the focal conic state when a voltage ranging from about 30V to about 40V applied to both of the ends of each of the liquid crystal layers 340b, 340g, and 340r is lowered to a voltage ranging from about 10V to about 20V.

As described above, when the voltage ranging from about 10V to about 20V is removed, the cholesteric liquid crystal that has transitioned to the focal conic state does not transition to the planar state and maintains the focal conic state even.

As described above, the reflective touch screen 300 may output various images at low power through a property of reflecting a specific light and a property of maintaining a specific state.

Hereinafter, the touch screen panel 10 including the reflective touch screen 300 will be described.

The touch screen panel 10 may include the reflective touch screen 300, the display driver 30, the touch sensor 40, and the touch screen controller 20 as illustrated in FIG. 7.

Since operations of the display driver 30, the touch sensor 40, and the touch screen controller 20 are the same as those described above, descriptions thereof will be omitted.

FIGS. 23 and 24 illustrate an example of a display operation of the touch screen panel including the reflective touch screen illustrated in FIG. 20.

As described above, the blue screen (B-screen), the green screen (G-screen), and the red screen (R-screen) may be stacked so that one pixel included in the reflective touch screen 300 outputs various colors.

An operation of the touch screen panel 10 including the reflective touch screen 300 will be described with reference to FIGS. 23 and 24 which illustrate one pixel which outputs light of various colors.

As described above, the touch screen panel 10 may select pixels positioned on the same horizontal line among the plurality of pixels included in the reflective touch screen 300 and transfer image data to the selected pixels. Then, the touch screen panel 10 may select pixels positioned on another horizontal line and transfer the image data to the selected pixels.

The image data includes color data to be output by each pixel. Specifically, the image data may include blue data, green data, and red data.

For example, the touch screen panel 10 may transfer a reset signal to a first blue-screen horizontal line 321b-1, a first green-screen horizontal line 321g-1, and a first red-screen horizontal line 321r-1. Specifically, as illustrated in FIG. 23, the touch screen panel 10 may apply the negative second voltage $-V_2$ to the first blue-screen horizontal line 321b-1, the first green-screen horizontal line 321g-1, and the first red-screen horizontal line 321r-1 during a first scan time $T_0$-$T_1$.

Also, the touch screen panel 10 may transfer the reset signal to a first blue-screen vertical line 322b-1, a first green-screen vertical line 322g-1, and a first red-screen vertical line 322r-1. Specifically, as illustrated in FIG. 23, the touch screen panel 10 may apply the positive first voltage $+V_1$ to the first blue-screen vertical line 322b-1, the first green-screen vertical line 322g-1, and the first red-screen vertical line 322r-1 during the first scan time $T_0$-$T_1$.

As a result, a voltage $V_1+V_2$ obtained by adding the first voltage $V_1$ and the second voltage $V_2$ is applied to all of the blue screen B-screen, the green screen G-screen, and the red screen R-screen. Here, the voltage $V_1+V_2$ obtained by adding the first voltage $V_1$ and the second voltage $V_2$ may range from about 30V to about 40V.

Therefore, the blue-screen liquid crystal layer 340b, the green-screen liquid crystal layer 340g, and the red-screen liquid crystal layer 340r transition to the homeotropic state, and the touch screen 300 transmits all light.

Then, the touch screen panel 10 may transfer a scan signal to the first blue-screen horizontal line 321b-1, the first green-screen horizontal line 321g-1, and the first red-screen horizontal line 321r-1. Specifically, as illustrated in FIG. 24, the touch screen panel 10 may apply a negative fourth voltage $-V_4$ to the first blue-screen horizontal line 321b-1, the first green-screen horizontal line 321g-1, and the first red-screen horizontal line 321r-1 during a second scan time $T_1$-$T_2$.

Also, the touch screen panel 10 may transfer image data to the first blue-screen vertical line 322b-1, the first green-screen vertical line 322g-1, and the first red-screen vertical line 322r-1. Specifically, as illustrated in FIG. 24, the touch screen panel 10 may apply the zero voltage 0V to the first blue-screen vertical line 322b-1 and the first red-screen vertical line 322r-1 and apply a positive third voltage +$V_3$ to the first green-screen vertical line 322g-1 during the second scan time $T_1$-$T_2$.

As a result, the fourth voltage $V_4$ is applied to the blue screen B-screen and the red screen R-screen, and a voltage $V_3$+$V_4$ obtained by adding the third voltage $V_3$ and the fourth voltage $V_4$ is applied to the green screen G-screen. Here, the voltage $V_3$+$V_4$ obtained by adding the third voltage $V_3$ and the fourth voltage $V_4$ may range from about 10V to about 20V.

Therefore, the blue-screen liquid crystal layer 340b and the red-screen liquid crystal layer 340r transition to the planar state, and thus the blue screen B-screen reflects blue light and the red screen R-screen reflects red light. Also, the green-screen liquid crystal layer 340g transitions to the focal conic state, and thus the green screen G-screen transmits light.

By such an operation, the pixels of the touch screen panel 10 may output magenta, which is a mixture of blue and red.

As described above, a plurality of pixels which output various colors may be combined, and thus the touch screen panel 10 may output an image.

The display operation of the touch screen panel 10 including the reflective touch screen 300 has been described above.

When the touch screen panel 10 including the reflective touch screen 300 inputs image data to the reflective touch screen 300, the reflective touch screen 300 displays an image corresponding to the input image data and maintains the displayed image even when power is turned off. In other words, the reflective touch screen 300 including the cholesteric liquid crystal may maintain the displayed image for a long time.

Since a touch sensing operation of the touch screen panel 10 including the reflective touch screen 300 is the same as the operation of the touch screen panel 10 including the touch screen 100 described above, a description thereof will be omitted.

However, the touch screen panel 10 including the reflective touch screen 300 may transfer a sensing signal to the blue screen B-screen positioned at an uppermost layer of the reflective touch screen 300 and detect a response signal of the blue screen B-screen.

The touch screen panels 10 including the touch screens 100, 200, and 300 have been described above.

Hereinafter, various devices including the touch screen panel 10 will be described.

FIG. 25 illustrates an exterior of an electronic notebook according to one embodiment, and FIG. 26 illustrates a configuration of the electronic notebook according to one embodiment.

As illustrated in FIGS. 25 and 26, an electronic notebook 400 may include an electronic paper bundle 420 capable of displaying an image and receiving a touch input and a main body 410 for driving the electronic paper bundle 420.

The electronic paper bundle 420 may include a plurality of electronic papers 420a to 420d, and each of the electronic papers 420a to 420d may include any of the touch screens 100, 200, and 300 described above. Specifically, each of the electronic papers 420a to 420d may include the reflective touch screen 300 capable of displaying an image and storing the displayed image.

When each of the electronic papers 420a to 420d includes the reflective touch screen 300, each of the electronic papers 420a to 420d may detect handwriting of a user and display an image corresponding to the detected handwriting.

Since the reflective touch screen 300 may continuously display an image without supplying additional power after the user completes a touch input and reflect incident light without directly outputting light, the reflective touch screen 300 may display an image with little power.

The main body 410 may electrically drive the electronic paper bundle 420 and physically protect the electronic paper bundle 420.

Also, the main body 410 includes an electronic paper driving circuit 413 for driving the electronic paper bundle 420, a communication unit 415 for communicating with an external device, such as a personal computer PC, a mobile terminal MT, and the like, and a main controller 411 for controlling overall operations of the electronic notebook 400.

The electronic paper driving circuit 413 may transfer image data received from the main controller 411 to the electronic papers 420a to 420d and transfer the touch input of the user received from the electronic papers 420a to 420d to the main controller 411.

Specifically, the electronic paper driving circuit 413 may drive the electronic papers 420a to 420d so that the electronic papers 420a to 420d display an image corresponding to the image data and receive a touch input of the user.

Such an electronic paper driving circuit 413 may include the display driver 30 (see FIG. 7) the touch sensor 40 (see FIG. 7), and the touch screen controller 20 (see FIG. 7), which are included in the touch screen panel 10 (see FIG. 7) described above.

The communication unit 415 may receive data from the external device, such as the personal computer PC, the mobile terminal MT, and the like, and transfer the data to the external device, such as the personal computer PC, the mobile terminal MT, and the like, through various communication methods.

Such a communication unit 415 may include a communication module, which performs communication through various communication protocols, such as a wireless fidelity (Wi-Fi) communication module for accessing a local area network (LAN) through a wireless access point or the like, a Bluetooth communication module for one-to-one communicating with a single external device or one-to-many communicating with a small number of external devices, and the like.

For example, the communication unit 415 may receive image data from the external device, such as the personal computer PC, the mobile terminal MT, and the like, and transfer the received image data to the main controller 411.

Also, the communication unit 415 may receive image data corresponding to a touch input, which is received from the electronic papers 420a to 420d, from the main controller 411 and transfer the received image data to the external device, such as the personal computer PC, the mobile terminal MT, and the like.

The main controller 410 controls the overall operations of the electronic notebook 400.

The main controller 410 may include a main processor 411a, a graphic processor 411b, and a memory 411c.

The memory 411c may store control programs or control data for controlling an operation of the electronic notebook 400, or may temporarily store control command data output by the main processor 411a or image data output by the graphic processor 411b.

The memory 411c may include a volatile memory such as a static random access memory (SRAM), a dynamic random access memory (DRAM), or the like, and a nonvolatile memory such as a flash memory, a read only memory (ROM), an erasable programmable read only memory (EPROM), an electrically erasable programmable read only memory (EEPROM), or the like.

Specifically, the nonvolatile memory may store the control programs and control data for controlling the operation of the electronic notebook 400, and the volatile memory may call and temporarily store the control programs and the control data from the nonvolatile memory or temporarily store the control command data output by the main processor 411a or the image data output by the graphic processor 411b.

The graphic processor 411b may convert image data transferred by the main processor 411a, image data stored in the memory 411c, or image data received from the communication unit 415 into image data having a format capable of being displayed through the electronic papers 420a to 420d, and may transfer the image data having the converted format to the electronic paper driving circuit 413.

The main processor 411a processes the data stored in the memory 411c according to the control programs stored in the memory 411c.

For example, the main processor 411a may process control commands of the user, communication data received through the communication unit 415, touch sensing data received from the electronic paper driving circuit 413, and the like, and generate communication data to be transmitted through the communication unit 415, image data to be displayed on the electronic papers 420a to 420d through the electronic paper driving circuit 413, and the like.

As described above, it may be seen that the main controller 411 controls operations of the components included in the electronic notebook 400, and the operation of the electronic notebook 400 is performed by a control operation of the main controller 411.

The configuration of the electronic notebook 400 according to one embodiment has been described above.

Hereinafter, an operation of the electronic notebook 400 according to one embodiment will be described.

FIGS. 27A, 27B and 28A, 28B illustrate the operation of the electronic notebook according to one embodiment.

Figure 27A:
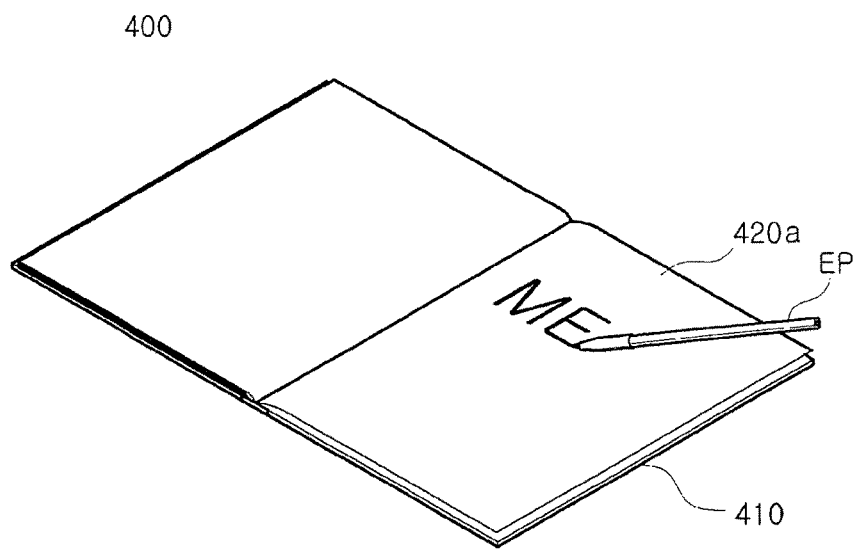
FIGS. 27A, 27B and 28A, 28B illustrate the operation of the electronic notebook according to one embodiment
Figure 27B:
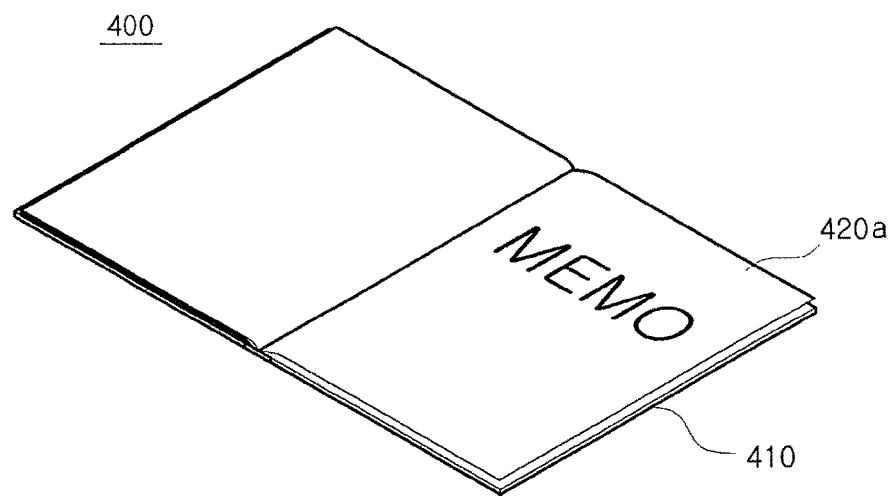

Referring to FIGS. 27A, 27B, the electronic notebook 400 may receive a touch input from a user and display an image corresponding to the received touch input.

As illustrated in FIG. 27A, the user may input handwriting to the electronic paper 420a of the electronic notebook 400 using a pen EP, or may directly touch the electronic paper 420a of the electronic notebook 400.

As described above, when the user inputs the handwriting to the electronic paper 420a or directly touches the electronic paper 410a, the electronic paper 410a may display an image corresponding to the handwriting input by the user or the user's touch.

When the user directly touches the electronic paper 420a or handwrites to the electronic paper 420a using the pen EP, the electronic paper 420a may detect coordinates of the user's touch or coordinates of the handwriting. Specifically, the electronic paper driving circuit 413 included in the main body 410 transmits a sensing signal to the electronic paper 420a. The electronic paper 420a transfers a response signal to the electronic paper driving circuit 413 according to the user's touch (or the handwriting) and the sensing signal of the electronic paper driving circuit 413.

The electronic paper driving circuit 413 may detect a position of the user's touch (or a position of the handwriting) based on the sensing signal transmitted to the electronic paper 420a and the response signal received from the electronic paper 420a.

The electronic paper driving circuit 413, which detects the position of the user's touch, generates a touch sensing signal based on the detected position of the touch and transfers the generated touch sensing signal to the main controller 411.

The main controller 411 may recognize the position of the user's touch (or the position of the handwriting) based on the touch sensing signal.

Then, the main controller 411 stores the position of the user's touch (or the position of the handwriting) and generates image data corresponding to the stored position of the user's touch (or the stored position of the handwriting). Also, the main controller 411 transfers the generated image data to the electronic paper driving circuit 413.

The electronic paper driving circuit 413 drives the electronic paper 420a so that the electronic paper 420a displays an image corresponding to the image data as illustrated in FIG. 27B.

In this manner, the electronic notebook 400 may display an image corresponding to the user's touch or the handwriting on the electronic paper 420a.

Figure 28A:
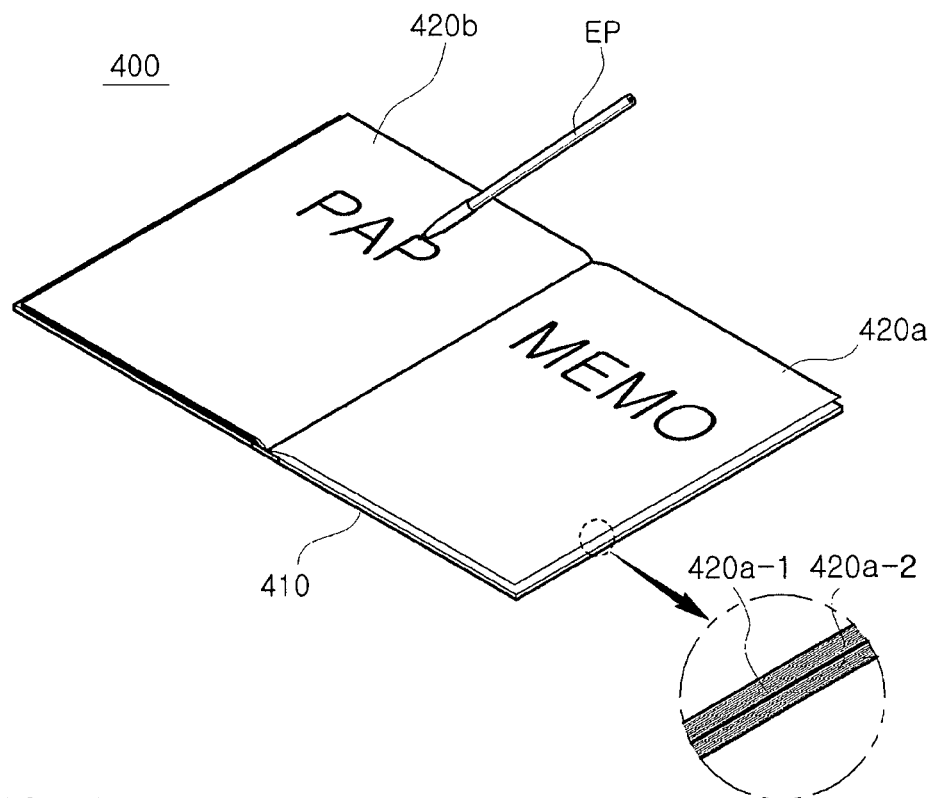

Also, as illustrated in FIG. 28A, both surfaces as well as one surface of the electronic paper 420a may be used.

Specifically, the electronic paper 420a may include a first touch screen 420a-1 and a second touch screen 420a-2, and the first touch screen 420a-1 and second touch screen 420a-2 may be attached to each other so that surfaces thereof that display an image and detect a touch face outward.

As a result, the electronic paper 420a may sense a user's touch and display an image on both surfaces thereof.

Figure 28B:
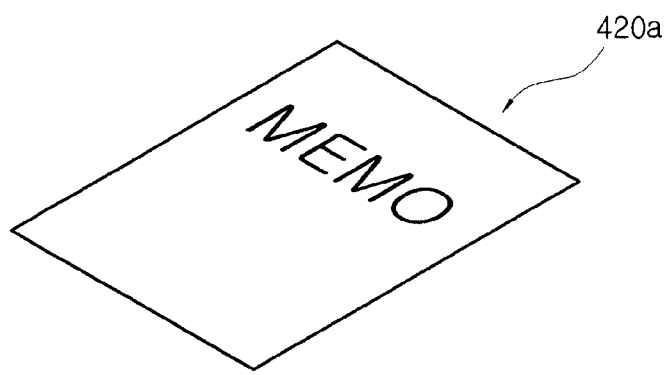

Also, as illustrated in FIG. 28B, the electronic paper 420a may be separated from the main body 410.

As described above, the reflective touch screen 300 (see FIG. 20) using the cholesteric liquid crystal may continuously display a displayed image even when power is interrupted. In other words, when image data is input and an image is displayed on the reflective touch screen 300 (see FIG. 20) once, the image displayed on the reflective touch screen 300 (see FIG. 20) does not disappear even when power is interrupted.

When the reflective touch screen 300 (see FIG. 20) using such a cholesteric liquid crystal is applied to the electronic paper 420a, an image displayed on the electronic paper 420a does not disappear even when the electronic paper 420a is separated from the main body 410 which drives the electronic paper 420a.

In other words, the user may input handwriting to the electronic paper 420a, and the electronic paper 420a on which an image corresponding to the input handwriting is displayed may be separated from the main body 410 to be stored.

As described above, the electronic notebook 400 may receive a touch input from a user through the electronic paper 420a and display an image corresponding to the received touch input on the electronic paper 420a.

FIG. 29 illustrates an exterior of an electronic printer according to one embodiment.

As illustrated in FIG. 29, an electronic printer 500 may display images on electronic papers 520a to 520c and continuously discharge the electronic papers 520a to 520c on which the images are displayed.

Specifically, the electronic printer 500 may include a driving circuit (not illustrated) capable of displaying images on the electronic papers 520a to 520c similarly to the electronic notebook 400 (see FIG. 26).

Also, the electronic printer 500 may accommodate the plurality of electronic papers 520a to 520c therein, display images on the electronic papers 520a to 520c according to control commands of the user, and discharge the electronic papers 520a to 520c on which the images are displayed.

As described above, the reflective touch screen 300 (see FIG. 20) using the cholesteric liquid crystal may continuously display a displayed image even when power is interrupted. In other words, when image data is input and an image is displayed on the reflective touch screen 300 (see FIG. 20) once, the image displayed on the reflective touch screen 300 (see FIG. 20) does not disappear even when power is interrupted.

When the reflective touch screen 300 (see FIG. 20) using such a cholesteric liquid crystal is applied to the electronic paper 520a, an image displayed on the electronic paper 520a does not disappear even when the electronic paper 520a is discharged from the electronic printer 500.

Such an electronic printer 500 may be used with an image acquisition device (not illustrated) such as a camera and the like. For example, an image acquired by the image acquisition device may be displayed on the electronic paper 520a through the electronic printer 500.

Also, an instant imaging device (referred to as a Polaroid camera) in which the electronic printer 500 and image acquisition device are integrated may be derived.

As described above, the electronic printer 500 may display images on the electronic papers 520a to 520c and discharge the electronic papers 520a to 520c on which the images are displayed.

Hereinafter, a mobile terminal according to one embodiment will be described.

FIGS. 30 and 31 illustrate an exterior of a mobile terminal according to one embodiment, and FIG. 32 illustrates a configuration of the mobile terminal according to one embodiment.

Referring to FIGS. 30 to 32, a mobile terminal 600 according to one embodiment may include a main body 610 which forms an exterior of the mobile terminal 600, a user interface 620 which interfaces with a user, a communication unit 640 which communicates with an external device, and a main controller 650 which controls overall operations of the mobile terminal 600. In addition, the mobile terminal 600 may further include a sound acquisition unit such as a microphone and the like which acquires an external sound and a sound output unit such as a speaker and the like which outputs the sound.

The main body 610 may have a rectangular parallelepiped shape having rounded corners as illustrated in FIG. 30, and various components of the mobile terminal 600 may be accommodated in the main body 610.

Also, the main body 610 may be made of a metal or synthetic resin material having high strength in order to protect the components accommodated therein from an external force.

Also, various input buttons 611 and 613 for controlling the mobile terminal 600 may be provided on a surface of the main body 610.

For example, as illustrated in FIG. 30, a power button 611 which turns on or off the mobile terminal 600 or the user interface 620 to be described below may be provided on a side surface 610b of the main body 610.

Also, a home button 613 which restores a screen displayed on the user interface 620 of the mobile terminal 600 to an initial screen may be provided at a lower portion of a front surface 610a of the main body 610.

However, the input buttons 611 and 613 provided at the main body 610 are not limited thereto, and more input buttons may be added or some input buttons may be omitted.

The user interface 620 may be provided at a center of the front surface 610a of the main body 610 as illustrated in FIG. 30, and may receive control commands from the user and display various pieces of information corresponding to the control commands of the user.

Also, the user interface 620 may include a touch screen 621, a touch screen driver 622, a main display 623, and a main display driver 624 as illustrated in FIG. 31.

The touch screen 621 may detect whether or not the user touches the touch screen 621 and a position of the touch, and display an image including various pieces of information.

The touch screen 621 may include any of the touch screens 100, 200, and 300 described above. Specifically, the touch screen 621 may include the reflective touch screen 300 which displays an image and stores the displayed image.

When the touch screen 621 includes the reflective touch screen 300, the touch screen 621 may detect a touch input of the user and display an image corresponding to the detected touch input.

Since the reflective touch screen 300 may continuously display an image without supplying additional power after the user completes a touch input and reflect incident light without directly outputting light, the reflective touch screen 300 may display an image with little power.

Also, the touch screen 621 may be provided in a front of the main display 623 as illustrated in FIG. 31. As a result, the user may touch the touch screen 621 in order to input a touch input, and an image displayed on the main display 623 may be displayed through the touch screen 621.

The touch screen 621 may operate in two modes according to an operation of the main display 623 to be described below.

Specifically, when the main display 623 is turned on, the touch screen 621 may operate in a touch sensing mode in which a touch input of a user is detected without displaying an image. Also, when the main display 623 is turned off, the touch screen 621 may operate in a display mode in which an image is displayed.

In the touch sensing mode, the touch screen 621 does not display an image and transmits all light. Since the main display 623 displays an image in the touch sensing mode, the touch screen 621 transmits all light so that the image displayed on the main display 623 is not distorted.

Specifically, when the touch screen 621 includes a cholesteric liquid crystal, the cholesteric liquid crystal may be in the homeotropic state.

Also, in the touch sensing mode, the touch screen 621 may detect a touch input of the user. Since the touch screen 621 is positioned in the front of the main display 623 as illustrated in FIG. 31, the user may input a touch input through the touch screen 621.

In the display mode, the touch screen 621 may display an image. Since the main display 623 does not display an image in the display mode, the touch screen 621 may display the image.

When the reflective touch screen 300 is applied to the touch screen 621, since the touch screen 621 only reflects light and does not directly output light, power consumption thereof may be reduced.

Also, when the touch screen 621 includes a cholesteric liquid crystal, since the cholesteric liquid crystal may be in the planar state or the focal conic state according to an image and no additional supply of power is required after the image is displayed on the touch screen 621, the power consumption thereof may be further reduced.

The touch screen 621 may detect the touch input of the user in the display mode according to a user's selection.

In other words, when the user sets the touch screen 621 to detect a touch input while the main display 623 is turned off, the touch screen 621 may detect the touch input of the user in the display mode. Also, when the user sets the touch screen 621 not to detect a touch input while the main display 623 is turned off, the touch screen 621 may not detect the touch input of the user in the display mode.

The touch screen driver 622 may transfer image data input from the main controller 650 to the touch screen 621 and transfer the touch input of the user received from the touch screen 621 to the main controller 650.

Specifically, the touch screen driver 622 may drive the touch screen 621 so that the touch screen 621 displays an image corresponding to image data and receives a touch input of the user.

The touch screen driver 622 may include the display driver 30 (see FIG. 7), the touch sensor 40 (see FIG. 7), and the touch screen controller 20 (see FIG. 7), which are included in the touch screen panel 10 (see FIG. 7) described above.

The main display 623 may display information corresponding to the touch input of the user received through the touch screen 621. Specifically, the main display 623 may display operation information of the mobile terminal 600 according to control commands of the user input through the touch screen 621 or display information received through the communication unit 640 to be described below.

Also, when the user presses the power button 611 or a touch input is not detected during a predetermined time in a state in which the main display 623 is turned on, the main display 623 may be turned off. Also, when the user presses the power button 611 or the home button 613 in a state in which the main display 623 is turned off, the main display 623 may be turned on.

A display capable of displaying light may be applied to the main display 623 unlike the touch screen 621 to which a reflective display is applied. Specifically, a transmissive liquid crystal display panel, a light emitting diode (LED) panel, an organic light emitting diode (OLED) panel, or the like may be applied to the main display 623.

The main display driver 624 may transfer image data input from the main controller 650 to the touch screen 621.

The main display driver 624 may drive the main display 623 so that the main display 623 displays the image corresponding to the image data.

The communication unit 640 may receive data from an external device or transfer data to the external device.

The communication unit 640 may include a local communication module 641 capable of communicating with an external device relatively close to the mobile terminal 600 and a wide communication module 643 capable of communicating with an external device positioned far away from the mobile terminal 600.

The local communication module 641 may use a local wireless communication method such as Wi-Fi, Bluetooth, Zigbee, or the like.

Also, the wide communication module 643 may use a wide area wireless communication method such as time division multiple access (TDMA), code division multiple access (CDMA), wide code division multiple access (WCDMA), wireless broadband (Wibro), worldwide interoperability for microwave access (WiMAX), long-term evolution (LTE), or the like.

The main controller 650 controls overall operations of the mobile terminal 600.

The main controller 650 may include a main processor 651, a graphic processor 653, and a memory 655.

The memory 655 may store control programs or control data for controlling an operation of the mobile terminal 600, or may temporarily store control command data output by the main processor 651 or image data output by the graphic processor 653.

The memory 655 may include a volatile memory such as an SRAM, a DRAM, or the like, and a nonvolatile memory such as a flash memory, a ROM, an EPROM, an EEPROM, or the like.

Specifically, the nonvolatile memory may store the control programs and control data for controlling the operation of the mobile terminal 600, and the volatile memory may call and temporarily store the control programs and the control data from the nonvolatile memory or temporarily store control command data output by the main processor 651 or image data output by the graphic processor 653.

The graphic processor 653 may convert image data transferred by the main processor 651, image data stored in the memory 655, or image data received from the communication unit 640 into image data having a format capable of being displayed through the touch screen 621 or the main display 623 and transfer the converted image data to the touch screen driver 622 or the main display driver 634.

The main processor 651 processes the data stored in the memory 655 according to the control programs stored in the memory 655.

For example, the main processor 651 may process control commands of the user, communication data received through the communication unit 640, touch sensing data received from the touch screen driver 622, and the like and generate communication data to be transmitted through the communication unit 640, image data to be displayed on the touch screen 621 through the touch screen driver 622, image data to be displayed on the main display 623 through the main display driver 624, and the like.

As described above, it may be seen that the main controller 650 controls operations of the components included in the mobile terminal 600, and the operation of the mobile terminal 600 is performed by a control operation of the main controller 650.

The configuration of the mobile terminal 600 according to one embodiment has been described above.

Hereinafter, the operation of the mobile terminal 600 according to one embodiment will be described.

FIGS. 33 to 35 illustrate an operation of the user interface of the mobile terminal according to one embodiment.

A display operation 1000 of the user interface 620 of the mobile terminal 600 will be described with reference to FIGS. 33 to 35.

The mobile terminal 600 determines whether the main display 623 is turned on (1010).

When a user presses the power button 611 or a touch input thereof is not detected during a predetermined time in a state in which the main display 623 is turned on, the main display 623 may be turned off, and when the user presses the power button 611 or the home button 613 in a state in which the main display 623 is turned off, the main display 623 may be turned on.

When it is determined that the main display 623 is turned on (YES in 1010), the touch screen 621 operates in a touch sensing mode (1020). Specifically, the mobile terminal 600 controls the touch screen driver 622 so that the touch screen 621 operates in the touch sensing mode.

As described above, in the touch sensing mode, the touch screen 621 does not display an image and transmits all light. In other words, since the main display 623 displays the image, the touch screen 621 transmits all light so that the image displayed on the main display 623 is not distorted.

Specifically, when the touch screen 621 includes a cholesteric liquid crystal, the touch screen driver 622 may supply a driving voltage ranging from about 30V to about 40V to the touch screen 621 so that the cholesteric liquid crystal of the touch screen 621 is in the homeotropic state. As described above, the cholesteric liquid crystal in the homeotropic state may transmit 90% or more of incident light.

For example, the touch screen driver 622 may supply the positive first voltage $+V_1$ to vertical lines of the touch screen 621 at predetermined time intervals as illustrated in FIG. 34. Here, the first voltage $V_1$ may be set to a range from about 30V to about 40V.

In this case, when a constant voltage is continuously applied to the cholesteric liquid crystal included in the touch screen 621, the cholesteric liquid crystal may be deformed due to stress. Therefore, the touch screen driver 622 periodically changes polarity of the voltage applied to the touch screen 621 as illustrated in FIG. 34.

At the same time, the touch screen driver 622 detects a voltage of a horizontal line of the touch screen 621 as illustrated in FIG. 34 in order to detect a position of the user's touch. When the first voltage $V_1$ is detected from the horizontal line of the touch screen 621, the touch screen driver 622 may detect the position of the user's touch based on a position of the horizontal line at which the first voltage $V_1$ is detected and a position of the vertical line to which the first voltage $V_1$ is supplied.

As described above, in the touch sensing mode, the touch screen 621 remains in a transparent state and detects a touch input of the user.

As a result, the user interface 620 may display an image displayed on the main display 623.

For example, as illustrated in FIG. 35, the user interface 620 may display a call request screen 700 for requesting a call according to a user's selection.

Also, when the user touches a number pad 701 included in the call request screen 700, the touch screen 621 may detect a position of the user's touch and the main controller 650 may recognize a number input by the user based on the detected position of the user's touch.

When it is determined that the main display 623 is turned off (NO in 1010), the touch screen 621 operates in a display mode (1020). Specifically, the mobile terminal 600 controls the touch screen driver 622 so that the touch screen 621 operates in the display mode.

As described above, in the display mode, the touch screen 621 may display an image. In other words, since the main display 623 does not display an image, the touch screen 621 may display the image.

When the touch screen 621 includes a cholesteric liquid crystal, the touch screen driver 622 may drive the touch screen 621 so that the cholesteric liquid crystal of the touch screen 621 is in the planar state or the focal conic state. As described above, the cholesteric liquid crystal in the planar state reflects incident light and the cholesteric liquid crystal in the focal conic state transmits 70% or more of incident light.

Since the touch screen 621 only reflects light and does not directly output light and no additional supply of power is required after the image is displayed on the touch screen 621, the mobile terminal 600 may minimize power consumption when the image is displayed on the touch screen 621.

Also, the mobile terminal 600 may detect a touch input of the user through the touch screen 621 according to a user's selection. In other words, the user may set the touch screen 621 to detect a touch input or not to detect a touch input in the state in which the main display 623 is turned off (in the display mode of the touch screen).

When the user sets the touch screen 621 to detect a touch input in the display mode of the touch screen 621, the touch screen driver 622 may drive the touch screen 621 so that the touch screen 621 displays an image and detects a position of the user's touch. Also, when the user sets the touch screen 621 not to detect a touch input in the display mode of the touch screen 621, the touch screen driver 622 may drive the touch screen 621 so that the touch screen 621 only displays an image.

As described above, the touch screen 621 may transmit light or display an image according to an on/off state of the main display 623.

FIGS. 36 to 38 illustrate an operation of the touch screen in the display mode.

An operation 1100 of the touch screen 621 in the display mode will be described with reference to FIGS. 36 to 38.

In the display mode of the touch screen 621, the mobile terminal 600 displays an image on the touch screen 621.

The mobile terminal 600 may display an image including various pieces of information through the touch screen 621.

For example, the mobile terminal 600 may display a today's weather image 710 which displays today's weather information as illustrated in FIG. 37.

Also, the mobile terminal 600 may display an advertising image received from an external server. Accordingly, a user may obtain information of a product, and an advertisement company may expose the product to the user.

Also, when the mobile terminal 600 displays an image through the touch screen 621, the user may obtain information included in the image of the touch screen 621 in a state in which the main display 623 of the mobile terminal 600 is not turned on. In other words, since the user does not need to turn on the main display 623 to confirm the information, power consumption of the mobile terminal 600 may be reduced.

Then, the mobile terminal 600 determines whether a touch input of the user is detected (1120).

As described above, in the display mode, the touch screen 621 may detect or not detect a touch input of the user according to a setting of the user.

When the user sets the touch screen 621 to detect a touch input of the user in the state in which the main display 623 is turned off, the touch screen 621 may detect the touch input of the user in the display mode.

When the touch input of the user is detected (YES in 1120), the mobile terminal 600 displays an image corresponding to the touch input on the touch screen 621 (1130). Specifically, the mobile terminal 600 controls the touch screen driver 622 so that the touch screen 621 displays the image corresponding to the touch input of the user.

For example, when the user touches a "tomorrow's weather" region 711 included in the today's weather image 710 illustrated in FIG. 37, the mobile terminal 600 may display a tomorrow's weather image 720 including tomorrow's weather information on the touch screen 621 as illustrated in FIG. 38.

Also, when the user touches a "today's weather" region 721 included in the tomorrow's weather image 720 illustrated in FIG. 38, the mobile terminal 600 may display the today's weather image 710 including the today's weather information on the touch screen 621 as illustrated in FIG. 37.

As described above, when the touch screen 621 receives a touch input of the user in the display mode, the mobile terminal 600 may display an image including various pieces of information on the touch screen 621 according to the touch input of the user.

FIGS. 39 to 41 illustrate a mobile terminal according to another embodiment.

The mobile terminal 600 having the touch screen 621 provided on a front surface of the main display 623 has been described above, but the position of the touch screen 621 is not limited thereto.

For example, the touch screen 621 may be provided on a back surface 610c of the main body 610 as illustrated in FIG. 39.

As described above, when the touch screen 621 is provided on the back surface 610c of the main body 610, the main display 623 may further include a touch pad for sensing a touch input of a user. Also, the touch screen 621 may continuously display an image. In other words, the touch screen 621 may continuously operate in a display mode.

Also, the touch screen 621 may be provided on a front surface 690a of a terminal cover 690 provided separately from the main body 610 of the mobile terminal 600 as illustrated in FIG. 40.

The terminal cover 690 may be provided to correspond to the front surface 610a of the main body 610 and may protect the front surface 610a of the main body 610 exposed to the outside.

As described above, when the touch screen 621 is provided on the front surface 690a of the terminal cover 690, the touch screen 621 may continuously display an image. In other words, the touch screen 621 may continuously operate in the display mode.

In addition, the touch screen 621 may be provided on a back surface 690b of the terminal cover 690 as illustrated in FIG. 41.

When the touch screen 621 is provided on the back surface 690b of the terminal cover 690, the user may simultaneously view an image displayed on the main display 623 and an image displayed on the touch screen 621.

Therefore, the mobile terminal 600 may display an image related to the image displayed on the main display 623 on the touch screen 621.

For example, when the user watches a movie through the main display 623, the mobile terminal 600 may display information on the movie, information on costumes worn by actors in the movie, information on historical facts that are the background of the movie, information on movie locations, or the like on the touch screen 621.

As described above, the mobile terminal 600 according to one embodiment may include the touch screen 621 provided separately from the main display 623, and the user may obtain various pieces of information from the touch screen 621 while the main display 623 is not turned on.

While embodiments of the disclosure have been illustrated and described above, the disclosure is not limited to the aforementioned specific embodiments. Those skilled in the art may variously modify the disclosure without departing from the gist of the invention claimed by the appended claims, and such modifications are within the scope of the claims.

The invention claimed is:

1. A touch screen panel comprising:
   a liquid crystal having a first side and a second side;
   a plurality of first transparent electrodes provided at the first side of the liquid crystal and extending along a first direction;
   a plurality of second transparent electrodes provided at the second side of the liquid crystal and extending along a second direction perpendicular to the first direction, where the plurality of first transparent electrodes are coplanar, the plurality of second transparent electrodes are coplanar and a plurality of pixels are formed at portions at which the plurality of first transparent electrodes intersect with the plurality of second transparent electrodes; and
   a controller configured to,
      in a first mode, perform control so that image data is transferred to the plurality of first transparent electrodes and a scan signal is transferred to the plurality of second transparent electrodes, to thereby display an image corresponding to the image data on the touch screen panel, and
      in a second mode, perform control so that a sensing signal is transferred to the plurality of first transparent electrodes and, in response to the transferred sensing signal, a response signal is received from the plurality of second transparent electrodes, to thereby sense a touch of a user on the touch screen panel.

2. The touch screen panel of claim 1, wherein, in the first mode, the controller performs control so that the scan signal is provided to the plurality of second transparent electrodes in a predetermined order and the image data is provided to the plurality of first transparent electrodes.

3. The touch screen panel of claim 1, wherein the liquid crystal is a cholesteric liquid crystal.

4. The touch screen panel of claim 1, wherein the liquid crystal is a nematic liquid crystal.

5. The touch screen panel of claim 1, further comprising:
   a first transparent substrate to which the plurality of first transparent electrodes is attached; and
   a second transparent substrate to which the plurality of second transparent electrodes is attached.

6. The touch screen panel of claim 1, wherein the touch screen panel is configured so that:
   the liquid crystal blocks light when a voltage less than a first reference voltage is applied between the plurality of first transparent electrodes and the plurality of second transparent electrodes; and
   the liquid crystal transmits the light when a voltage equal to or higher than the first reference voltage is applied between the plurality of first transparent electrodes and the plurality of second transparent electrodes.

7. The touch screen panel of claim 6, further comprising a back light configured to emit light.

8. The touch screen panel of claim 1, wherein, in the second mode, the controller performs control so that the sensing signal is provided to the plurality of first transparent electrodes in a predetermined order and the response signal is received from the plurality of second transparent electrodes.

9. The touch screen panel of claim 8, wherein, in the second mode, the controller performs control so that the touch of the user is sensed based on a change of an electrical resistance between the plurality of first transparent electrodes and the plurality of second transparent electrodes.

10. The touch screen panel of claim 8, wherein, in the second mode, the controller performs control so that the touch of the user is sensed based on a change of a capacitance between the plurality of first transparent electrodes and the plurality of second transparent electrodes.

11. The touch screen panel of claim 1, wherein the touch screen panel is configured so that:
the liquid crystal is in a first state in which light is transmitted when a voltage equal to or higher than a first reference voltage is applied between the plurality of first transparent electrodes and the plurality of second transparent electrodes; and
the liquid crystal is in a second state in which light is reflected when a voltage less than the first reference voltage is applied between the plurality of first transparent electrodes and the plurality of second transparent electrodes.

12. The touch screen panel of claim 11, wherein the touch screen panel is configured so that, after the liquid crystal transitions to the first state or the second state, the liquid crystal maintains the transitioned to state.

13. The touch screen panel of claim 12, further comprising an optical absorption layer configured to absorb light transmitted through the liquid crystal.

14. An electronic notebook comprising:
an electronic paper; and
a main body coupled to the electronic paper, wherein:
the electronic paper includes:
a liquid crystal having a first side and a second side,
a plurality of first transparent electrodes provided at the first side of the liquid crystal and extending along a first direction, and
a plurality of second transparent electrodes provided at the second side of the liquid crystal and extending along a second direction perpendicular to the first direction, where the plurality of first transparent electrodes are coplanar, the plurality of second transparent electrodes are coplanar and a plurality of pixels are formed at portions at which the plurality of first transparent electrodes intersect with the plurality of second transparent electrodes; and
the main body includes an electronic paper driver configured to,
in a first mode, perform control so that a sensing signal is transferred to the plurality of first transparent electrodes and, in response to a touch input on the electronic paper by a user, a response signal is received from the plurality of second transparent electrodes, to thereby sense the touch input on the electronic paper, and,
in a second mode, perform control so that image data for an image corresponding to the sensed touch input is transferred to the plurality of first transparent electrodes and a scan signal is transferred to the plurality of second transparent electrodes, to thereby display the image corresponding to the sensed touch input on the electronic paper.

15. The electronic notebook of claim 14, wherein:
the electronic paper includes a first page and a second page; and
each of the first page and the second page are configured to sense a touch input of the user and to display an image corresponding to the touch input.

16. The electronic notebook of claim 14, wherein the electronic paper is configured to be separable from the main body.

17. The electronic notebook of claim 16, wherein the electronic paper is configured so that the displayed image does not disappear when the electronic paper is separated from the main body.

18. The electronic notebook of claim 17, wherein the electronic notebook is configured so that:
the liquid crystal is in a first state in which light is transmitted when a voltage equal to or higher than a first reference voltage is applied between the plurality of first transparent electrodes and the plurality of second transparent electrodes; and
the liquid crystal is in a second state in which light is reflected when a voltage less than the first reference voltage is applied between the plurality of first transparent electrodes and the plurality of second transparent electrodes.

19. The electronic notebook of claim 18, wherein the electronic notebook is configured so that, after the liquid crystal transitions to the first state or the second state, the liquid crystal maintains the transitioned state.

20. The electronic notebook of claim 19, wherein the liquid crystal is a cholesteric liquid crystal.

21. A mobile terminal comprising:
a main display;
a touch screen positioned in front of the main display, and including:
a liquid crystal having a first side and a second side,
a plurality of first transparent electrodes provided at the first side of the liquid crystal and extending along a first direction, and
a plurality of second transparent electrodes provided at the second side of the liquid crystal and extending along a second direction perpendicular to the first direction, where the plurality of first transparent electrodes are coplanar, the plurality of second transparent electrodes are coplanar and a plurality of pixels are formed at portions at which the plurality of first transparent electrodes intersect with the plurality of second transparent electrodes; and
a controller configured to,
when the main display is turned ON, perform control so that
a sensing signal is transferred to the plurality of first transparent electrodes,
in response to the transferred sensing signal, a response signal is received from the plurality of second transparent electrodes, to thereby sense a touch input on the touch screen,
the main display displays information corresponding to the sensed touch input, and
the touch screen transmits light therethrough so that the information displayed on the main display is visible through the touch screen, and
when the main display is turned OFF, perform control so that
a sensing signal is transferred to the plurality of first transparent electrodes,
in response to the transferred sensing signal, a response signal is received from the plurality of second transparent electrodes, to thereby sense a touch input on the touch screen, a scan signal is transferred to the plurality of second transparent electrodes, and image data for an image corresponding to the sensed touch input is transferred to the plurality of first transparent electrodes, to thereby display the image corresponding to the sensed touch input on the touch screen.

22. The mobile terminal of claim 21, wherein the touch screen includes a reflective display.

23. The mobile terminal of claim 21, wherein the touch screen is configured so that the image displayed on the touch screen does not disappear when power supplied to the touch screen is interrupted.

24. The mobile terminal of claim 21, wherein the mobile terminal is configured so that:

the liquid crystal is in a first state in which light is transmitted when a voltage equal to or higher than a first reference voltage is applied between the plurality of first transparent electrodes and the plurality of second transparent electrodes; and the liquid crystal is in a second state in which light is reflected when a voltage less than the first reference voltage is applied between the plurality of first transparent electrodes and the plurality of second transparent electrodes.

25. The mobile terminal of claim 24, wherein the mobile terminal is configured so that, after the liquid crystal transitions to the first state or the second state, the liquid crystal maintains the transitioned state.

26. The mobile terminal of claim 25, wherein the liquid crystal is a cholesteric liquid crystal.

* * * * *